(12) United States Patent
Kang et al.

(10) Patent No.: US 9,524,870 B2
(45) Date of Patent: Dec. 20, 2016

(54) METHOD OF FABRICATING SEMICONDUCTOR DEVICE

(71) Applicant: SK hynix Inc., Gyeonggi-do (KR)

(72) Inventors: Chun-Soo Kang, Gyeonggi-do (KR); You-Song Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/742,368

(22) Filed: Jun. 17, 2015

(65) Prior Publication Data
US 2016/0196982 A1 Jul. 7, 2016

(30) Foreign Application Priority Data

Jan. 7, 2015 (KR) .................. 10-2015-0001901

(51) Int. Cl.
*H01L 21/311* (2006.01)
*H01L 21/02* (2006.01)
*H01L 21/308* (2006.01)

(52) U.S. Cl.
CPC ..... *H01L 21/02595* (2013.01); *H01L 21/3086* (2013.01)

(58) Field of Classification Search
CPC .. H01L 21/027; H01L 21/033; H01L 21/0331; H01L 21/0332; H01L 21/0334; H01L 21/0335; H01L 21/0337; H01L 21/0338
See application file for complete search history.

(56) References Cited

U.S. PATENT DOCUMENTS

| 8,389,400 | B2 | 3/2013 | Lee et al. | |
|---|---|---|---|---|
| 2007/0281219 | A1* | 12/2007 | Sandhu | B82Y 10/00 430/5 |
| 2009/0149026 | A1* | 6/2009 | Zhou | H01L 21/0337 438/703 |
| 2011/0124198 | A1* | 5/2011 | Lee | H01L 21/0337 438/735 |
| 2013/0095663 | A1 | 4/2013 | Seo et al. | |
| 2014/0162459 | A1* | 6/2014 | Trapp | H01L 21/308 438/696 |
| 2016/0042965 | A1* | 2/2016 | Ha | H01L 21/3088 438/702 |

FOREIGN PATENT DOCUMENTS

KR 101139462 5/2012

* cited by examiner

*Primary Examiner* — Zandra Smith
*Assistant Examiner* — Evan Clinton
(74) *Attorney, Agent, or Firm* — IP & T Group LLP

(57) ABSTRACT

A method of fabricating a semiconductor device includes forming line patterns over a first region of an etch target layer and a pre-pad pattern over second and third regions of the etch target layer; forming pillars over the line patterns and a sacrificial pad pattern over the pre-pad pattern; forming first spacers over sidewalls of the pillars such that the first spacers contact one another and form first pre-openings therebetween; removing the pillars to form second pre-openings; cutting the line patterns through the first and second pre-openings, and forming cut patterns; etching the pre-pad pattern using the sacrificial pad pattern as an etch mask, and forming a pad pattern; and etching the etch target layer using the cut patterns and the pad pattern as an etch mask, to define first patterns and a second pattern over the first region and the second region, respectively.

15 Claims, 41 Drawing Sheets

METHOD OF FABRICATING SEMICONDUCTOR DEVICE

CROSS-REFERENCE TO RELATED APPLICATION

This application claims priority under 35 U.S.C. §119 to Korean Patent Application No. 10-2015-0001901, filed on Jan. 7, 2015, in the Korean Intellectual Property Office, the disclosure of which is incorporated herein by reference in its entirety.

BACKGROUND

1. Technical Field

Exemplary embodiments of the present invention relate to a method of fabricating a semiconductor device and, more particularly, to a method of forming patterns.

2. Description of the Related Art

As semiconductor devices become more highly integrated and their design rules shrink, the size of their hole patterns shrink as well. As their design rules continue to shrink, patterning technology for overcoming limitations in the resolution of currently used exposure equipment is required.

Various patterning technologies are being used to form hole patterns. For example, a single patterning technology and a double patterning technology (DPT) are being used.

The single patterning technology is used for forming hole patterns by a photolithography process that is well known in the art. However, with the single patterning technology, it is difficult to form fine hole patterns, due to limitations in the resolution of exposure equipment.

The double patterning technology may form patterns with a fine width and a fine pitch by selectively combining a plurality of hard mask layers and a spacer patterning technology (SPT). However, in the double patterning technology, processing becomes complicated, the number of process steps increases, high costs are incurred, and overlay issues occur.

SUMMARY

Various embodiments are directed to a method of fabricating a semiconductor device, capable of overcoming limitations in the resolution of exposure equipment and forming fine patterns.

In an embodiment, a method of fabricating a semiconductor device may include: forming a plurality of line patterns over a first region of an etch target layer and a pre-pad pattern over a second region and a third region of the etch target layer; forming a plurality of pillars over the line patterns and a sacrificial pad pattern over the pre-pad pattern of the second region; forming a plurality of first spacers over sidewalls of the pillars such that the first spacers contact one another and form a plurality of first pre-openings therebetween; removing the pillars to form a plurality of second pre-openings; cutting the line patterns through the first pre-openings and the second pre-openings, and forming a plurality of cut patterns over the first region; etching the pre-pad pattern using the sacrificial pad pattern as an etch mask, and forming a pad pattern over the second region; and etching the etch target layer using the cut patterns and the pad pattern as an etch mask, to define first patterns and a second pattern over the first region and the second region, respectively.

In an embodiment, a method of fabricating a semiconductor device may include: forming a plurality of line patterns over a first region of an etch target layer and a pre-pad pattern over a second region and a third region of the etch target layer; forming a plurality of pillars over the line patterns; forming a plurality of first spacers over sidewalls of the pillars such that the first spacers contact one another and form a plurality of first pre-openings therebetween; forming a second reverse spacer over the second region and a third reverse spacer over the third region; removing the pillars to form a plurality of second pre-openings; cutting the line patterns through the first pre-openings and the second pre-openings, and forming a plurality of cut patterns over the first region; etching the pre-pad pattern using the second reverse spacer and the third reverse spacer as an etch mask, and forming a pad pattern and a guard pattern over the second region and the third region, respectively; and etching the etch target layer using the cut patterns, the pad pattern and the guard pattern as an etch mask, to define first patterns, a second pattern and a third pattern over the first region, the second region and the third region, respectively.

In an embodiment, a method of fabricating a semiconductor device may include: forming a plurality of line patterns over a first region of an etch target layer; forming an etch stop layer over the line patterns; forming spacers having a plurality of first pre-openings and a plurality of second pre-openings which overlap with the line patterns, over the etch stop layer; etching the etch stop layer using the spacers to form a first etch stop layer pattern; cutting the line patterns using the first etch stop layer pattern to form a plurality of cut patterns; and etching the etch target layer using the cut patterns as an etch mask, to define a plurality of first patterns over the first region.

DETAILED DESCRIPTION

Figure 1A:
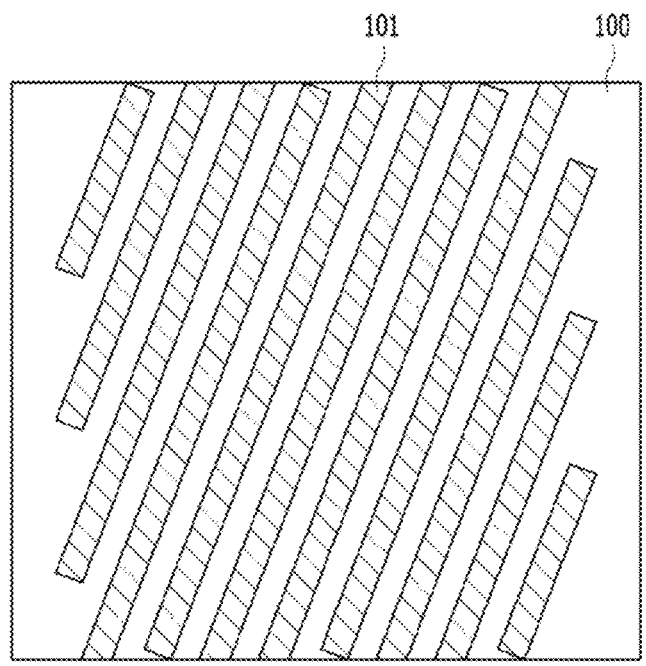
FIGS. 1A to 1D are views explaining a method of cutting line patterns by pillar patterning in accordance with an embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. When a first layer is referred to as being "on" a second layer or "on" a substrate, it not only refers to where the first layer is formed directly on the second layer or the substrate but also to where a third layer exists between the first layer and the second layer or the substrate.

In the following descriptions, embodiments disclose methods of forming high density first patterns with a fine width and a fine pitch in a first region and at the same time forming low density second patterns in a second region. For example, the embodiments may be applied to methods for fabricating a memory device, and the first region may be a cell array region and the second region may be a peripheral circuit region.

In the embodiments, etch mask patterns (or hard mask patterns) for forming the high density first patterns in the first region may be formed by the following method. First, line patterns may be formed by a spacer patterning technology (SPT) process. Then, the line patterns may be cut by a pillar patterning process.

In this way, the embodiments may form the etch mask patterns for forming the high density first patterns by combining a spacer patterning technology and a pillar patterning technology.

FIGS. 1A to 1D are views explaining a method of cutting line patterns by pillar patterning in accordance with an embodiment.

Figure 2:
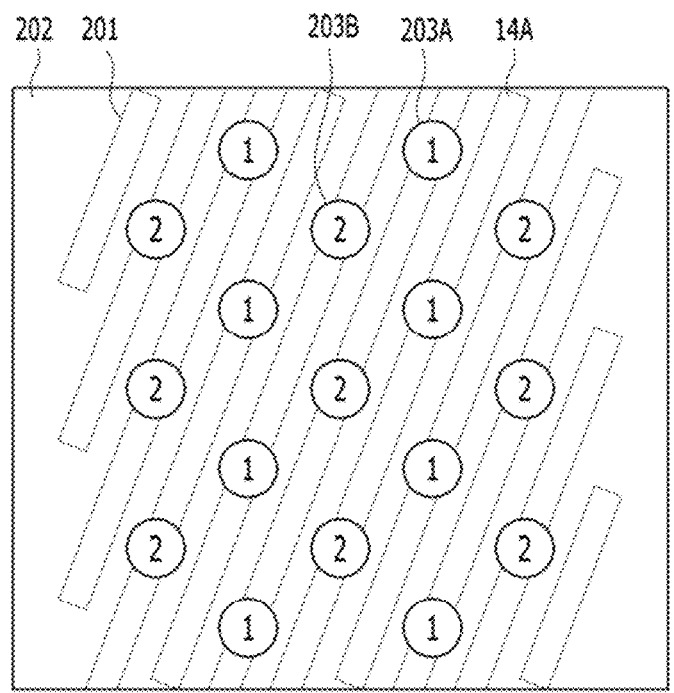
FIG. 2 is a view explaining a method of cutting line patterns by hole double patterning according to a comparative example.

FIG. 2 is a view explaining a method of cutting line patterns by a hole double patterning technology (DPT) according to a comparative example.

Referring to FIG. 1A, according to the embodiments, a plurality of line patterns 101 are formed on an etch target layer 100.

Figure 1B:
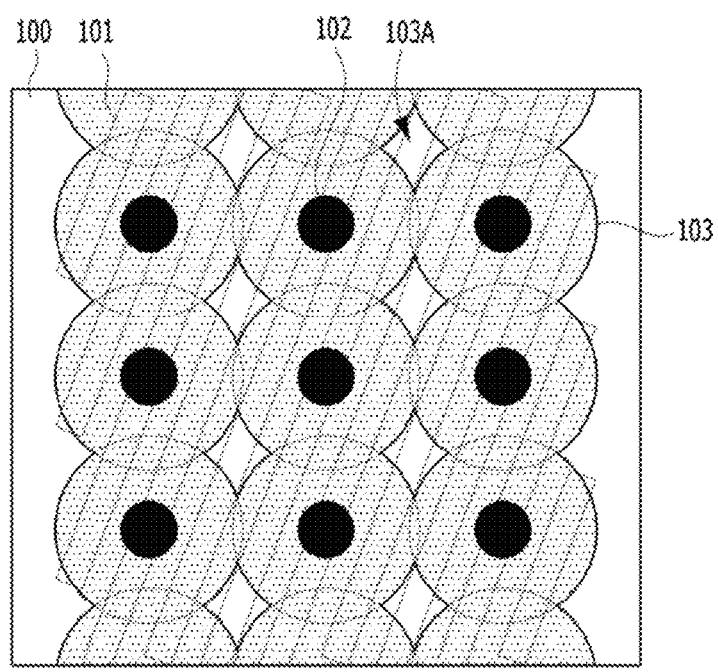

As shown in FIG. 1B, a plurality of pillars 102 are formed on the line patterns 101. A plurality of spacers 103 are formed on sidewalls of the respective pillars 102. The plurality of spacers 103 contact one another and, accordingly, first pre-openings 103A are defined by the plurality of spacers 103.

Figure 1C:
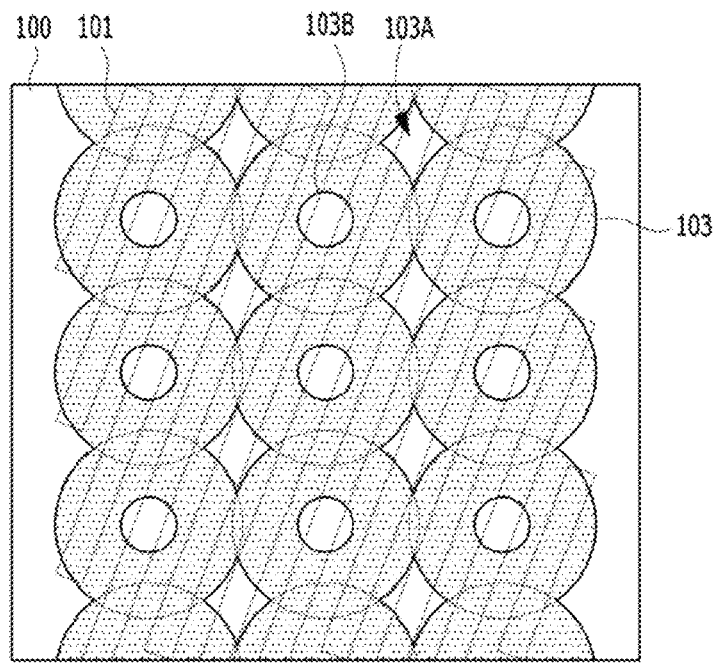

Referring to FIG. 1C, the pillars 102 are removed. Spaces from which the pillars 102 are removed become second pre-openings 103B. As a result, the first pre-openings 103A and the second pre-openings 103B are simultaneously formed in a self-aligned manner by the spacers 103.

Figure 1D:
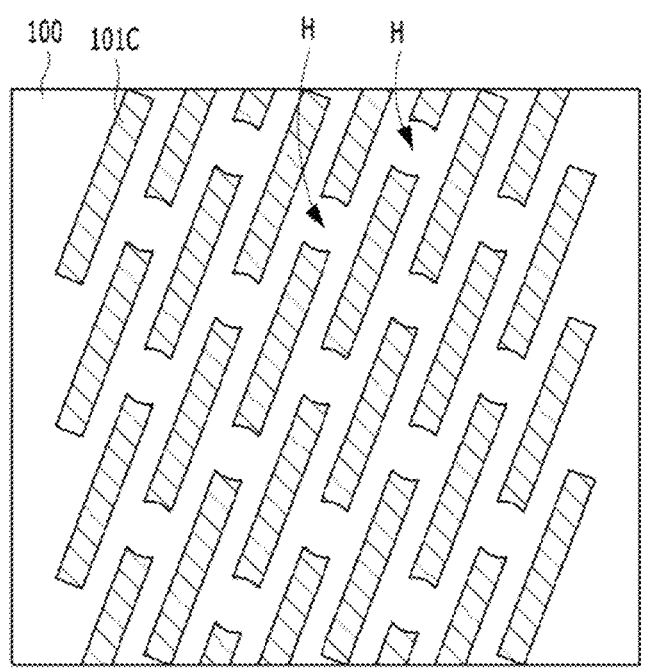

Referring to FIG. 1D, the line patterns 101 are cut using the spacers 103 as an etch mask. The line patterns 101 are cut by the first pre-openings 103A and the second pre-openings 103B. After the line patterns 101 are cut, cut patterns 101C are formed. Adjacent cut patterns 101C may be separated from one another by separation holes H. The cut patterns 101C may be island type patterns.

Subsequently, the etch target layer 100 may be etched using the cut patterns 101C as an etch mask.

Referring to FIG. 2, in the comparative example, a plurality of line patterns 201 are formed. An etch mask pattern 202 which has first separation holes 203A and second separation holes 203B formed by a hole double patterning technology is formed on the line patterns 201. After primarily forming the first separation holes 203A, the second separation holes 203B may be secondarily formed. Subsequently, the line patterns 201 may be cut using the etch mask pattern 202 and, accordingly, cut patterns (not shown) may be formed.

The comparative example of FIG. 2 applies the hole double patterning technology to form the first separation holes 203A and the second separation holes 203B. Therefore, 2 sheets of immersion masks are needed.

As a result, in the comparative example, an overlay issue is raised since the hole double patterning technology is applied. That is, overlay between two masks causes a decrease in process margin. Also, due to the overlay issue, the length of a major axis is likely to vary.

Conversely, in the embodiments, since the first pre-openings 103A and the second pre-openings 103B are formed using the pillars 102 and the spacers 103, an overlay issue is not raised between the first pre-openings 103A and the second pre-openings 103B. Moreover, since only 1 sheet of an immersion mask for forming the pillars 102 is needed, costs may be saved.

Figure 3A:
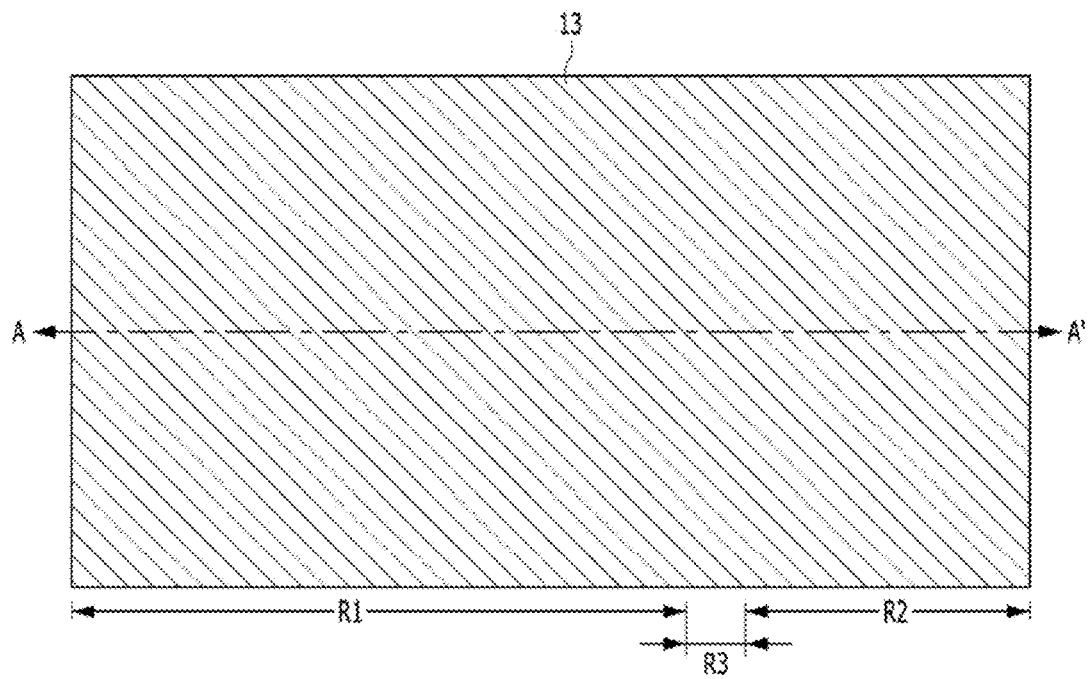
FIGS. 3A to 3O are plan views explaining a method of fabricating a semiconductor device in accordance with a first embodiment.
Figure 3B:
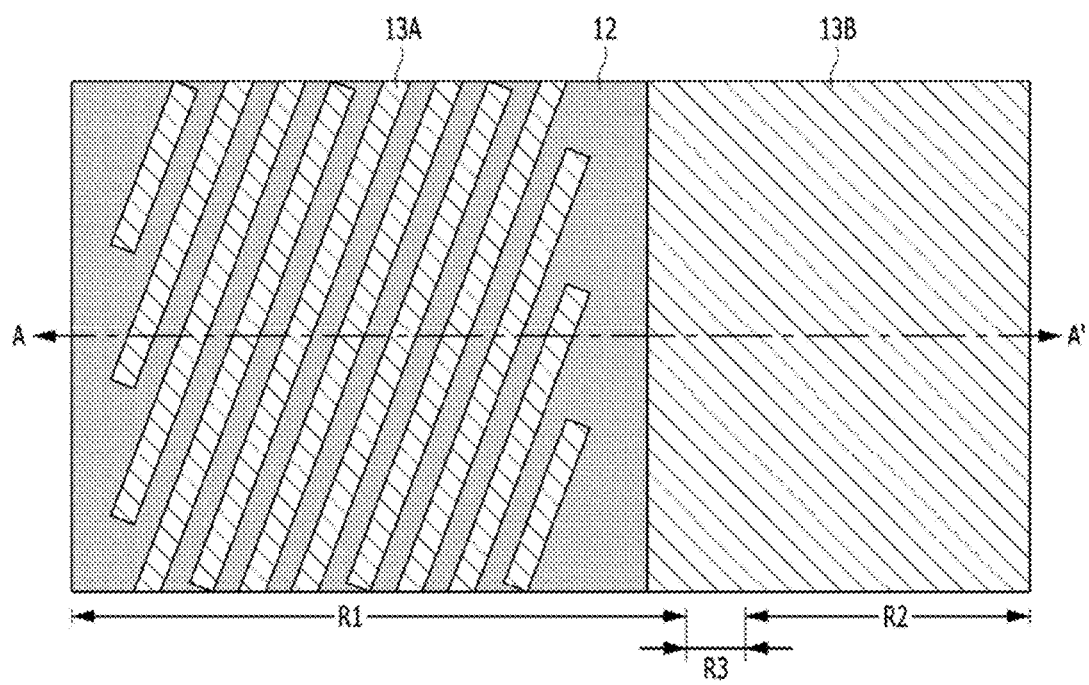
Figure 3C:
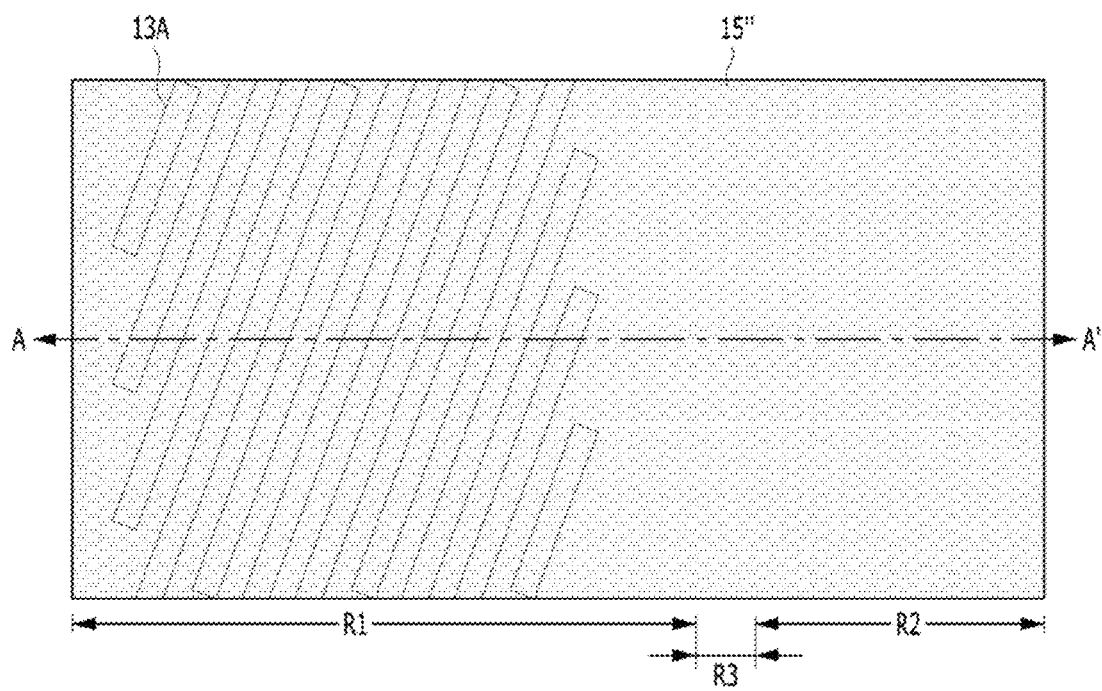
Figure 3D:
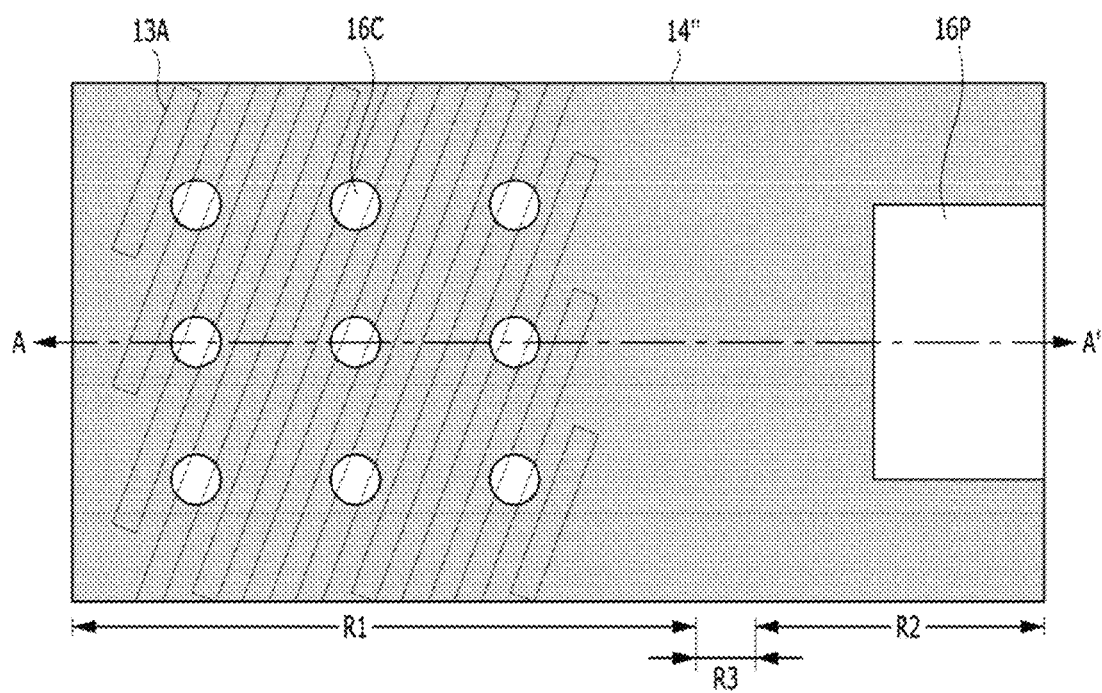
Figure 3E:
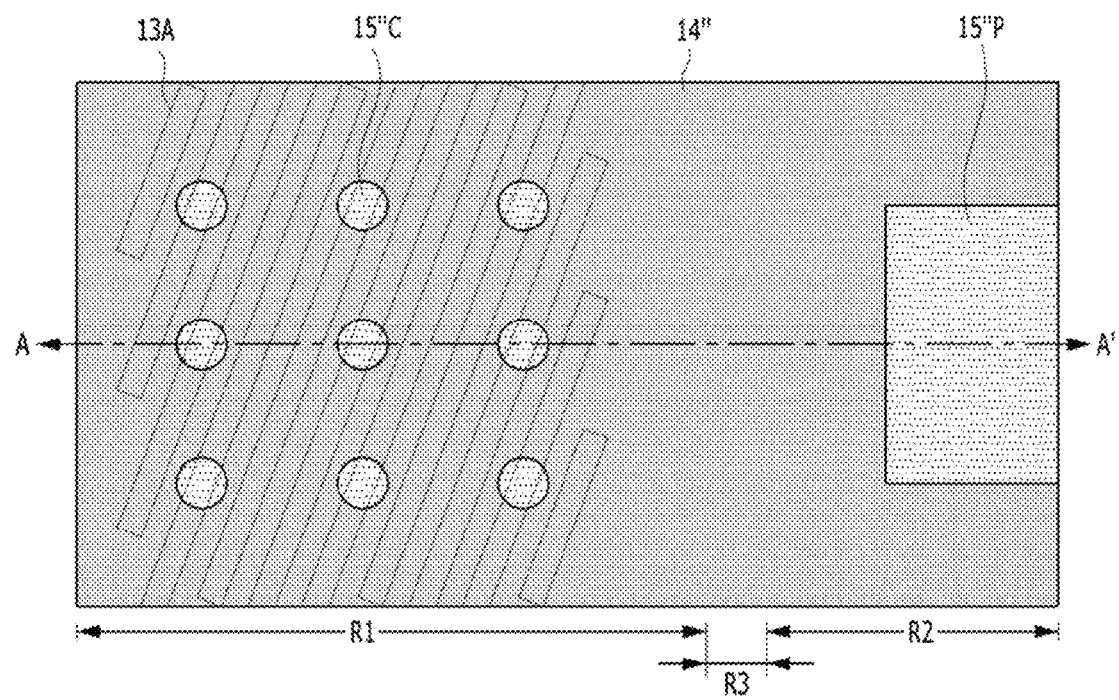
Figure 3F:
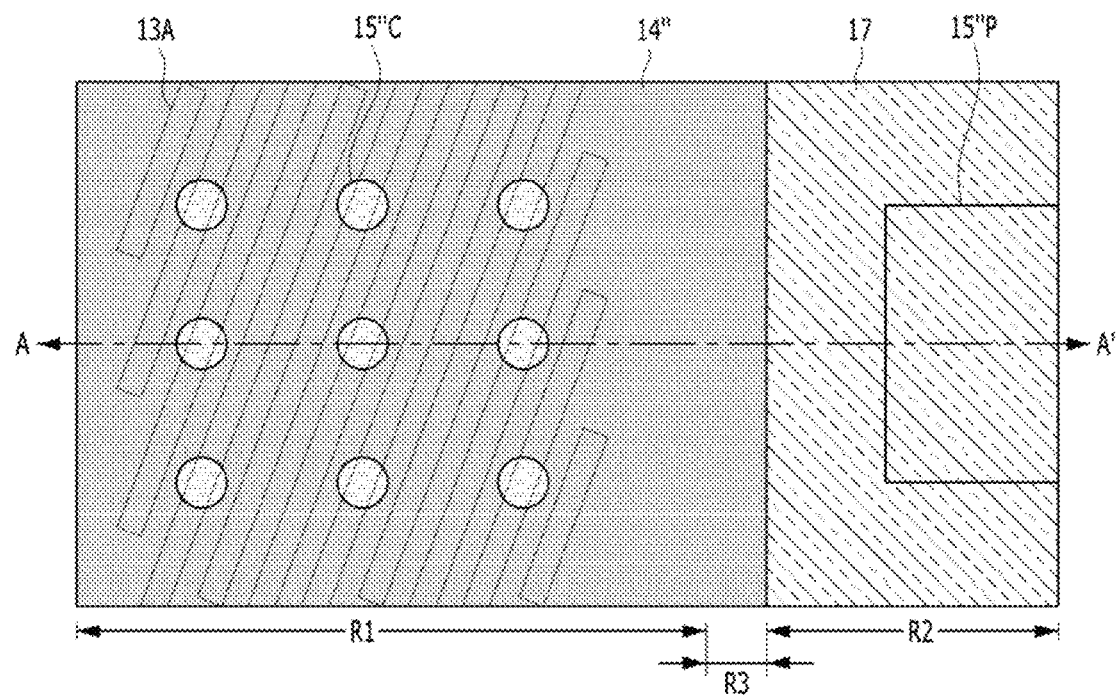
Figure 3G:
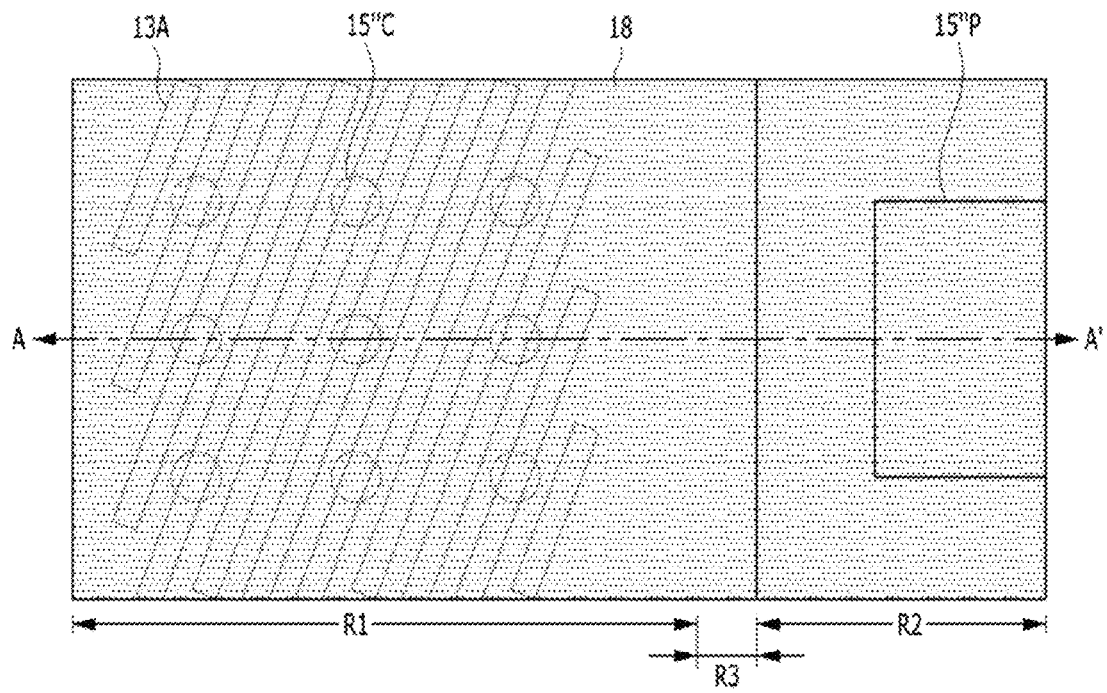
Figure 3H:
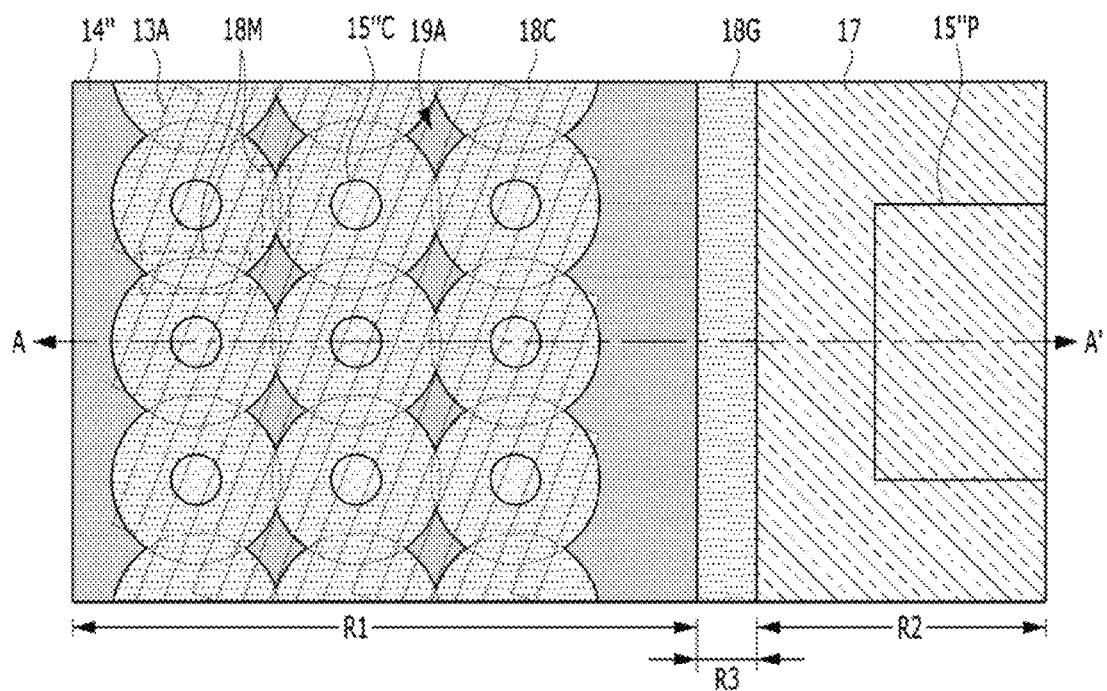
Figure 3I:
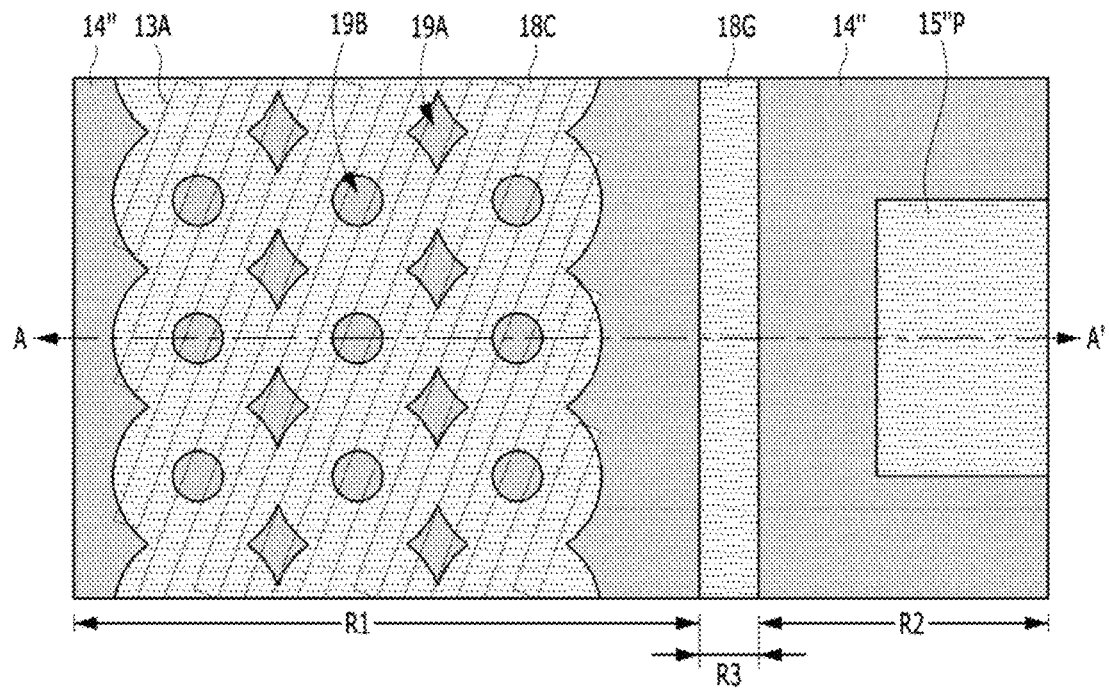
Figure 3J:
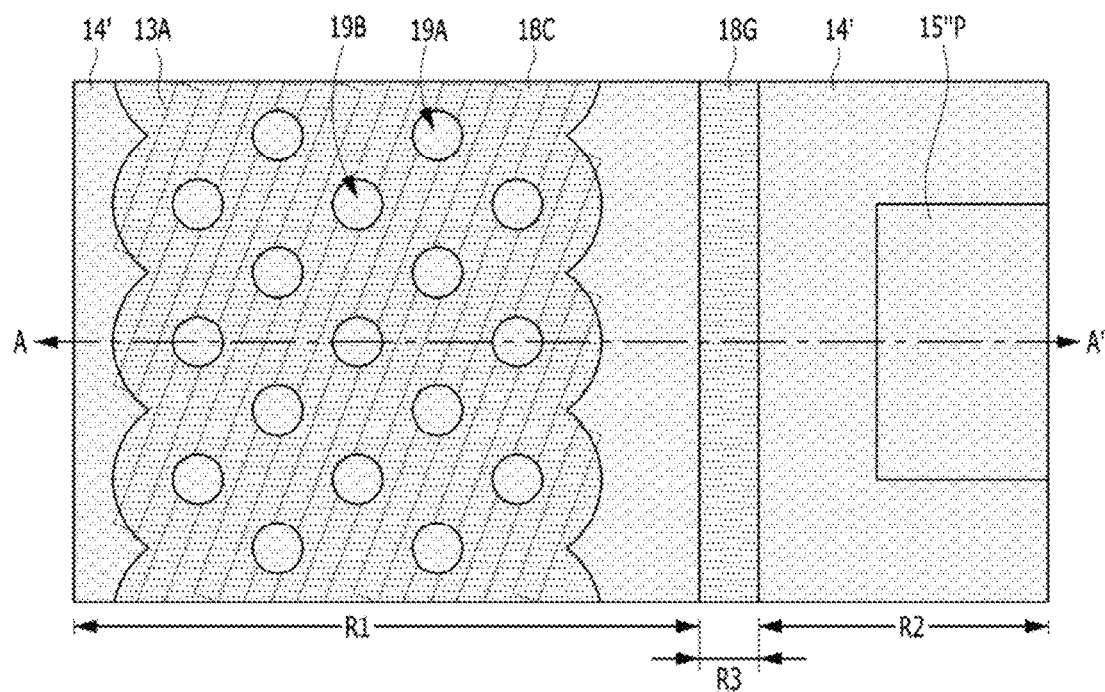
Figure 3K:
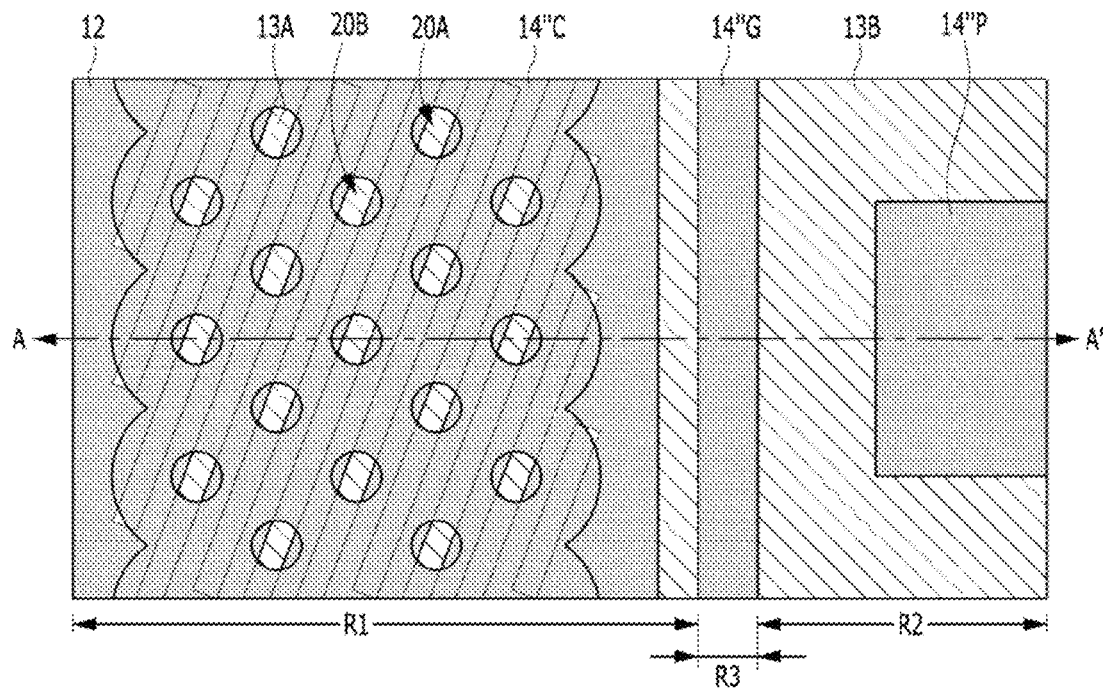
Figure 3L:
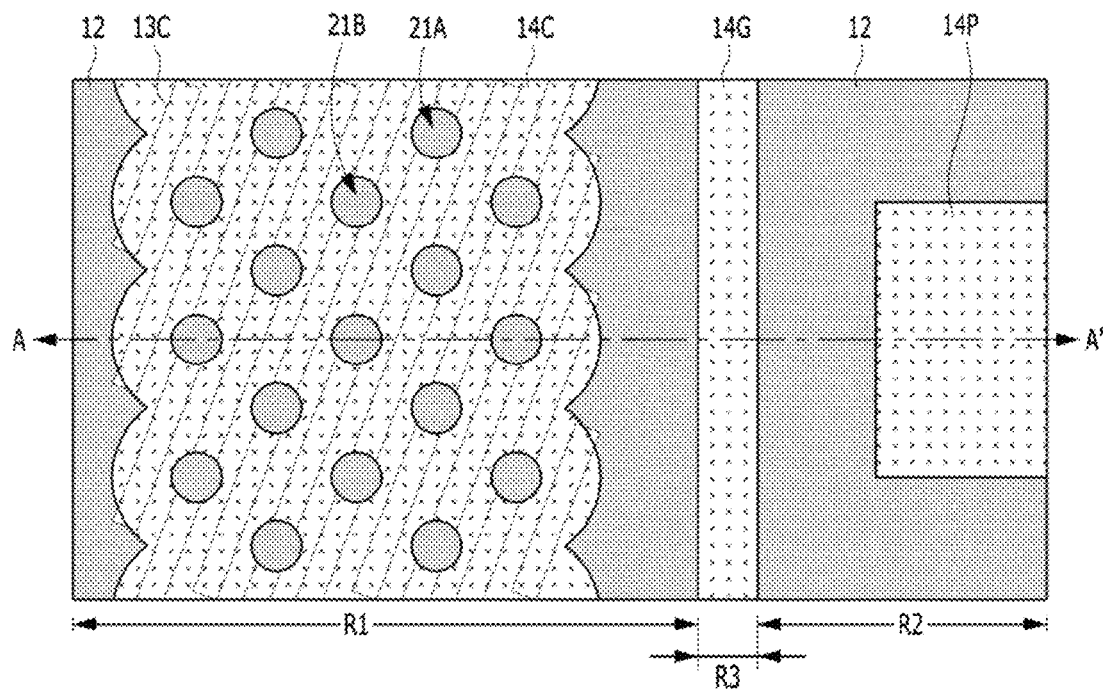
Figure 3M:
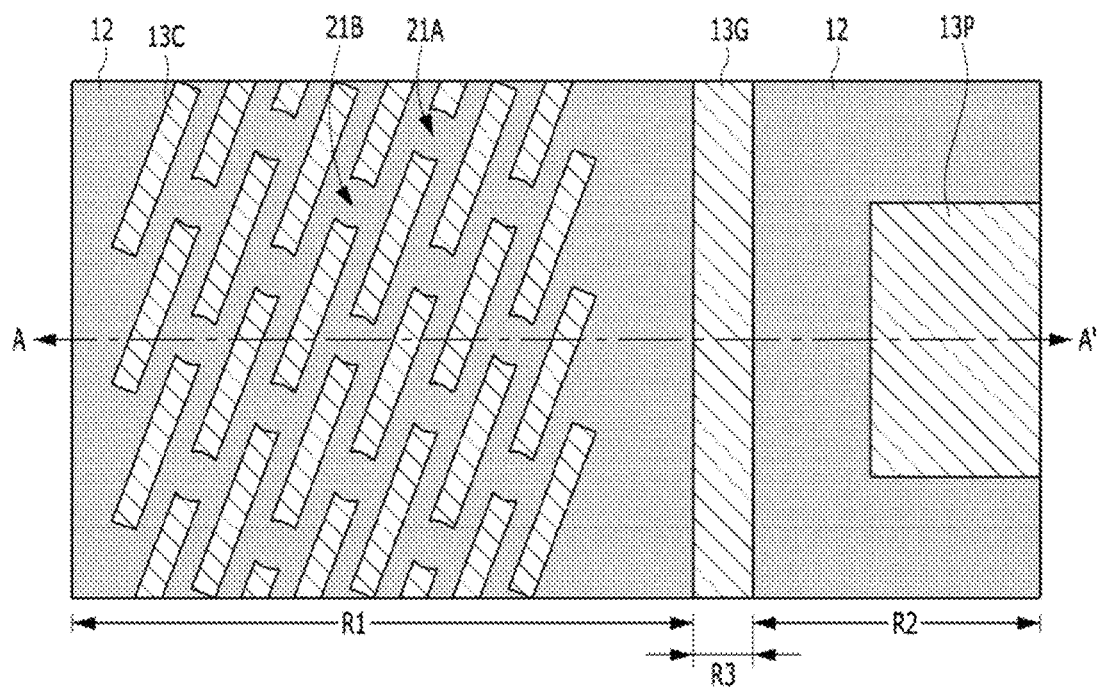
Figure 3N:
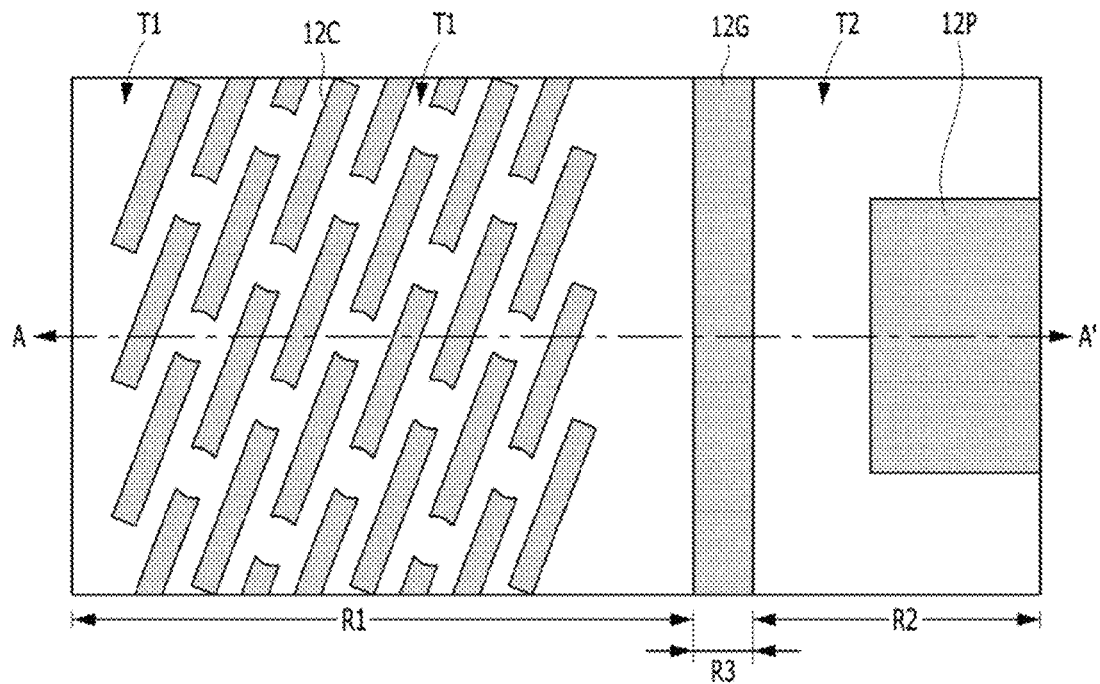
Figure 3O:
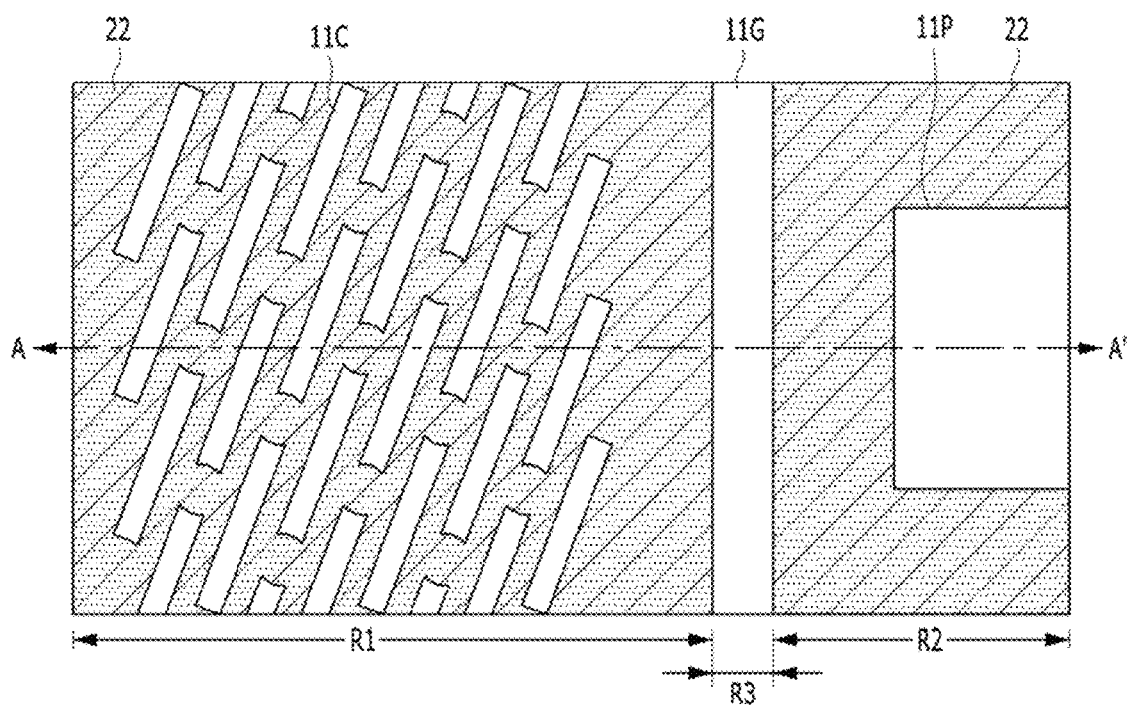
Figure 4A:
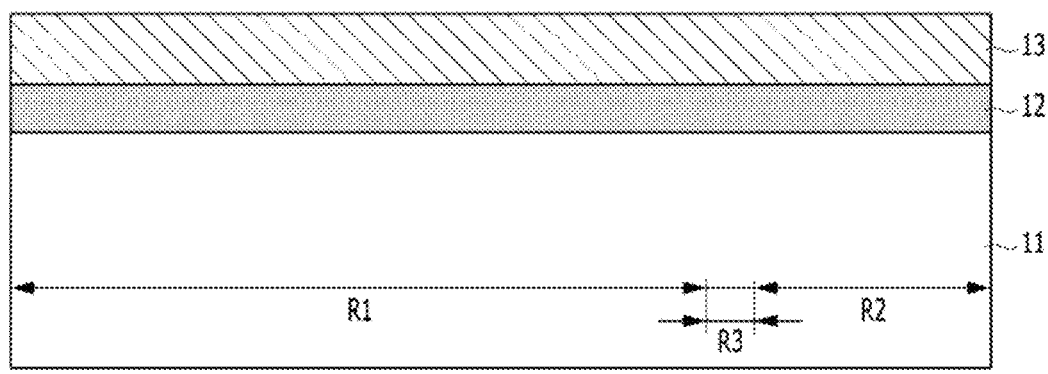
FIGS. 4A to 4O are cross-sectional views taken along the lines A-A' of FIGS. 3A to 3O.

FIGS. 3A to 3O are plan views explaining a method of fabricating a semiconductor device in accordance with a first embodiment. FIGS. 4A to 4O are cross-sectional views taken along the lines A-A' of FIGS. 3A to 3O.

As shown in FIGS. 3A and 4A, an etch target layer, that is, a substrate 11 is prepared. The substrate 11 may include an appropriate workpiece for semiconductor processing. For example, the substrate 11 may include a silicon substrate, a silicon germanium substrate or a silicon-on-insulator (SOI) substrate. The substrate 11 may be defined by a first region R1, a second region R2 and a third region R3. The first region R1 may include a region where high density first patterns are to be formed, and the second region R2 may include a region where a low density second pattern is to be formed. For example, the first region R1 may include a cell array region, and the second region R2 may include a peripheral circuit region. The third region R3 may include a boundary region between the first region R1 and the second region R2. The third region R3 may include a guard region. The guard region may protect the first region R1 from subsequent processes. For reference, as used herein, the 'cell array region' is defined as a region where a plurality of memory cells are formed. The 'peripheral circuit region' includes a core region where sense amplifiers or sub word line drivers (SWD) are formed.

A plurality of hard mask layers may be formed on the substrate 11.

First, a bottom layer 13 may be formed on the substrate 11. The bottom layer 13 may be formed of a material which has an etch selectivity to the substrate 11. The bottom layer 13 may include oxide, polysilicon or a combination thereof. The bottom layer 13 may be used as a hard mask. Accordingly, the bottom layer 13 may be referred to as a bottom hard mask layer.

Before forming the bottom layer 13, a buffer layer 12 may be formed. The buffer layer 12 may be formed of a material which has an etch selectivity to the substrate 11 and the bottom layer 13. The buffer layer 12 may include oxide, nitride, oxynitride or a combination thereof. For example, the buffer layer 12 may be formed of silicon oxide. In this case, the bottom layer 13 may be formed of a polysilicon layer. In another embodiment, where the bottom layer 13 has an etch selectivity to the substrate 11, the buffer layer 12 may be omitted.

Figure 4B:
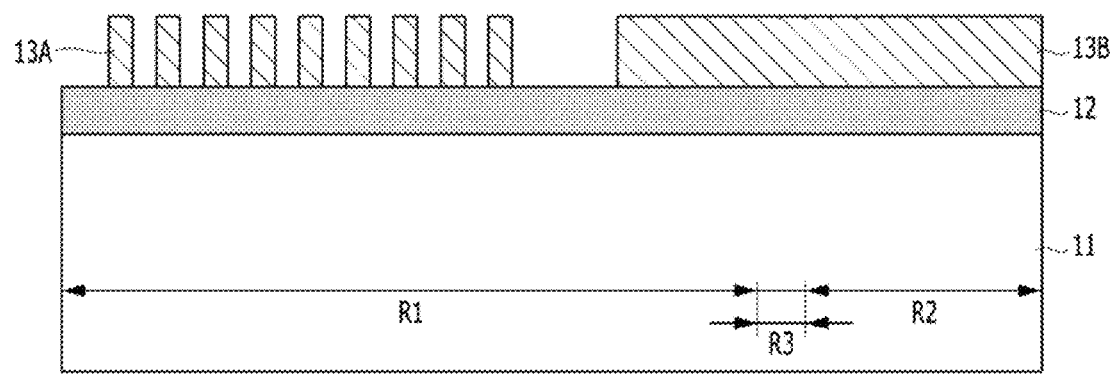

As shown in FIGS. 3B and 4B, the bottom layer 13 may be patterned. Accordingly, a plurality of line patterns 13A and a pre-pad pattern 13B may be formed on the buffer layer 12. The line patterns 13A may be line and space type patterns. The line patterns 13A may be formed over the first region R1. The pre-pad pattern 13B may be formed over the second region R2 and the third region R3. A portion of the pre-pad pattern 13B may extend to an edge region of the first region R1. The line patterns 13A and the pre-pad pattern 13B may be formed of the same material. The line patterns 13A may extend in any one direction. The line patterns 13A may be line patterns which extend in an oblique direction. In order to form the line and space type line patterns 13A, a spacer patterning technology (SPT) may be applied.

The spacer patterning technology may include a positive SPT (P-SPT) and a negative SPT (N-SPT).

Describing an example of the positive SPT, after forming a hard mask layer on the bottom layer 13, sacrificial patterns are formed. After forming spacers on the sidewalls of the sacrificial patterns, the sacrificial patterns are removed. Thereafter, the hard mask layer is etched using the spacers as a mask. In other words, in the positive SPT, the shapes of the spacers become the shapes of final patterns. The bottom layer 13 is etched using the hard mask layer as an etch mask.

Describing an example of the negative SPT, after forming a hard mask layer on the bottom layer 13, first sacrificial patterns are formed. After forming spacers on the first sacrificial patterns, second sacrificial patterns are formed using a gap-fill material which fills spaces between the spacers. Thereafter, the spacers are removed, and the hard mask layer is etched using the first sacrificial patterns and the second sacrificial patterns as a mask. Namely, in the negative SPT, not the shapes of the spacers but the shapes of the spaces between the spacers become the shapes of final patterns. The bottom layer 13 is etched using the hard mask layer as an etch mask.

By applying the spacer patterning technology (SPT) as described above, it is possible to realize the line and space type line patterns 13A which have a uniform and fine line width. The line patterns 13A may be high density patterns.

Figure 4C:
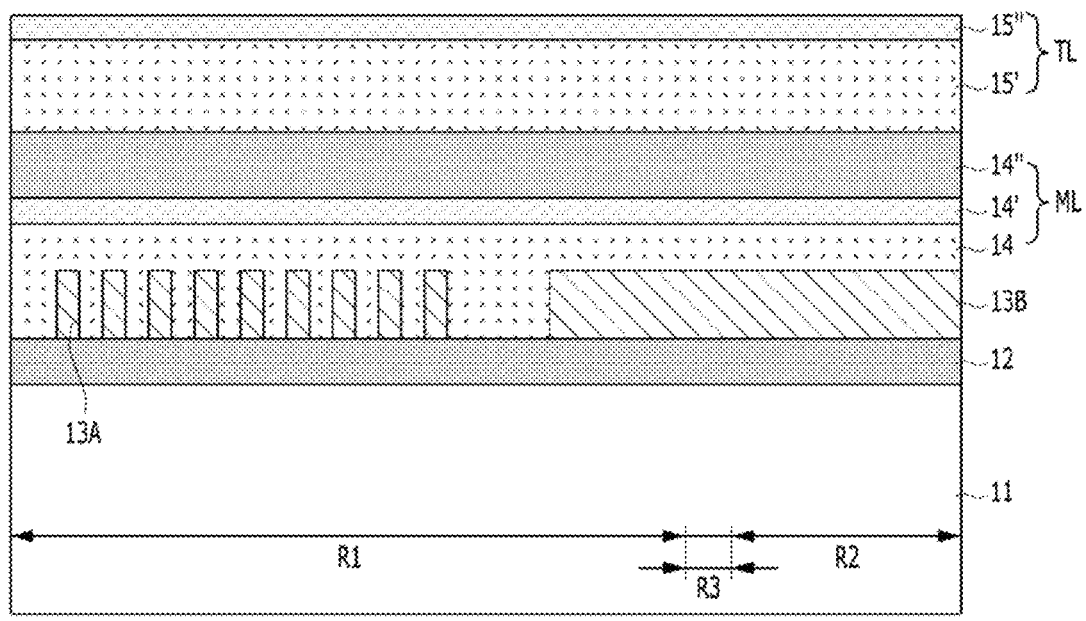

As shown in FIGS. 3C and 4C, a middle layer ML may be formed on the line patterns 13A and the pre-pad pattern 13B. The middle layer ML may include a planarization layer. The middle layer ML may be formed of a material which has an etch selectivity to the line patterns 13A and the pre-pad pattern 13B. The middle layer ML may include a carbon-containing material, silicon oxynitride (SiON), silicon oxide ($SiO_2$) or a combination thereof. For example, a first carbon layer 14, first silicon oxynitride (SiON) 14' and silicon oxide 14" may be sequentially stacked to form the middle layer ML. Since the first carbon layer 14 is formed of spin-on-carbon (SOC), planarization may be improved.

A top layer TL may be formed on the middle layer ML. The top layer TL may be formed of a material which has an etch selectivity to the middle layer ML. The top layer TL may include a carbon-containing material, silicon oxynitride or a combination thereof. The top layer TL may have a stacked structure of a plurality of layers. For example, the top layer TL may be formed by stacking a second carbon layer 15' and second silicon oxynitride 15". The second carbon layer 15' may be formed of spin-on-carbon (SOC).

As described above, the buffer layer 12, the line patterns 13A, the pre-pad pattern 13B, the middle layer ML and the top layer TL are materials which are used as hard masks. The line patterns 13A may be used as the etch mask of the buffer layer 12. The middle layer ML may be used as the etch mask of the line patterns 13A. The top layer TL may be used as the etch mask of the middle layer ML. The buffer layer 12 may serve as the etch mask of the substrate 11.

Figure 4D:
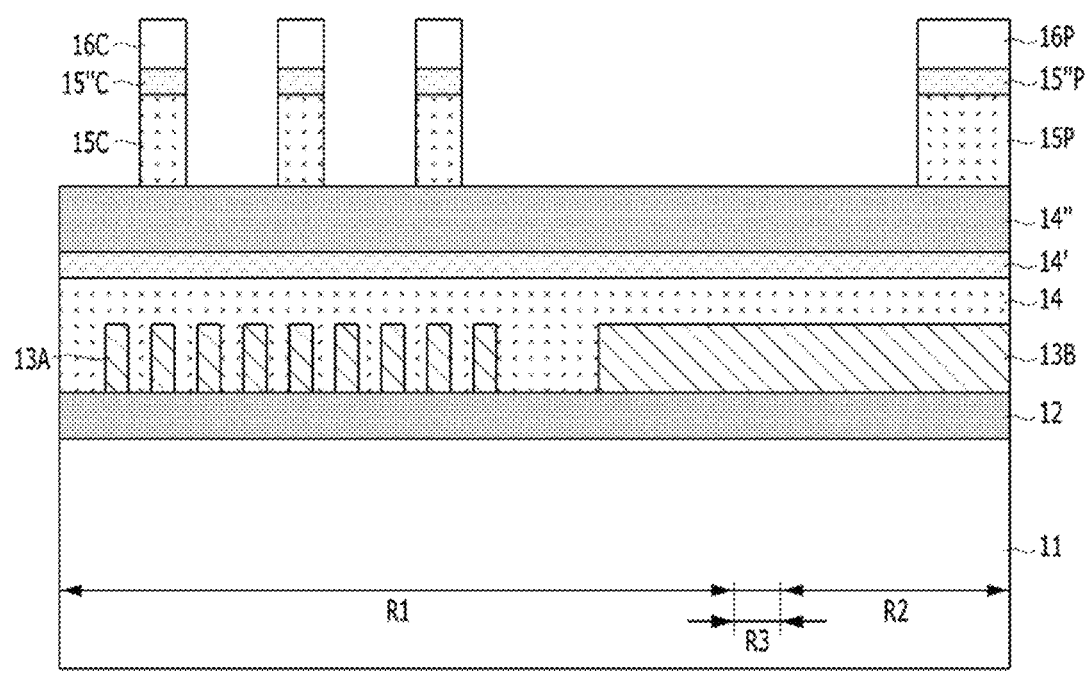

As shown in FIGS. 3D and 4D, a plurality of sacrificial pillars 16C may be formed on the top layer TL of the first region R1. A sacrificial mask pattern 16P may be formed on the top layer TL of the second region R2. The sacrificial pillars 16C and the sacrificial mask pattern 16P may be formed at the same level or height from the substrate 11. The sacrificial pillars 16C and the sacrificial mask pattern 16P may include a material which has an etch selectivity to the top layer TL. The sacrificial pillars 16C and the sacrificial mask pattern 16P may be formed of the same material. For example, the sacrificial pillars 16C and the sacrificial mask pattern 16P may include photoresist patterns. The sacrificial pillars 16C and the sacrificial mask pattern 16P are not formed in the third region R3. The top surface of the top layer TL may be exposed by the sacrificial pillars 16C and the sacrificial mask pattern 16P. The plurality of sacrificial pillars 16C may be arranged two-dimensionally along columns and rows in the first region R1 when viewed from the top. The rows may be parallel to a first direction, and the columns may be parallel to a second direction. The second direction crosses with the first direction. According to an embodiment, the rows may be parallel to an x-axis, and the columns may be parallel to a y-axis. According to an embodiment, the rows may be parallel to a major axis of the substrate 11, and the columns may be parallel to a minor axis of the substrate 11.

The top layer TL may be etched partially. The second silicon oxynitride 15" and the second carbon layer 15' are etched using the sacrificial pillars 16C and the sacrificial mask pattern 16P as an etch mask. Accordingly, second silicon oxynitride patterns 15"C and 15"P may be formed. Also, second carbon layer patterns 15C and 15P may be formed.

The second carbon layer patterns 15C formed in the first region R1 may be referred to as 'pillars 15C'. The second carbon layer pattern 15P formed in the second region R2 may be referred to as a 'sacrificial pad pattern 15P'. The pillars 15C and the sacrificial pad pattern 15P may be formed of spin-on-carbon. The pillars 15C may be spin-on-carbon pillars. The plurality of pillars 15C may be arranged two-dimensionally along columns and rows in the first region R1 when viewed from the top. The rows may be parallel to the first direction, and the columns may be parallel to the second direction. The second direction crosses with the first direction. According to an embodiment, the rows are parallel to the x-axis, and the columns are parallel to the y-axis.

The sacrificial pad pattern 15P and the pillars 15C are not formed in the third region R3. The sacrificial pad pattern 15P and the pillars 15C may be formed at the same level or height as the substrate 11.

Figure 4E:
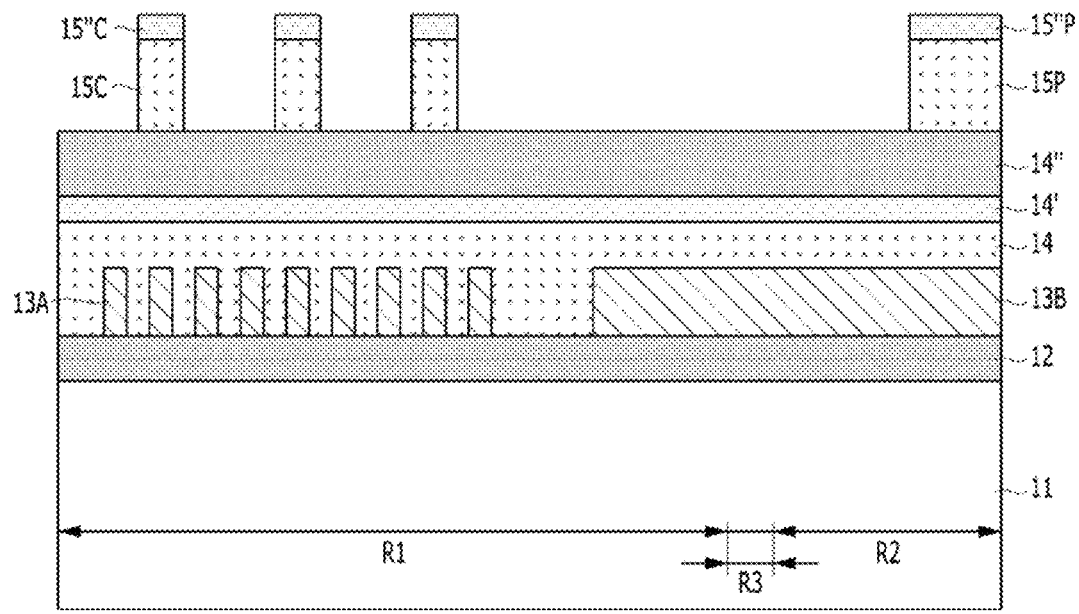

As shown in FIGS. 3E and 4E, the sacrificial pillars 16C and the sacrificial mask pattern 16P are removed. Accordingly, the second silicon oxynitride patterns 15"C and 15"P may be exposed. Also, the sidewalls of the sacrificial pad pattern 15P and the pillars 15C may be exposed.

Figure 4F:
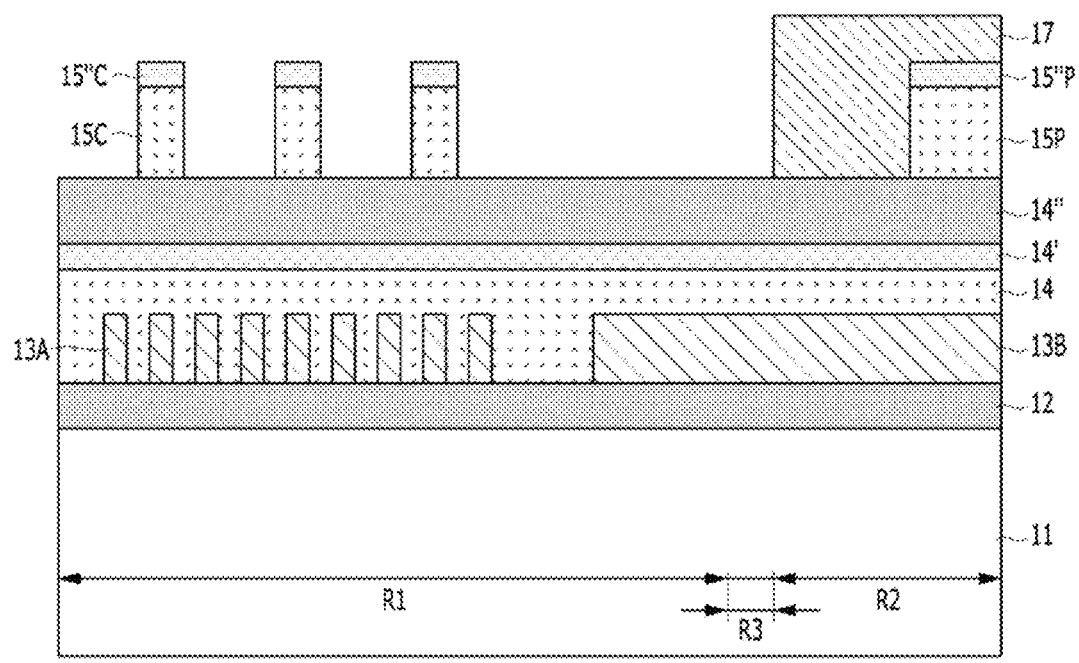

As shown in FIGS. 3F and 4F, an open mask 17 may be formed. The open mask 17 may open the first region R1 and cover the second region R2. When the first region R1 is a cell array region, the open mask 17 may be referred to as a cell open mask (COM). The first region R1 and the third region R3 may be open by the open mask 17. The open mask 17 may include a photoresist pattern. The plurality of pillars 15C and the second silicon oxynitride patterns 15"C may be exposed by the open mask 17. The open mask 17 may cover the sidewalls of the sacrificial pad pattern 15P and the sidewalls and the top surface of the second silicon oxynitride pattern 15"P. That is, the open mask 17 may cap the sacrificial pad pattern 15P.

Figure 4G:
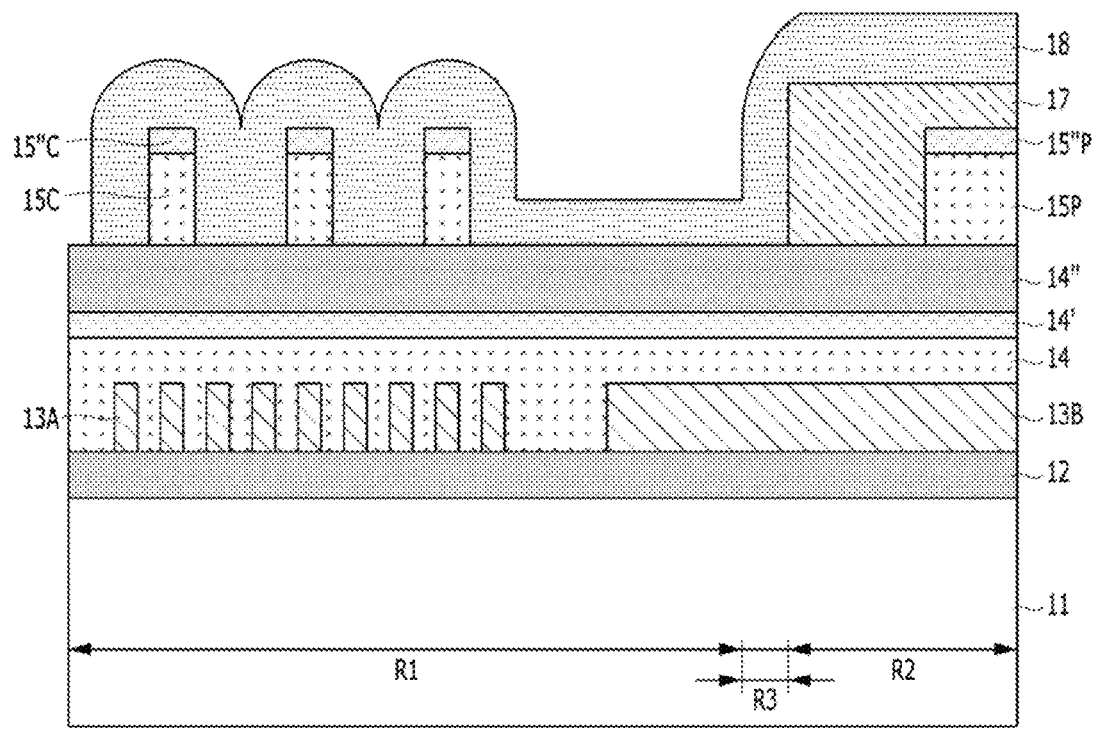

As shown in FIGS. 3G and 4G, a spacer layer 18 may be formed on a resultant structure including the open mask 17 and the pillars 15C. The spacer layer 18 may be formed of a material which has an etch selectivity to the pillars 15C. The spacer layer 18 may include polysilicon.

Figure 4H:
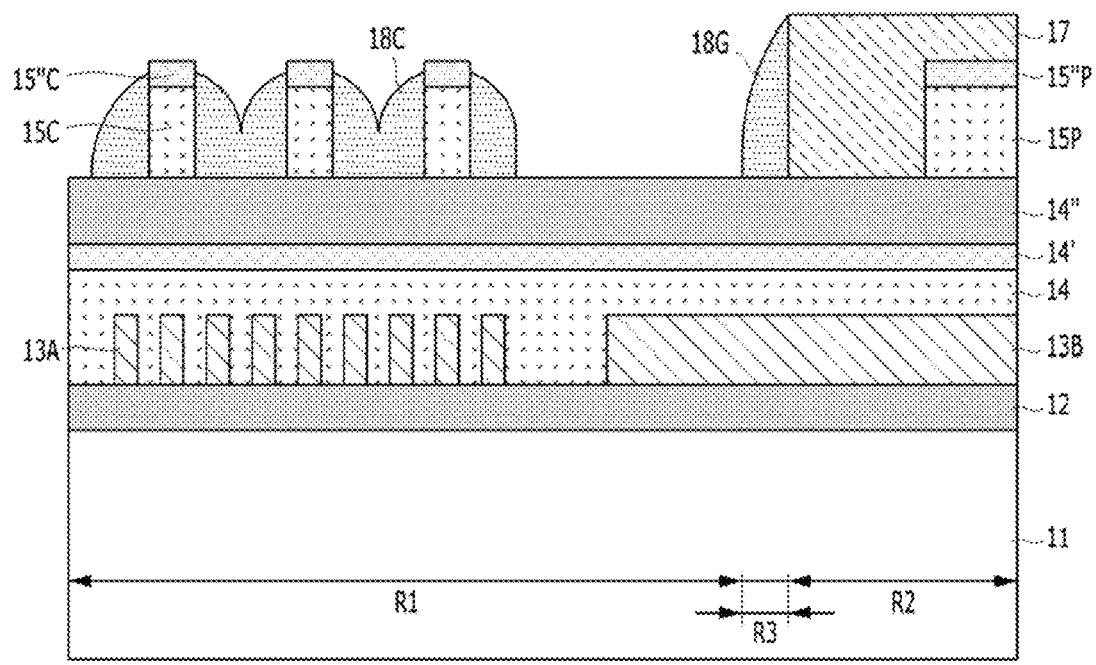

As shown in FIGS. 3H and 4H, a plurality of first spacers 18C may be formed. The spacer layer 18 may be anisotropically etched to form the first spacers 18C on the sidewalls of the pillars 15C. By the first spacers 18C, interstitial spaces 19A may be defined laterally outward of the pillars 15C. The top surface of the middle layer ML, that is, the silicon oxide 14", may be exposed by the interstitial spaces 19A. A second spacer 18G may be formed on the sidewall of the open mask 17.

When viewed from the top, the first spacers 18C may have a doughnut shape. The plurality of first spacers 18C may contact one another and have merged portions 18M. The plurality of first spacers 18C may have non-contacting portions. The interstitial spaces 19A may be defined by the non-contacting portions of the plurality of first spacers 18C. Hereinafter, the interstitial spaces 19A will be referred to as 'first pre-openings 19A'.

Figure 4I:
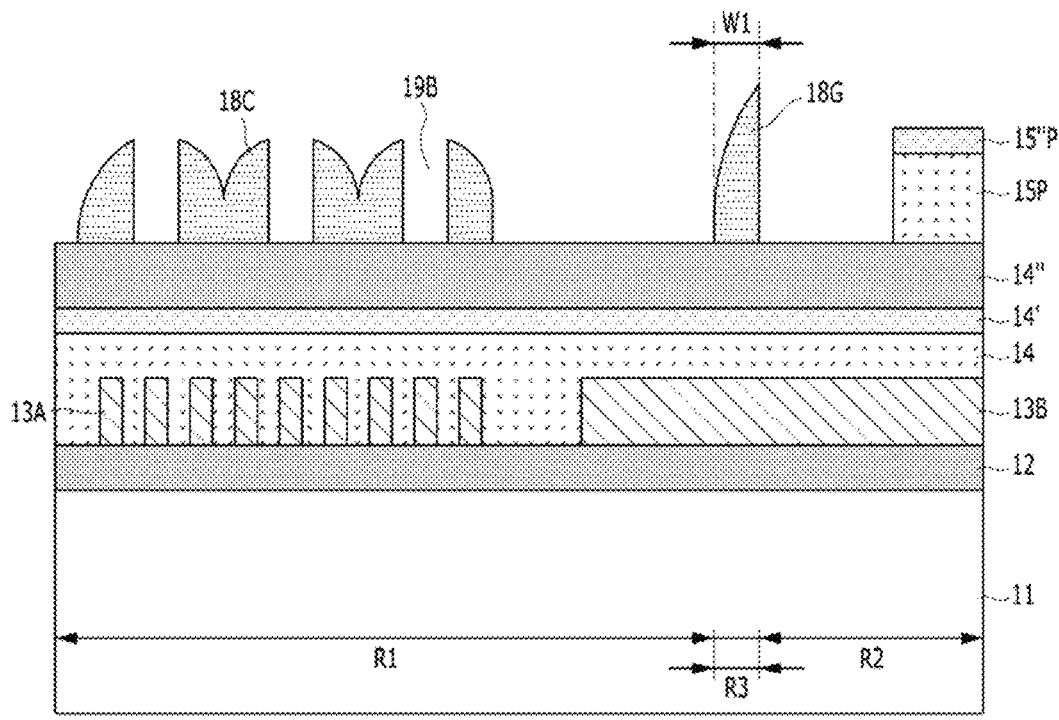

As shown in FIGS. 3I and 4I, the pillars 15C and the second silicon oxynitride patterns 15"C are removed. Accordingly, inner spaces 19B may be defined between the first spacers 18C. Hereinafter, the inner spaces 19B will be referred to as 'second pre-openings 19B'. Due to the open mask 17, the second silicon oxynitride pattern 15"P of the second region R2 may not be removed and may remain.

The open mask 17 is removed. The second spacer 18G may be positioned over the third region R3.

After removing the pillars 15C, the first spacers 18C may remain in the first region R1. The first pre-openings 19A and the second pre-openings 19B may be defined by the first spacers 18C. The second pre-openings 19B are spaces from which the pillars 15C are removed, and the first pre-openings 19A are spaces which are formed laterally outward of the first spacers 18C. After removing the open mask 17, the second spacer 18G may remain in the third region R3. The sacrificial pad pattern 15P and the second silicon oxynitride pattern 15"P may remain in the second region R2.

In this way, the plurality of first spacers 18C may be formed on the middle layer ML. The first spacers 18C may include the first pre-openings 19A and the second pre-openings 19B. By the first pre-openings 19A and the second pre-openings 19B, the top surface of the middle layer ML, that is, the silicon oxide 14", may be partially exposed. The remaining top surface of the silicon oxide 14" may be covered by the first spacers 18C and the second spacer 18G.

The sizes of the first pre-openings 19A and the second pre-openings 19B may be controlled by the thickness of the first spacers 18C. The first pre-openings 19A and the second pre-openings 19B may be arranged to overlap with the line patterns 13A.

Figure 4J:
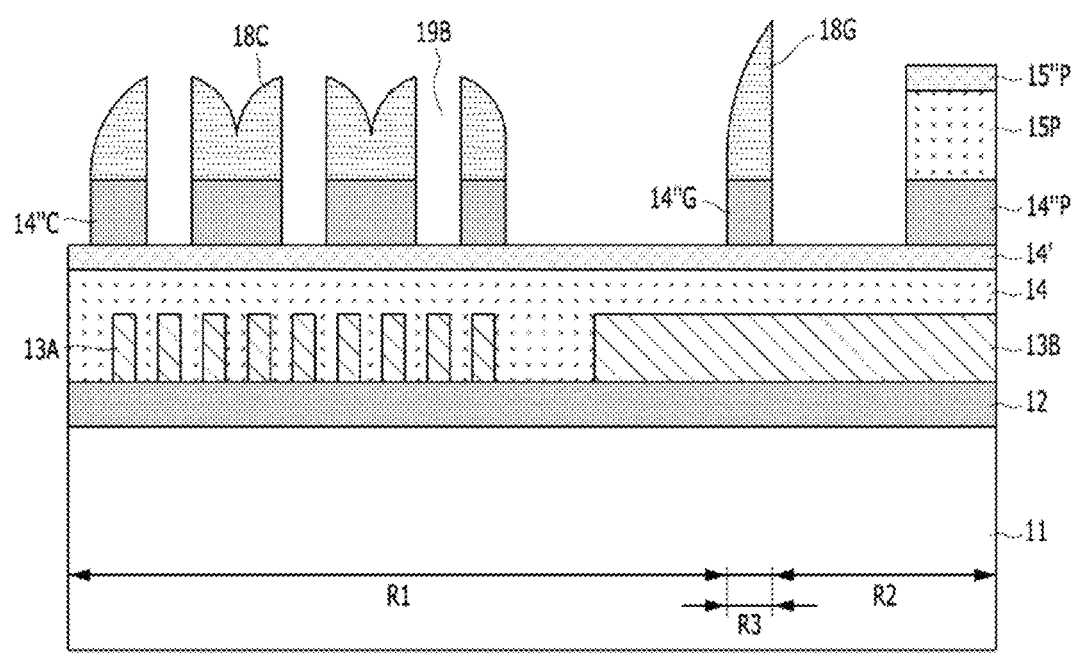

As shown in FIGS. 3J and 4J, the middle layer ML may be partially etched. For example, the silicon oxide 14" may be etched. The silicon oxide 14" may be etched by dry etching such as plasma etching. Accordingly, silicon oxide patterns 14"C, 14"P and 14"G may be formed. The silicon oxide patterns 14"C, 14"P and 14"G may include a first middle silicon oxide pattern 14"C, a second middle silicon oxide pattern 14"P and a third middle silicon oxide pattern 14"G. The first middle silicon oxide pattern 14"C may be formed over the first region R1. The second middle silicon oxide pattern 14"P may be formed over the second region R2. The third middle silicon oxide pattern 14"G may be formed over the third region R3. In order to form the first to third middle silicon oxide patterns 14"C, 14"P and 14"G, the silicon oxide 14" may be etched using the first spacers 18C, the sacrificial pad pattern 15P and the second spacer 18G as an etch mask.

By the first middle silicon oxide pattern 14"C, the second middle silicon oxide pattern 14"P and the third middle silicon oxide pattern 14"G, the top surface of the first silicon oxynitride 14' may be partially exposed.

Figure 4K:
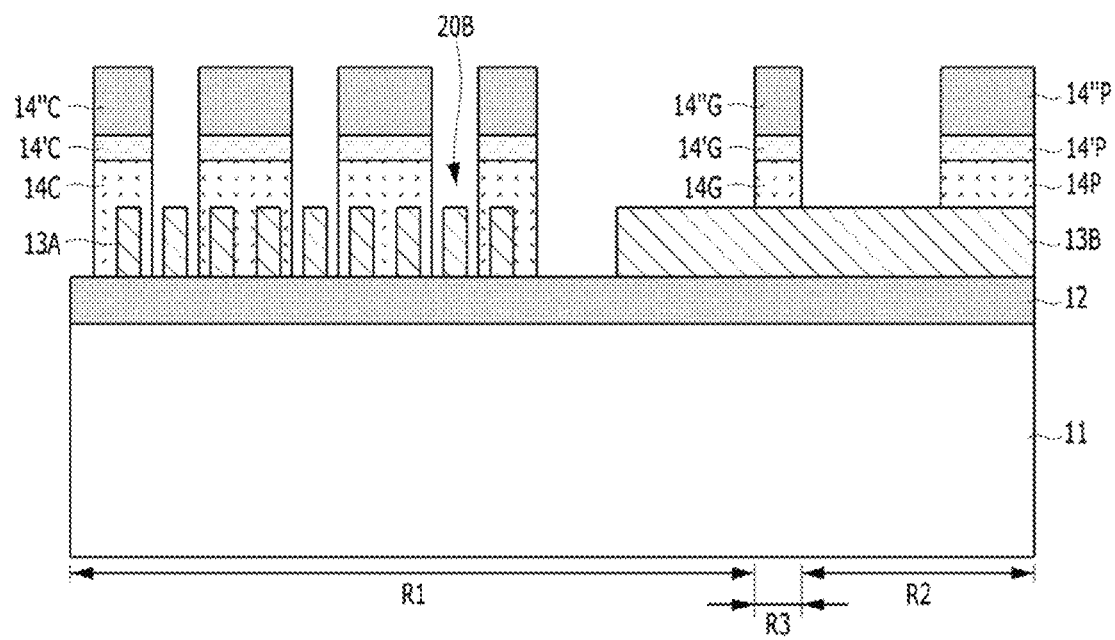

As shown in FIGS. 3K and 4K, the first spacers 18C, the second spacer 18G and the sacrificial pad pattern 15P may be removed.

The remaining layers of the middle layer ML may be etched. For example, the first silicon oxynitride 14' and the first carbon layer 14 may be etched using the first middle silicon oxide pattern 14"C, the second middle silicon oxide pattern 14"P and the third middle silicon oxide pattern 14"G as an etch mask. By etching of the first carbon layer 14, middle layer patterns 14C, 14P and 14G may be formed. The middle layer patterns 14C, 14P and 14G may include a first middle layer pattern 14C, a second middle layer pattern 14P and a third middle layer pattern 14G. The first middle layer pattern 14C may be formed over the first region R1, the second middle layer pattern 14P may be formed over the second region R2, and the third middle layer pattern 14G may be formed over the third region R3. First silicon oxynitride patterns 14'C, 14'P and 14'G may be formed on the first middle layer pattern 14C, the second middle layer pattern 14P and the third middle layer pattern 14G, respectively.

The top surfaces of some of the line patterns 13A may be exposed by the first middle layer pattern 14C. The first middle layer pattern 14C may serve as a cutting mask pattern. When viewed from the top, the first middle layer pattern 14C may have the same shape as the shapes of the first spacers 18C.

First openings 20A and second openings 20B may be formed in the first middle layer pattern 14C. The first openings 20A may be formed from the first pre-openings 19A of the first spacers 18C. The second openings 20B may be formed from the second pre-openings 19B of the first spacers 18C. The first openings 20A and the second openings 20B may have a circular shape. Since the middle layer ML is plasma-etched, the first openings 20A may have a circular shape due to an etch loading effect. In other words, by plasma-etching the middle layer ML using the first pre-openings 19A which have a rhombus shape, the first openings 20A may be formed to have a circular shape. Both the first openings 20A and the second openings 20B may have a circular shape.

When viewed from the top, the second middle layer pattern 14P may have the same shape as the shape of the sacrificial pad pattern 15P, and the third middle layer pattern 14G may have the same shape as the shape of the second spacer 18G.

Figure 4L:
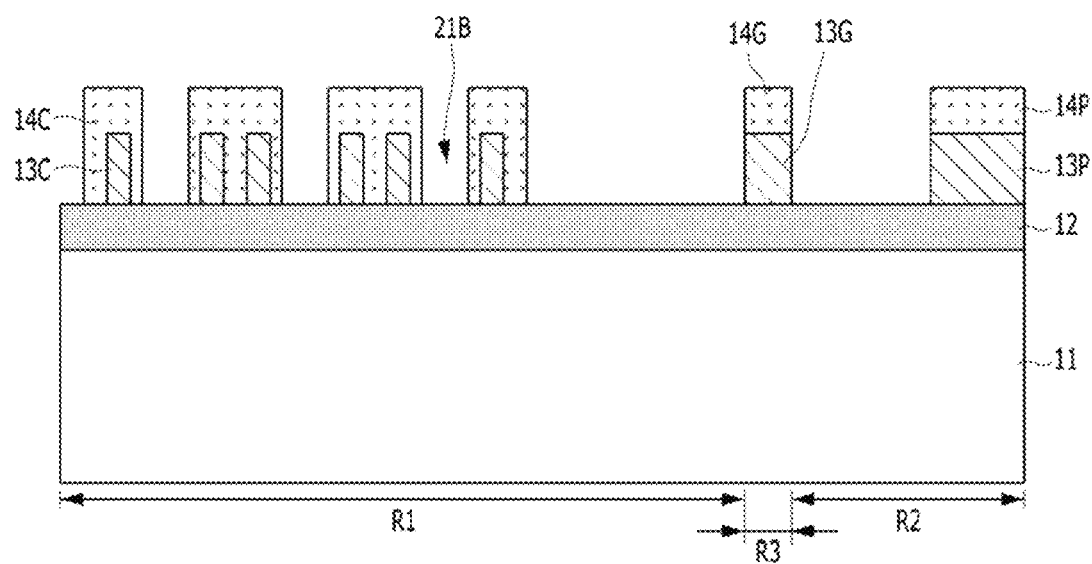

As shown in FIGS. 3L and 4L, the first middle silicon oxide pattern 14"C, the second middle silicon oxide pattern 14"P and the third middle silicon oxide pattern 14"G may be removed. Next, the first silicon oxynitride patterns 14'C, 14'G and 14'P may be removed.

The line patterns 13A and the pre-pad pattern 13B may be etched. For example, the line patterns 13A and the pre-pad pattern 13B are etched using the first to third middle layer patterns 14C, 14P and 14G as an etch mask. The line patterns 13A are cut through the first openings 20A and the second openings 20B.

By the cutting process, the line patterns 13A may be separated. For example, one line pattern 13A is separated into a plurality of cut patterns 13C. The cut patterns 13C may have an isolated island shape. The cut patterns 13C may have an island shape which has a minor axis and a major axis. The cut patterns 13C which are adjacent in the direction of the major axis may be separated from one another by first separation holes 21A and second separation holes 21B. The cut patterns 13C which are adjacent in the direction of the minor axis may be separated from one another by spaces between the line patterns 13A.

The plurality of cut patterns 13C may be formed over the first region R1. The first and second separation holes 21A and 21B are alternatively disposed along the major axis of the cut patterns 13C. A pad pattern 13P is formed over the second region R2, and a guard pattern 13G is formed over the third region R3. When viewed from the top, the pad pattern 13P may have the same shape as the second middle layer pattern 14P, and the guard pattern 13G may have the same shape as the third middle layer pattern 14G. The cut patterns 13C, the pad pattern 13P and the guard pattern 13G may include polysilicon.

In this way, the plurality of cut patterns 13C, which are separated by the first and second separation holes 21A and 21B, may be formed over the first region R1, and at the same time, the pad pattern 13P may be formed over the second region R2.

Figure 4M:
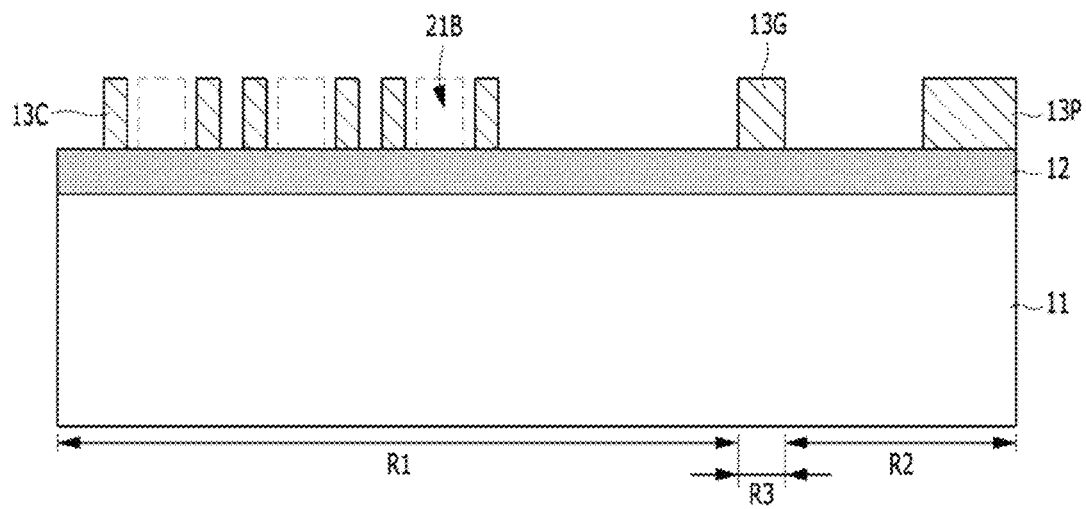

As shown in FIGS. 3M and 4M, the first to third middle layer patterns 14C, 14P and 14G may be removed.

According to the series of processes described above, in the embodiment, the cut patterns 13C, the pad pattern 13P and the guard pattern 13G may be simultaneously formed.

Figure 4N:
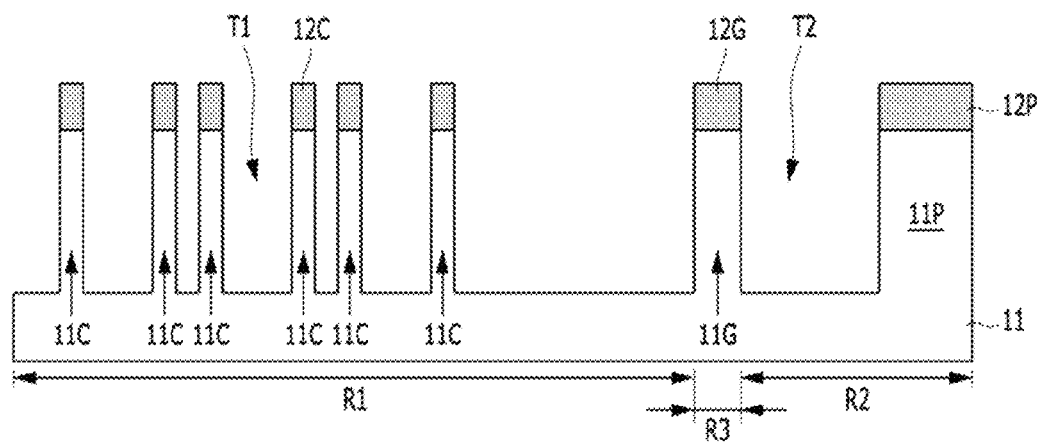
Figure 40:
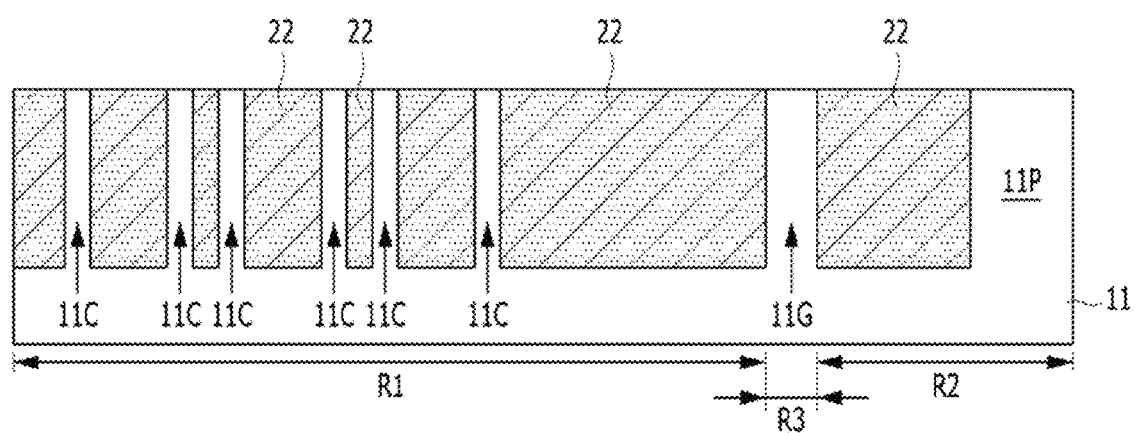

As shown in FIGS. 3N and 4N, the buffer layer 12 is etched using the cut patterns 13C, the pad pattern 13P and the guard pattern 13G as an etch mask. After the buffer layer 12 is etched, buffer layer patterns 12C, 12P and 12G are formed. For example, first buffer layer patterns 12C, a second buffer layer pattern 12P and a third buffer layer pattern 12G may be formed. When viewed from the top, the first to third buffer layer patterns 12C, 12P and 12G may have the same shapes as the cut patterns 13C, the pad pattern 13P and the guard pattern 13G, respectively.

The substrate 11 may be etched. While etching the substrate 11, the cut patterns 13C, the pad pattern 13P and the guard pattern 13G may be removed. Accordingly, the first to third buffer layer patterns 12C, 12P and 12G may be used as an etch mask for etching the substrate 11.

In this way, after the substrate 11 is etched, a plurality of patterns 11C, 11P and 11G are formed in the substrate 11. For example, a plurality of first patterns 11C may be formed in the first region R1, and a second pattern 11P may be formed in the second region R2. Moreover, a third pattern 11G may be formed in the third region R3. The first patterns 11C may be high density patterns, and the second pattern 11P and the third pattern 11G may be low density patterns. The first patterns 11C may be patterns the size of which is smaller than the second and third patterns 11P and 11G.

The plurality of first patterns 11C may be defined by first trenches T1. The second pattern 11P may be defined by a second trench T2. The third pattern 11G may be defined between the first trenches T1 and the second trench T2. The first patterns 11C may be referred to as first active regions 11C, and the second pattern 11P may be referred to as a second active region 11P. The third pattern 11G may be referred to as a guard region 11G.

As shown in FIGS. 3O and 4O, the first to third buffer layer patterns 12C, 12P and 12G may be removed.

A dielectric material is formed to fill the first trenches T1 and the second trench T2. Accordingly, an isolation layer 22 may be formed. The isolation layer 22 may be formed of silicon nitride, silicon oxide or a combination thereof.

By the isolation layer 22, the plurality of first patterns 11C, the second pattern 11P and the third pattern 11G may be separated from one another.

According to the first embodiment, etch masks for forming the first patterns 11C, the second pattern 11P and the third pattern 11G in the first region R1, the second region R2 and the third region R3, respectively, may be simultaneously formed. Namely, the cut patterns 13C, the pad pattern 13P and the guard pattern 13G may be simultaneously formed.

Further, in the first embodiment, a cutting mask for cutting the line patterns 13A is not separately needed. In particular, it is not necessary to perform a hole double patterning technology to cut the line patterns 13A. Accordingly, the number of immersion masks for cutting the line patterns 13A may be decreased, and costs may be saved.

FIGS. 5A to 5L are plan views explaining a method of fabricating a semiconductor device in accordance with a second embodiment. FIGS. 6A to 6L are cross-sectional views taken along the lines A-A' of FIGS. 5A to 5L. In the second embodiment, for processes until a top layer TL is formed, reference may be made to the first embodiment.

Figure 5A:
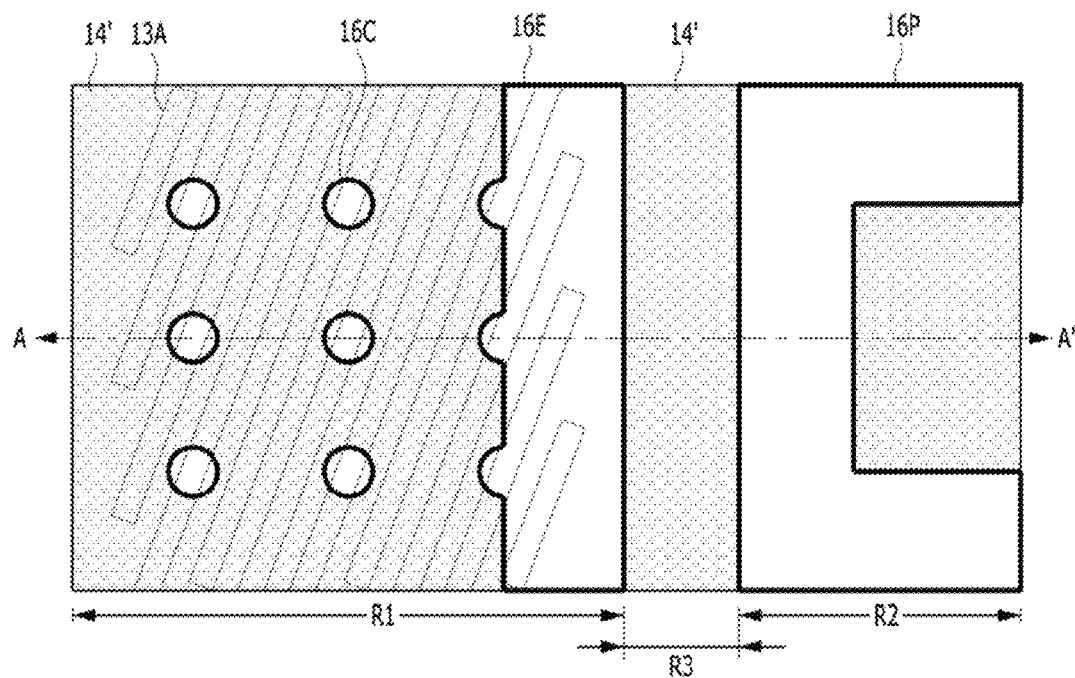
FIGS. 5A to 5L are plan views explaining a method of fabricating a semiconductor device in accordance with a second embodiment.
Figure 6A:
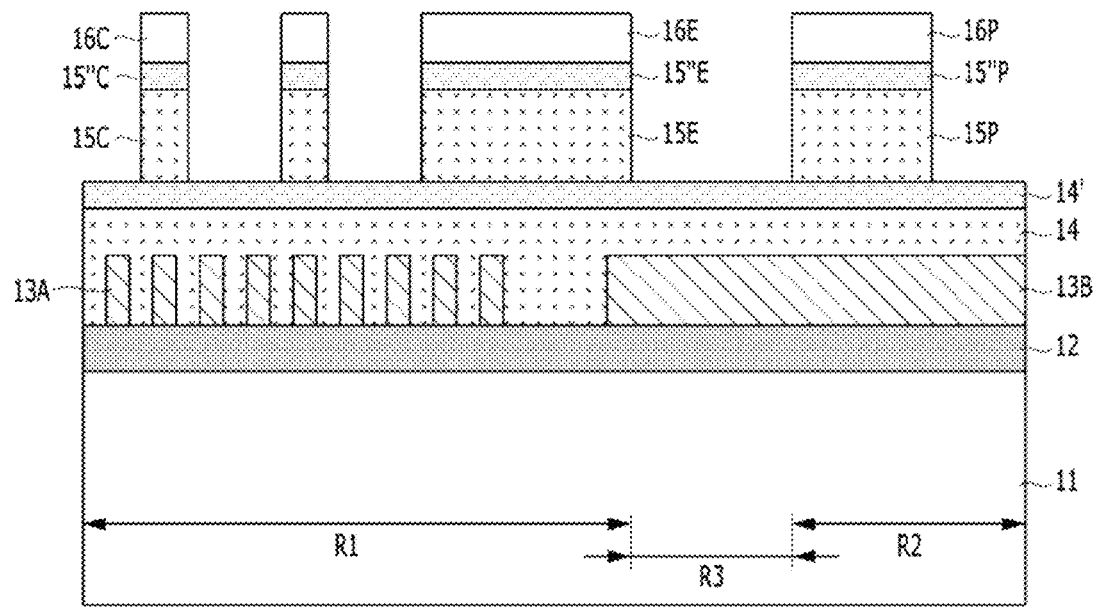
FIGS. 6A to 6L are cross-sectional views taken along the lines A-A' of FIGS. 5A to 5L.

As shown in FIGS. 5A and 6A, line patterns 13A and a pre-pad pattern 13B may be formed on an etch target layer, that is, a substrate 11. A middle layer ML may be formed on the line patterns 13A and the pre-pad pattern 13B. A top layer TL may be formed on the middle layer ML.

A plurality of sacrificial pillars 16C may be formed on the top layer TL of a first region R1. A sacrificial mask pattern 16P may be formed on the top layer TL of a second region R2. An edge sacrificial mask pattern 16E may be formed on the top layer TL of an edge region of the first region R1. The sacrificial pillars 16C, the sacrificial mask pattern 16P and the edge sacrificial mask pattern 16E may be formed at the same level or height from the substrate 11. The sacrificial pillars 16C, the sacrificial mask pattern 16P and the edge sacrificial mask pattern 16E may be formed of the same material. For example, the sacrificial pillars 16C, the sacrificial mask pattern 16P and the edge sacrificial mask pattern 16E may include photoresist patterns.

The top layer TL may be etched partially. Second silicon oxynitride and a second carbon layer included in the top layer TL are etched using the sacrificial pillars 16C, the sacrificial mask pattern 16P and the edge sacrificial mask pattern 16E as an etch mask. Accordingly, second silicon oxynitride patterns 15"C, 15"E and 15"P may be formed. Also, second carbon layer patterns 15C, 15E and 15P may be formed.

The second carbon layer patterns 15C formed in the first region R1 may be referred to as 'pillars 15C'. The second carbon layer pattern 15P formed in the second region R2 may be referred to as a 'sacrificial pad pattern 15P'. The second carbon layer pattern 15E formed in the edge region of the first region R1 may be referred to as an 'edge sacrificial pad pattern 15E'. The pillars 15C, the edge sacrificial pad pattern 15E and the sacrificial pad pattern 15P may be formed of spin-on-carbon. The pillars 15C may be spin-on-carbon pillars. The plurality of pillars 15C may be arranged two-dimensionally along columns and rows in the first region R1 when viewed from the top. The rows may be parallel to a first direction, and the columns may be parallel to a second direction. The second direction may cross with the first direction. According to an embodiment, the rows are parallel to an x-axis, and the columns are parallel to a y-axis. According to an embodiment, the rows are parallel to a major axis of the substrate 11, and the columns are parallel to a minor axis of the substrate 11.

Figure 5B:
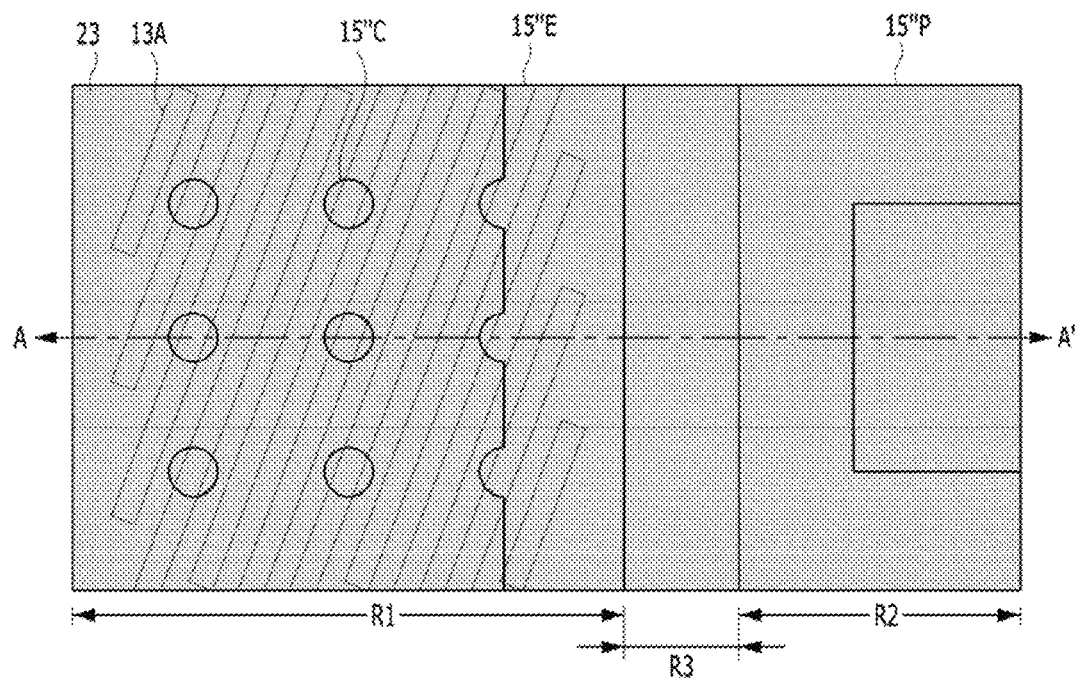
Figure 6B:
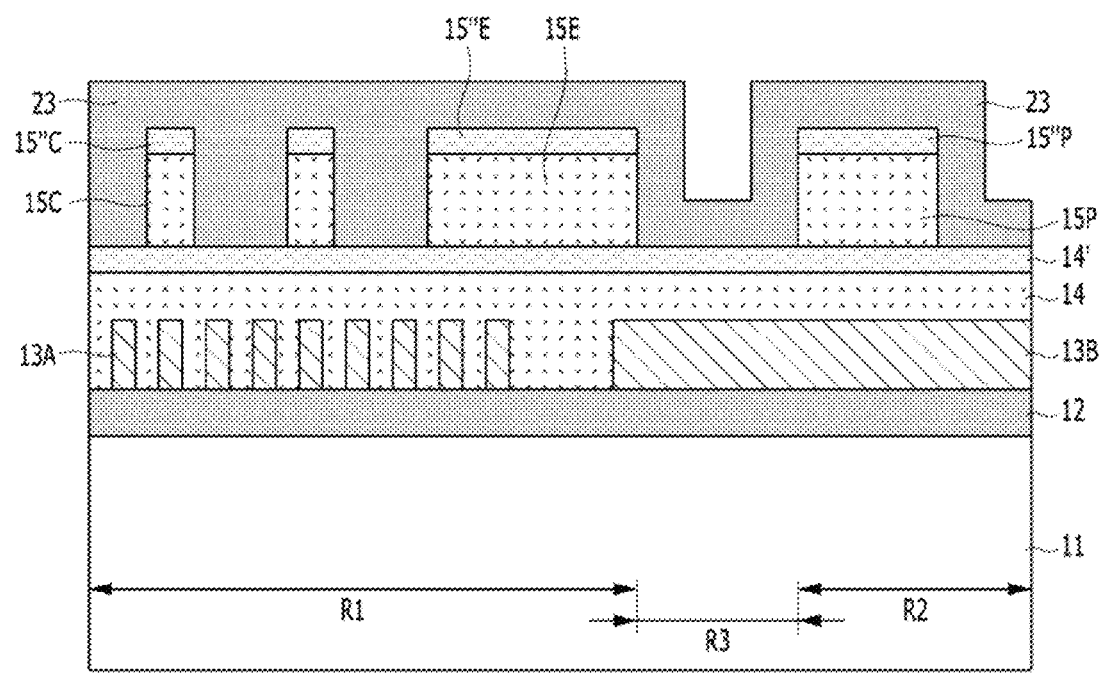

As shown in FIGS. 5B and 6B, the sacrificial pillars 16C, the edge sacrificial mask pattern 16E and the sacrificial mask pattern 16P are removed.

A spacer layer 23 may be formed. The spacer layer 23 may be conformally formed on a resultant structure including the pillars 15C, the sacrificial pad pattern 15P and the edge sacrificial pad pattern 15E. The spacer layer 23 may be formed of a material which has an etch selectivity to the pillars 15C. The spacer layer 23 may include oxide. The spacer layer 23 may be formed of an ultra low temperature oxide (ULTO). The spacer layer 23 may fill spaces between the pillars 15C in the first region R1, and may be formed conformally in the second region R2 and the third region R3.

Figure 5C:
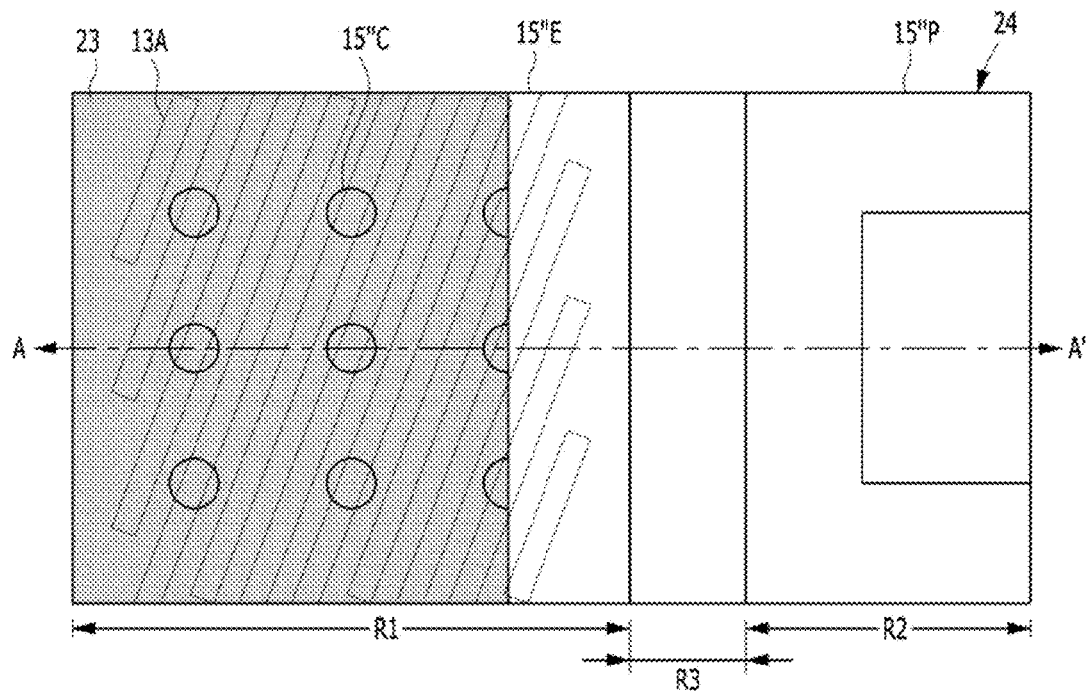
Figure 6C:
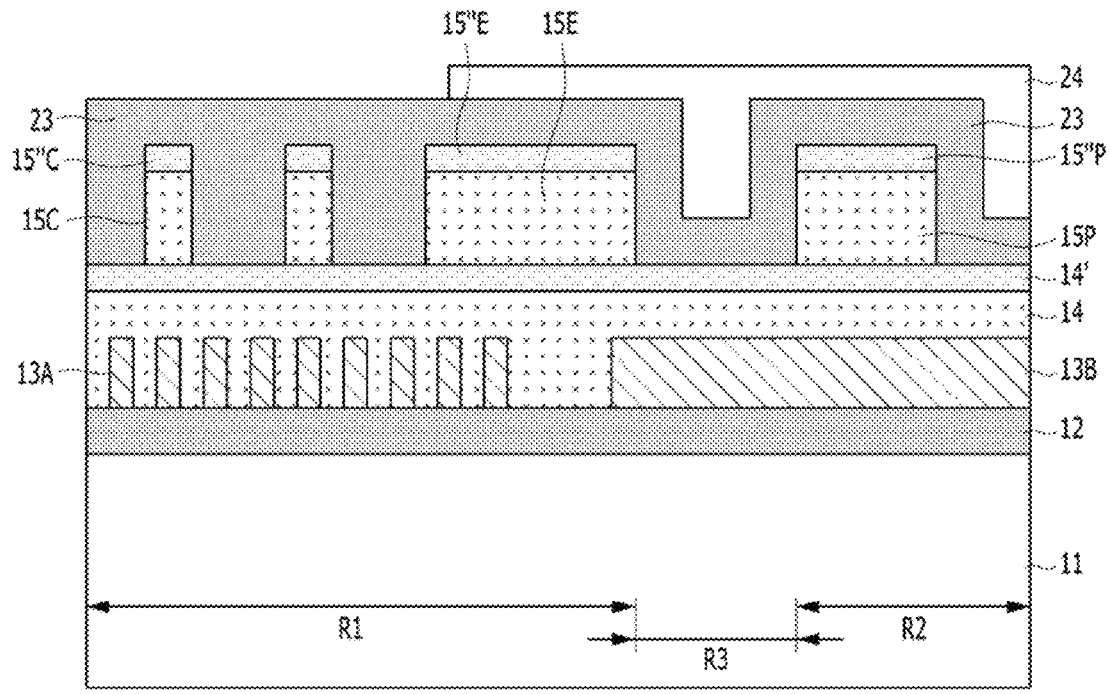

As shown in FIGS. 5C and 6C, a blocking mask pattern 24 is formed. The blocking mask pattern 24 may include a photoresist pattern. The blocking mask pattern 24 may be formed over the second region R2, the third region R3 and the edge region of the first region R1.

Figure 5D:
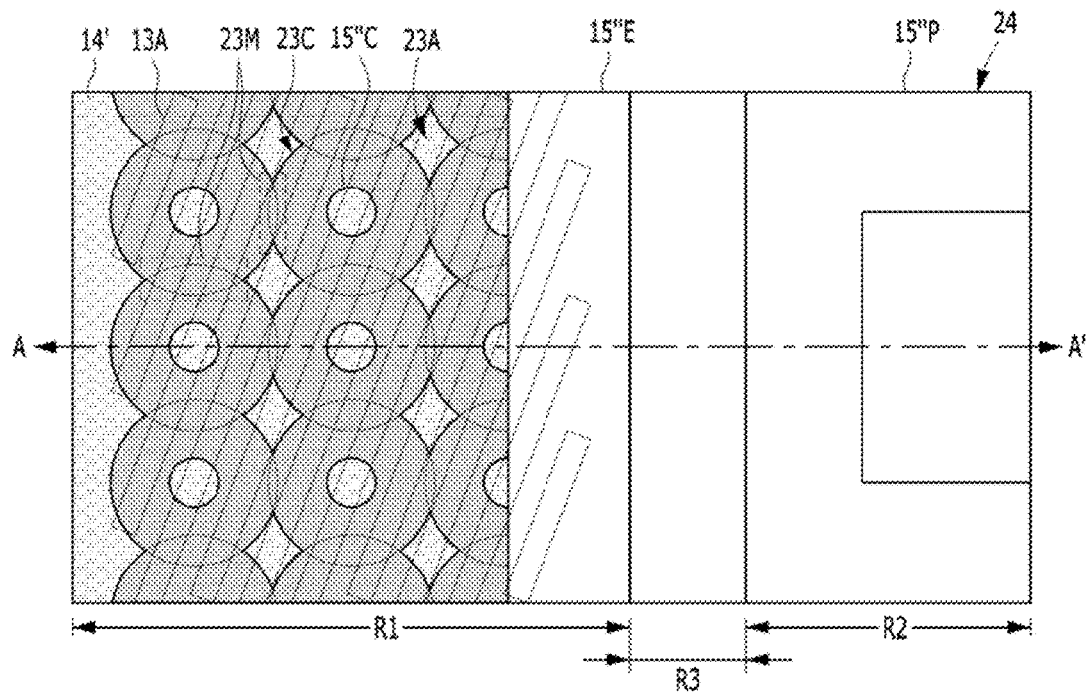
Figure 6D:
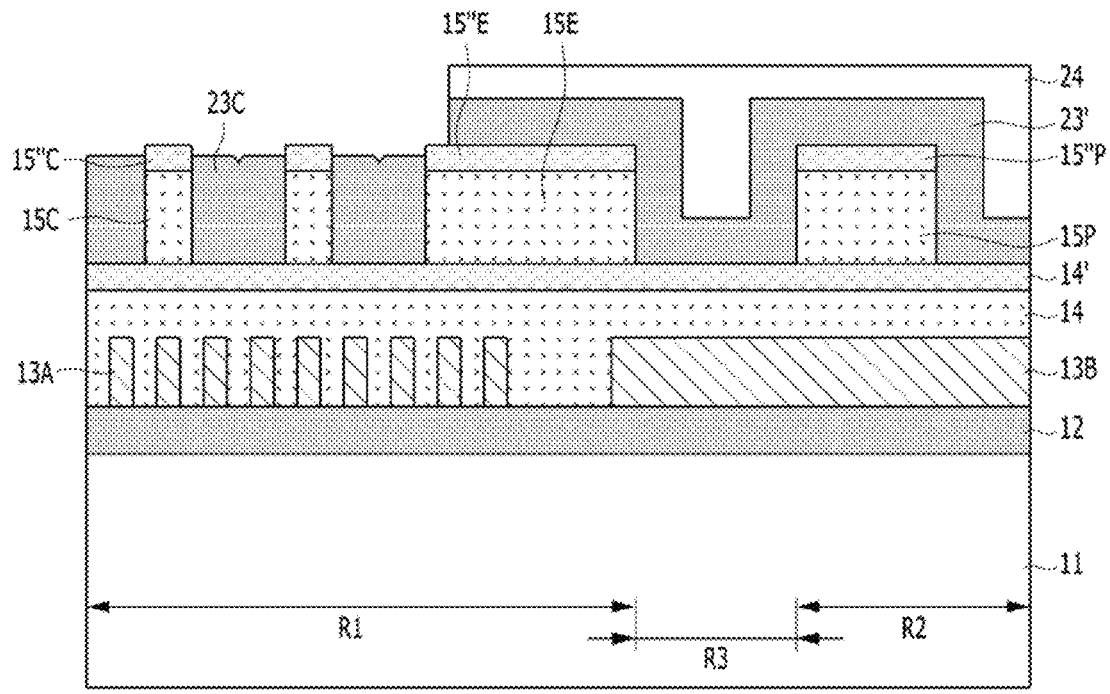

As shown in FIGS. 5D and 6D, a plurality of first spacers 23C may be formed. The spacer layer 23 may be anisotropically etched to form the first spacers 23C on the sidewalls of the pillars 15C. By the first spacers 23C, interstitial spaces 23A may be defined laterally outward of the pillars 15C. The top surface of first silicon oxynitride (SiON) 14' may be exposed by the interstitial spaces 23A. A spacer layer 23' may remain in the second region R2, the third region R3 and the edge region of the first region R1.

When viewed from the top, the first spacers 23C may have a doughnut shape. The plurality of first spacers 23C may contact one another and have merged portions 23M. The plurality of first spacers 23C may have non-contacting portions. The interstitial spaces 23A may be defined by the non-contacting portions of the plurality of first spacers 23C. Hereinafter, the interstitial spaces 23A will be referred to as 'first pre-openings 23A'.

Figure 5E:
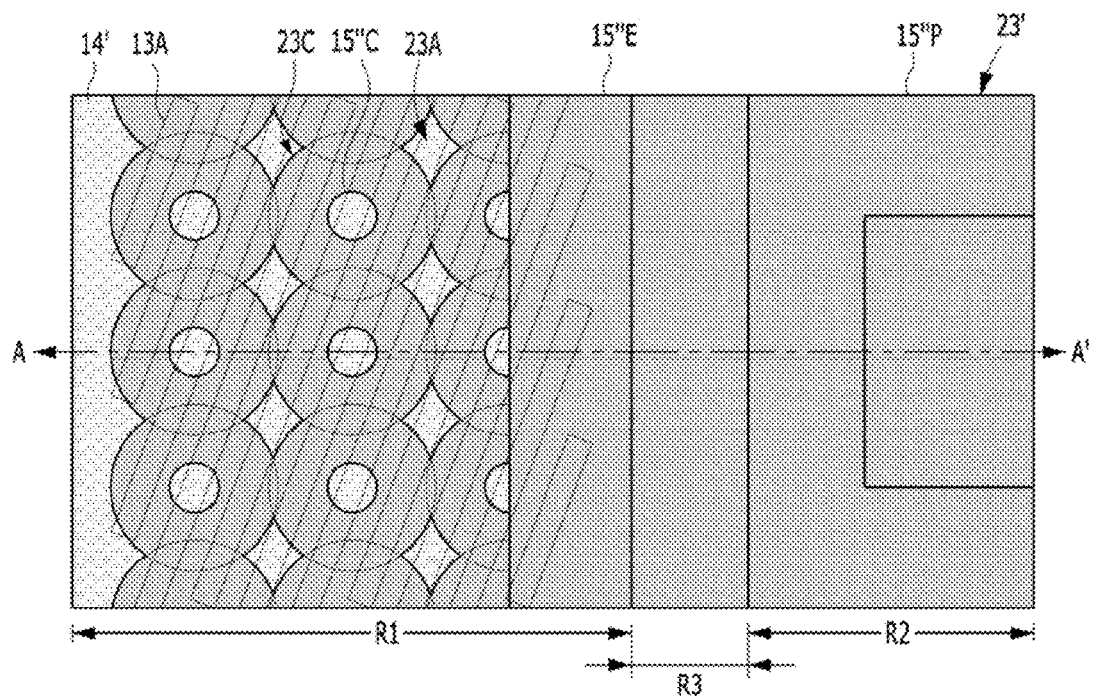
Figure 6E:
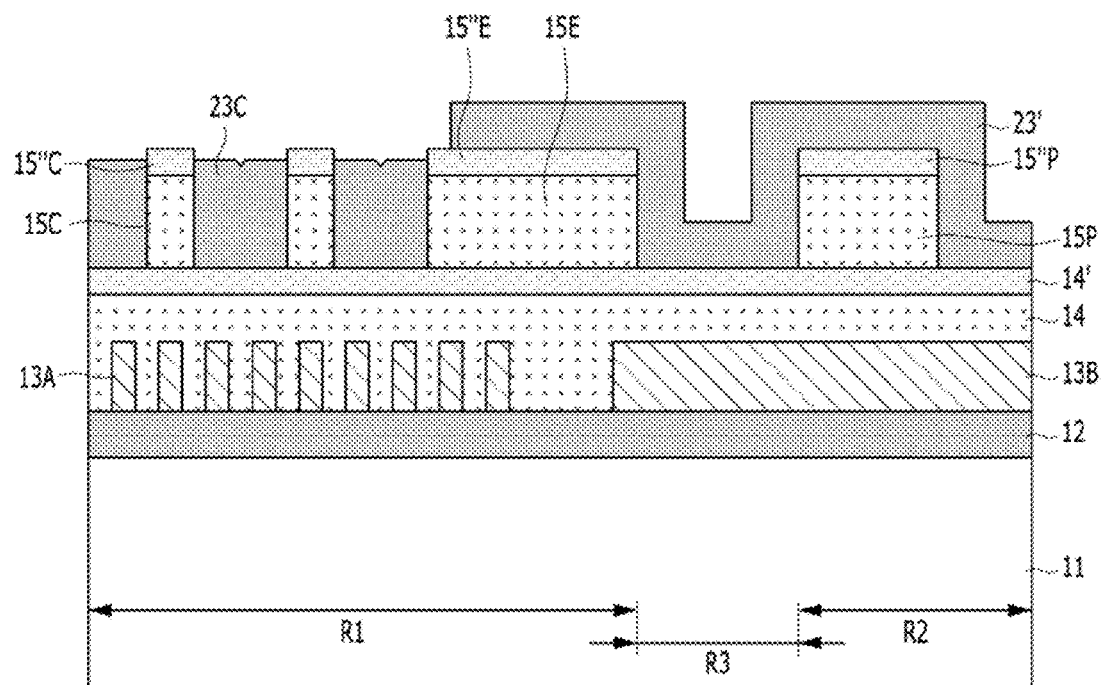

As shown in FIGS. 5E and 6E, the blocking mask pattern 24 is removed. Accordingly, the first spacers 23C remain in the first region R1, and the spacer layer 23' may remain in the second region R2 and the third region R3. The spacer layer 23' may also remain in the edge region of the first region R1.

Figure 5F:
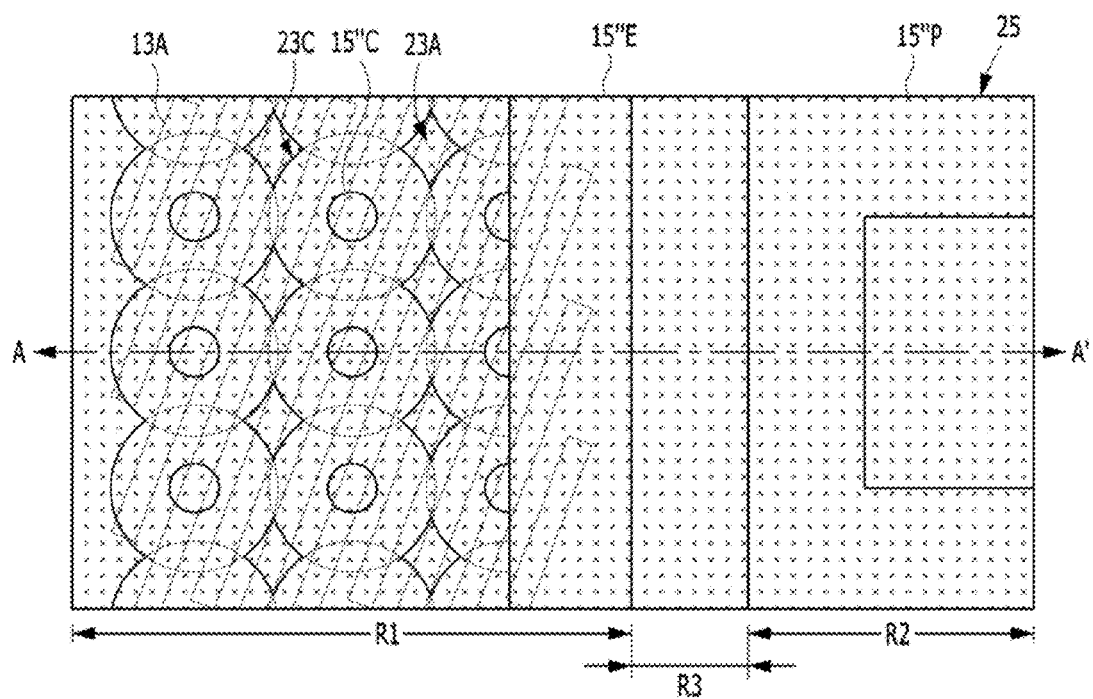
Figure 6F:
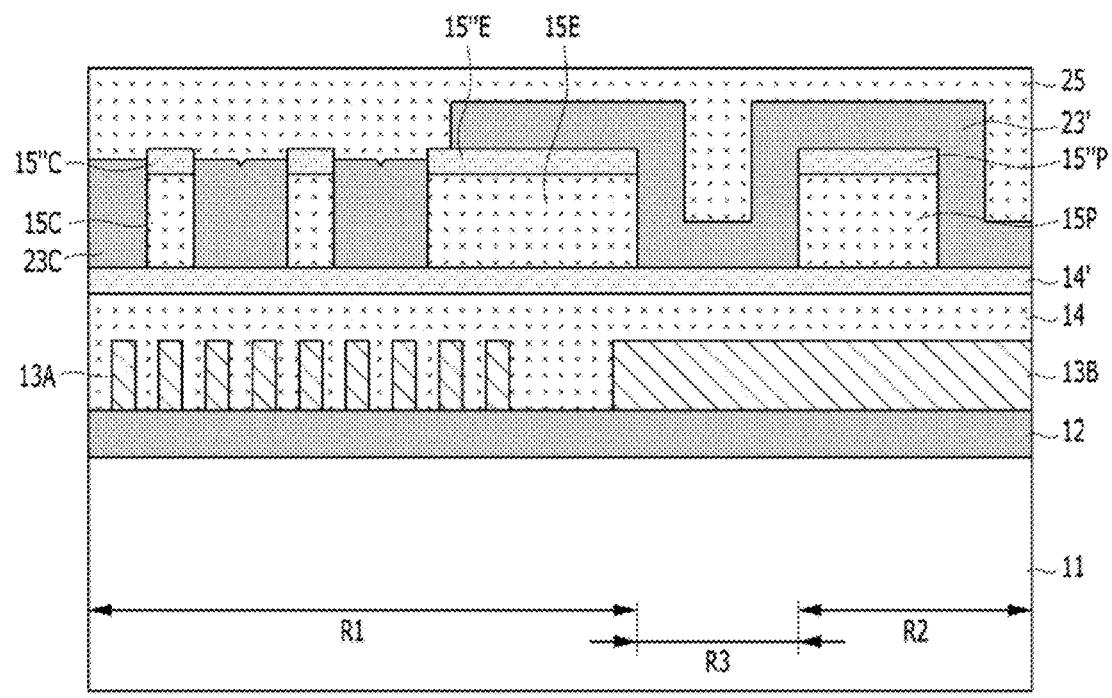

As shown in FIGS. 5F and 6F, a third carbon layer 25 is formed. The third carbon layer 25 may be formed over all the first region R1, the second region R2 and the third region R3. Since the third carbon layer 25 may be formed of spin-on-carbon, planarization may be improved.

Figure 5G:
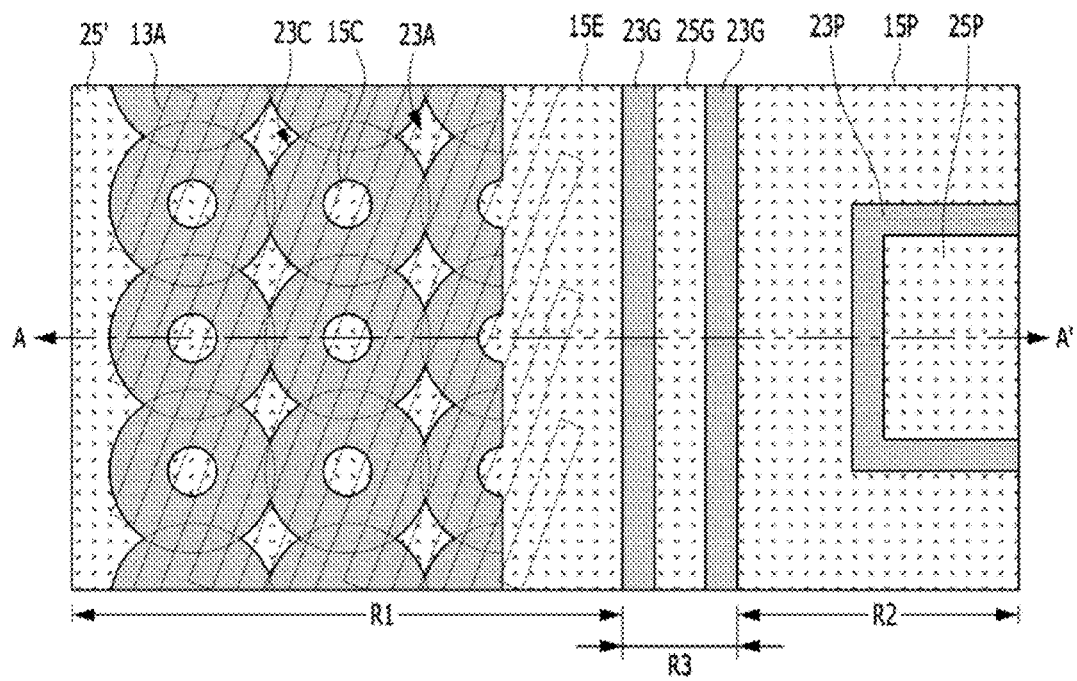
Figure 6G:
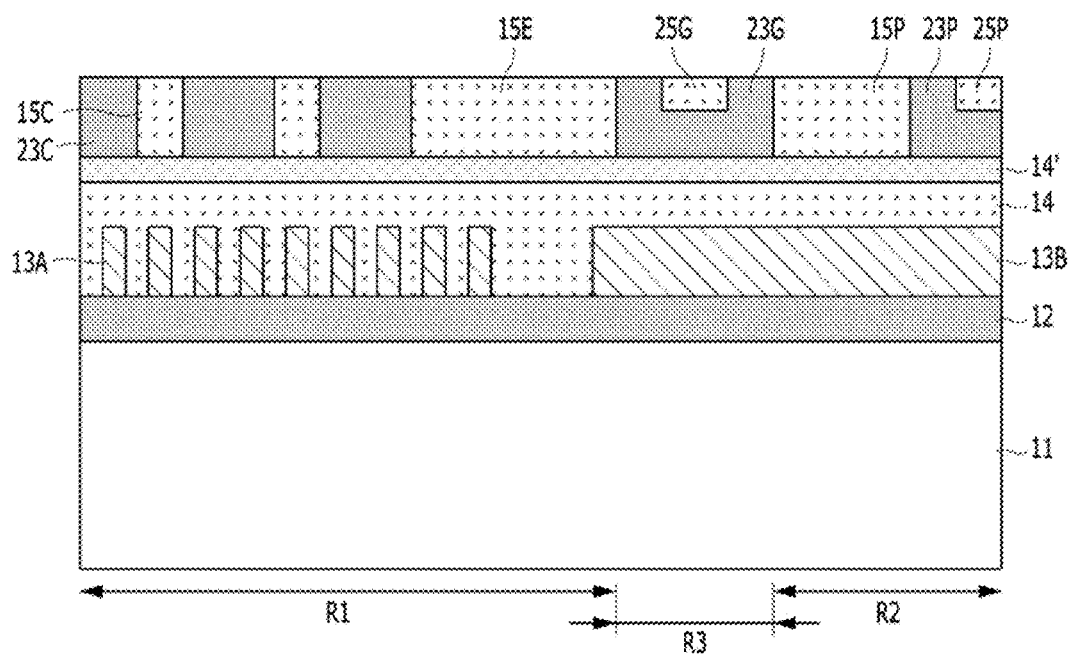

As shown in FIGS. 5G and 6G, the third carbon layer 25 may be planarized. The planarization of the third carbon layer 25 may be performed until the top surfaces of the pillars 15C are exposed. Accordingly, the second silicon oxynitride patterns 15"C, 15"E and 15"P may be removed. Further, after the spacer layer 23' is planarized, a second spacer 23P and a third spacer 23G may be formed. The second spacer 23P may be formed in the second region R2, and the third spacer 23G may be formed in the third region R3. The planarization of the third carbon layer 25 and the spacer layer 23' may be performed by an etch-back process.

After the third carbon layer 25 is planarized, third carbon layer patterns 25P and 25G may be formed in the second region R2 and the third region R3. The third carbon layer patterns 25P and 25G may be positioned on the second spacer 23P and the third spacer 23G, respectively. The second spacer 23P and the third spacer 23G may have a U shape. Accordingly, the bottom surfaces and side surfaces of the third carbon layer patterns 25P and 25G may contact the second spacer 23P and the third spacer 23G, respectively. A third carbon layer 25' may remain in the first region R1. The third carbon layer 25' may fill the first pre-openings 23A, and may remain on the first silicon oxynitride 14'.

Figure 5H:
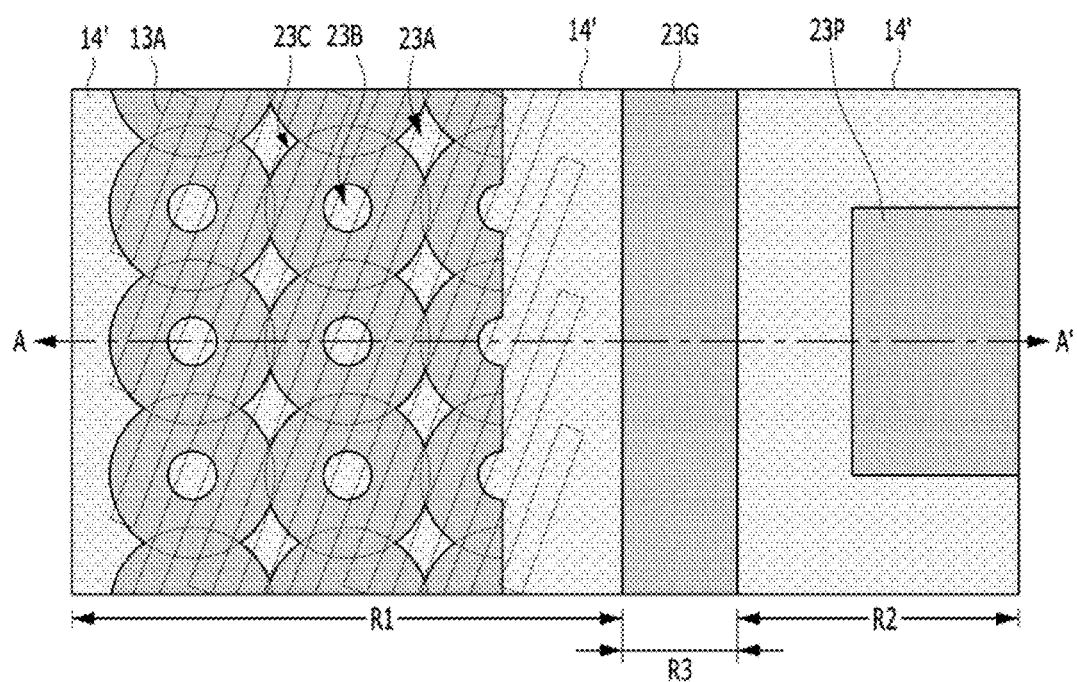
Figure 6H:
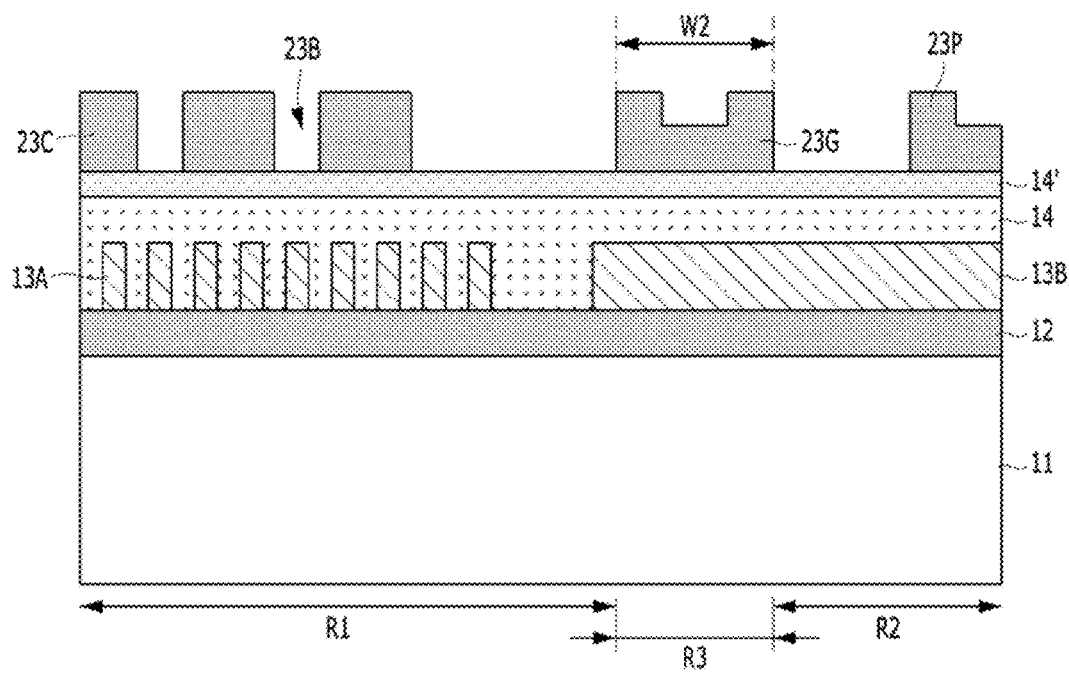

As shown in FIGS. 5H and 6H, the third carbon layer 25', the third carbon layer patterns 25P and 25G, the pillars 15C, the edge sacrificial pad pattern 15E and the sacrificial pad pattern 15P may be removed.

Accordingly, the first spacers 23C may remain in the first region R1. The second spacer 23P may remain in the second region R2. The third spacer 23G may remain in the third region R3. The first pre-openings 23A and second pre-openings 23B may be defined by the first spacers 23C. The second pre-openings 23B are spaces from which the pillars 15C are removed, and the first pre-openings 23A are spaces which are formed laterally outward of the first spacers 23C.

The sizes of the first pre-openings 23A and the second pre-openings 23B may be controlled by the thickness of the first spacers 23C. The first pre-openings 23A and the second pre-openings 23B may be arranged to overlap with the line patterns 13A. The first pre-openings 23A and the second pre-openings 23B may have the same sizes as the first pre-openings 19A and the second pre-openings 19B according to the first embodiment.

The third spacer 23G has a critical dimension (CD) greater than the second spacer 18G (see FIG. 4I) of the first embodiment. For example, a critical dimension W2 of the third spacer 23G of the second embodiment may be approximately two times greater than a critical dimension W1 of the second spacer 18G of the first embodiment.

The second spacer 23P and the third spacer 23G may be referred to as a second reverse spacer and a third reverse spacer, respectively. This is because they are formed by, for example, not etching the spacer layer but planarization of the third carbon layer 25. As a result, during the planarization process of the third carbon layer 25, the second reverse spacer 23P and the third reverse spacer 23G may be formed in the second region R2 and the third region R3, respectively.

Figure 5I:
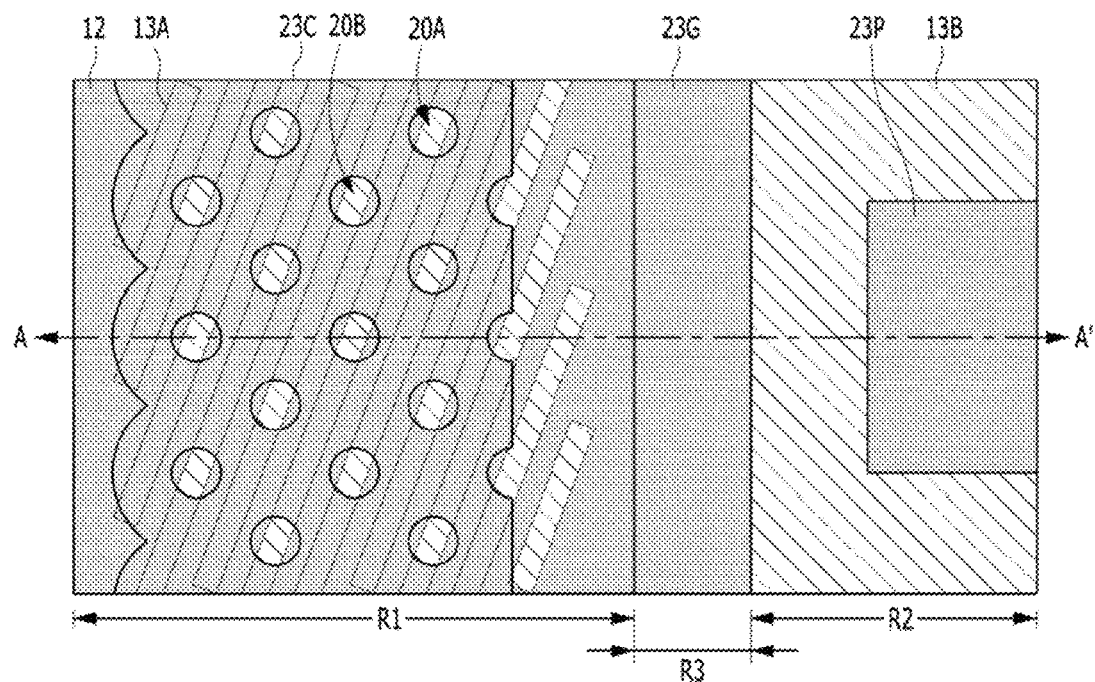
Figure 6I:
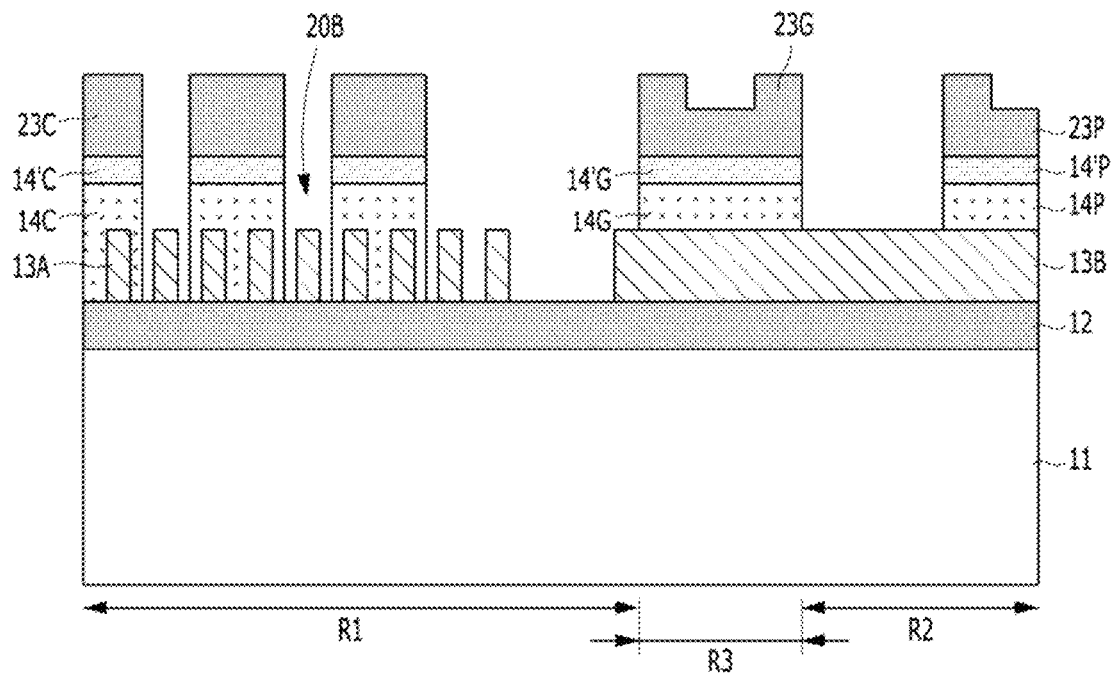

As shown in FIGS. 5I and 6I, the middle layer ML may be etched. The middle layer ML may be etched by dry etching such as plasma etching. For example, the first silicon oxynitride 14' and a first carbon layer 14 may be etched using the first spacers 23C, the second spacer 23P and the third spacer 23G as an etch mask. Accordingly, middle layer patterns 14C, 14P and 14G may be formed. The middle layer patterns 14C, 14P and 14G may include a first middle layer pattern 14C, a second middle layer pattern 14P, and a third middle layer pattern 14G. The first middle layer pattern 14C may be formed over the first region R1, the second middle layer pattern 14P may be formed over the second region R2, and the third middle layer pattern 14G may be formed over the third region R3. First silicon oxynitride patterns 14'C, 14'P and 14'G may remain on the first middle layer pattern 14C, the second middle layer pattern 14P and the third middle layer pattern 14G, respectively.

The top surfaces of some of the line patterns 13A may be exposed by the first middle layer pattern 14C. The first middle layer pattern 14C may serve as a cutting mask pattern. When viewed from the top, the first middle layer pattern 14C may have the same shape as the shapes of the first spacers 23C.

First openings 20A and second openings 20B may be formed in the first middle layer pattern 14C. The first openings 20A may be formed from the first pre-openings 23A of the first spacers 23C. The second openings 20B may be formed from the second pre-openings 23B of the first spacers 23C. The first openings 20A and the second openings 20B may have a circular shape. Since the middle layer ML is plasma-etched, the first openings 20A may have a circular shape due to an etch loading effect. In other words, by plasma-etching the middle layer ML using the first pre-openings 23A which have a rhombus shape, the first openings 20A may be formed to have a circular shape. Both the first openings 20A and the second openings 20B may have a circular shape.

When viewed from the top, the second middle layer pattern 14P may have the same shape as the shape of the second spacer 23P, and the third middle layer pattern 14G may have the same shape as the shape of the third spacer 23G.

Figure 5J:
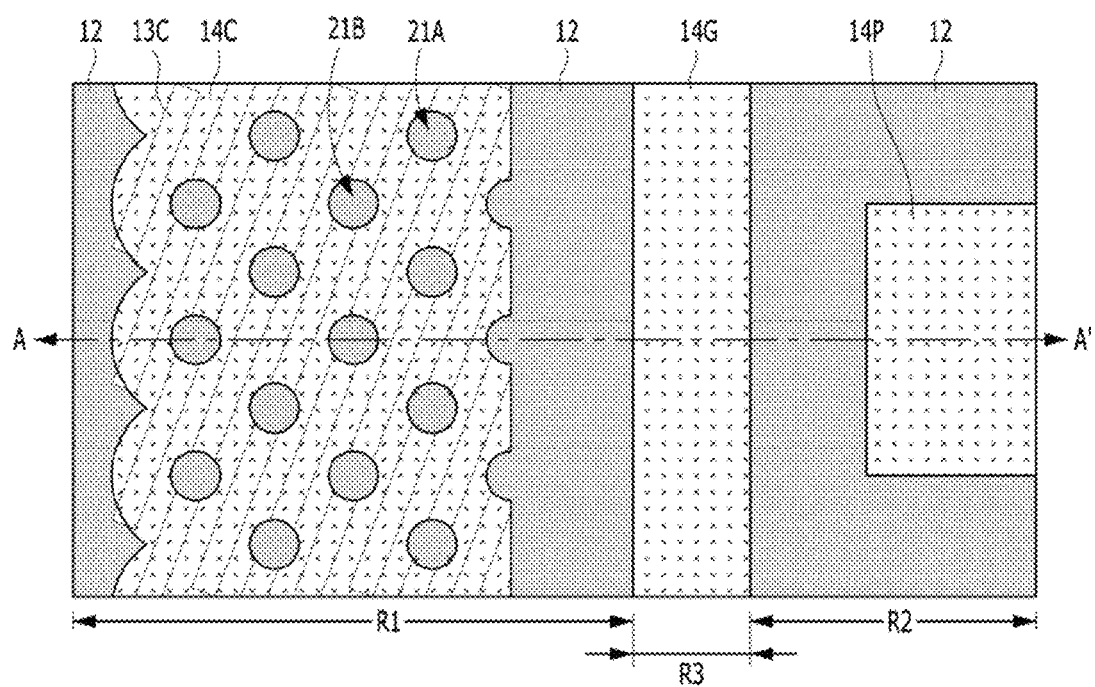
Figure 6J:
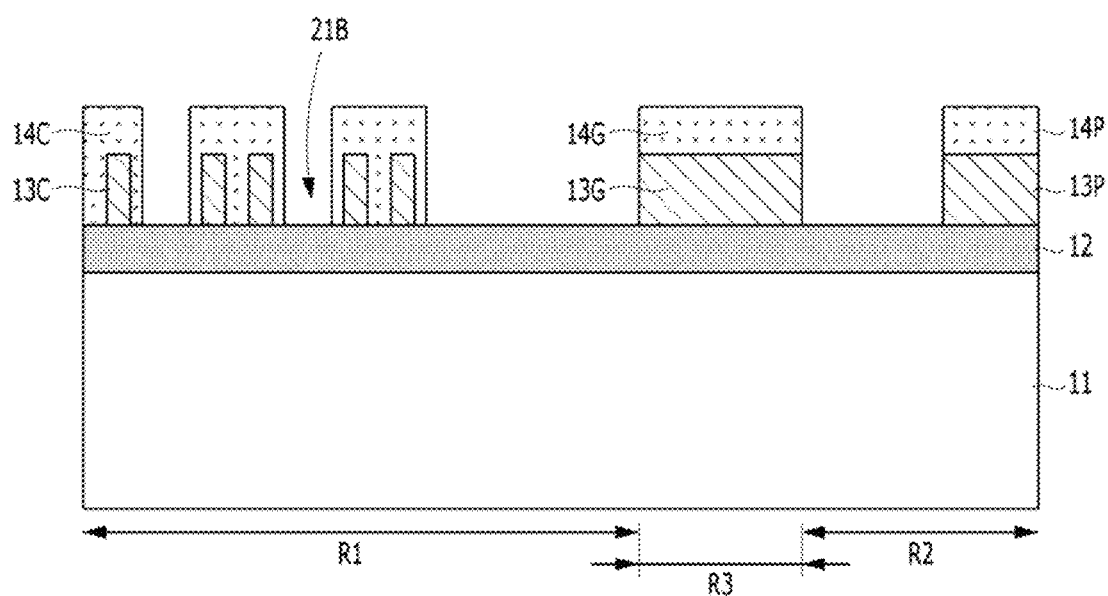

As shown in FIGS. 5J and 6J, the first spacers 23C, the second spacer 23P and the third spacer 23G may be removed. The first silicon oxynitride patterns 14'C, 14'P and 14'G may be removed.

The line patterns 13A and the pre-pad pattern 13B may be etched. For example, the line patterns 13A and the pre-pad pattern 13B are etched using the first to third middle layer patterns 14C, 14P and 14G as an etch mask. The line patterns 13A are cut through the first openings 20A and the second openings 20B.

By the cutting process, the line patterns 13A may be separated. For example, one line pattern 13A is separated into a plurality of cut patterns 13C. The cut patterns 13C may have an isolated island shape. The cut patterns 13C may have an island shape which has a minor axis and a major axis. The cut patterns 13C which are adjacent in the direction of the major axis may be separated from one another by first separation holes 21A and second separation holes 21B. The cut patterns 13C which are adjacent in the direction of the minor axis may be separated from one another by spaces between the line patterns 13A.

The plurality of cut patterns 13C may be formed over the first region R1. The first and second separation holes 21A and 21B are alternatively disposed along the major axis of the cut patterns 13C. A pad pattern 13P is formed over the second region R2, and a guard pattern 13G is formed over the third region R3. When viewed from the top, the pad pattern 13P may have the same shape as the shape of the second middle layer pattern 14P, and the guard pattern 13G may have the same shape as the shape of the third middle layer pattern 14G. The cut patterns 13C, the pad pattern 13P and the guard pattern 13G may include polysilicon.

In this way, the plurality of cut patterns 13C, which are separated by the first and second separation holes 21A and 21B, may be formed over the first region R1, and at the same time, the pad pattern 13P may be formed over the second region R2. The cut patterns 13C may be positioned over the first region R1, the pad pattern 13P may be positioned over the second region R2, and the guard pattern 13G may be positioned over the third region R3.

Figure 5K:
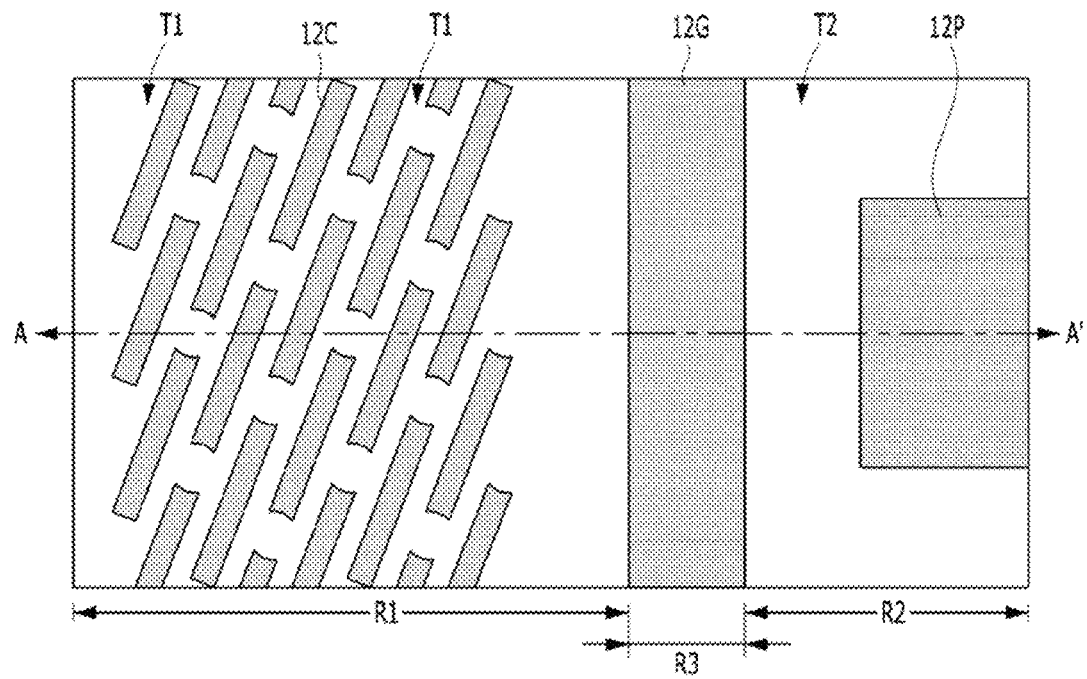
Figure 6K:
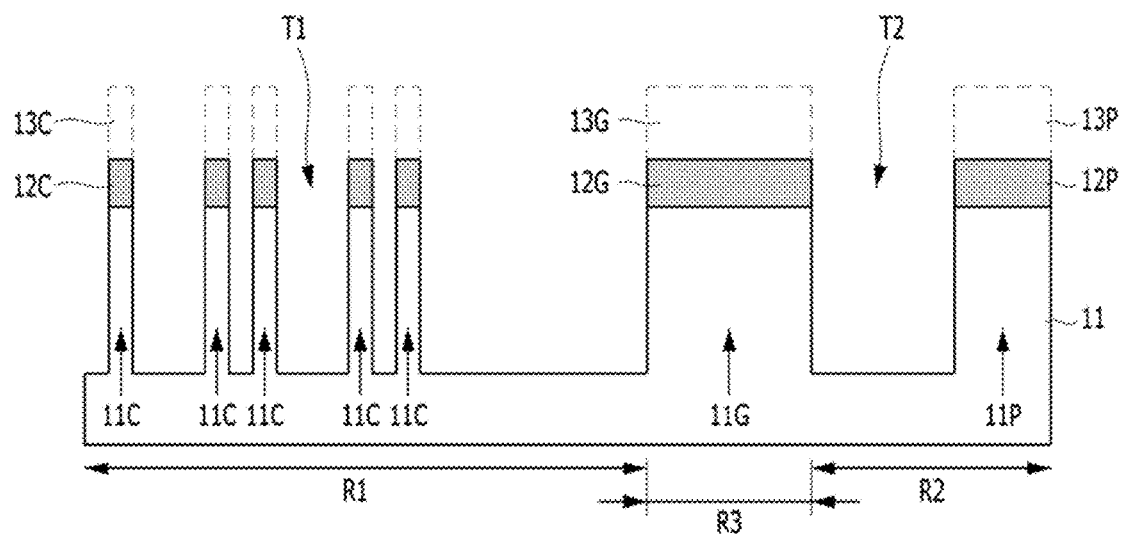

As shown in FIGS. 5K and 6K, the first to third middle layer patterns 14C, 14P and 14G may be removed.

According to the series of processes described above, in the embodiment, the cut patterns 13C, the pad pattern 13P and the guard pattern 13G may be simultaneously formed.

The buffer layer 12 is etched using the cut patterns 13C, the pad pattern 13P and the guard pattern 13G as an etch mask. After the buffer layer 12 is etched, buffer layer patterns 12C, 12P and 12G are formed. For example, first buffer layer patterns 12C, a second buffer layer pattern 12P and a third buffer layer pattern 12G may be formed. When viewed from the top, the first to third buffer layer patterns 12C, 12P and 12G may have the same shapes as the cut patterns 13C, the pad pattern 13P and the guard pattern 13G, respectively.

In succession, the substrate 11 may be etched. While etching the substrate 11, the cut patterns 13C, the pad pattern 13P and the guard pattern 13G may be consumed and removed. Accordingly, the first to third buffer layer patterns 12C, 12P and 12G may be used as an etch mask for etching the substrate 11.

In this way, after the substrate 11 is etched, a plurality of active regions 11C, 11P and 11G are formed in the substrate 11. For example, a plurality of first patterns 11C may be formed in the first region R1, and a second pattern 11P may be formed in the second region R2. Moreover, a third pattern 11G may be formed in the third region R3. The plurality of first patterns 11C may be defined by first trenches T1. The second pattern 11P may be defined by a second trench T2. The third pattern 11G may be defined between the first trenches T1 and the second trench T2. The first patterns 11C may be referred to as first active regions 11C, and the second pattern 11P may be referred to as a second active region 11P. The third pattern 11G may be referred to as a guard region 11G.

Figure 5L:
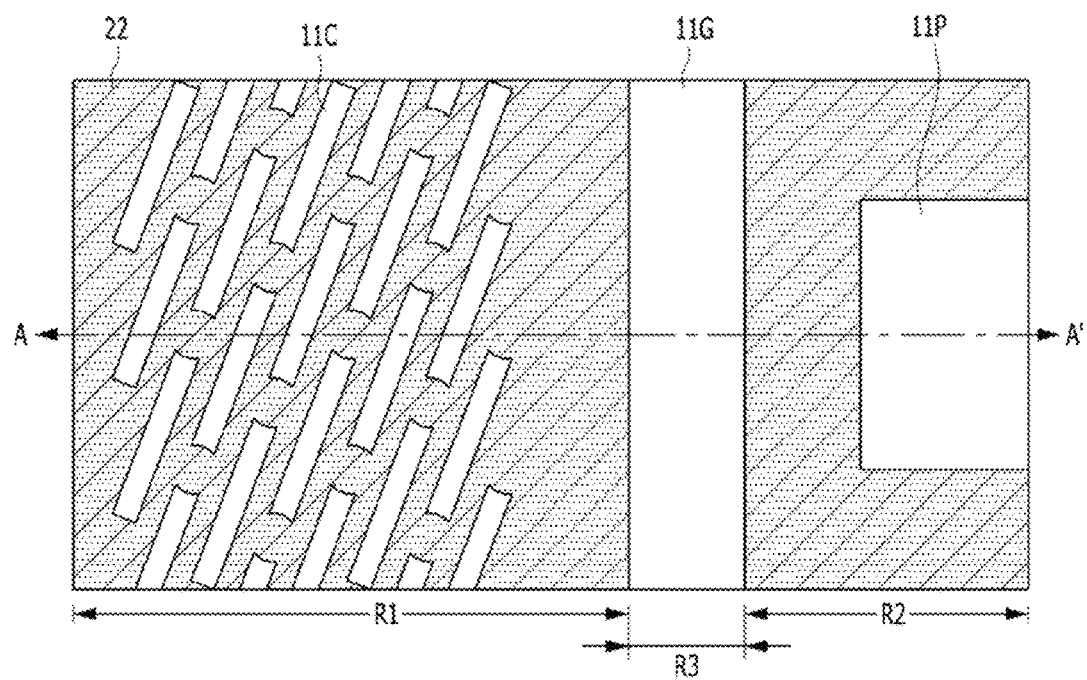
Figure 6L:
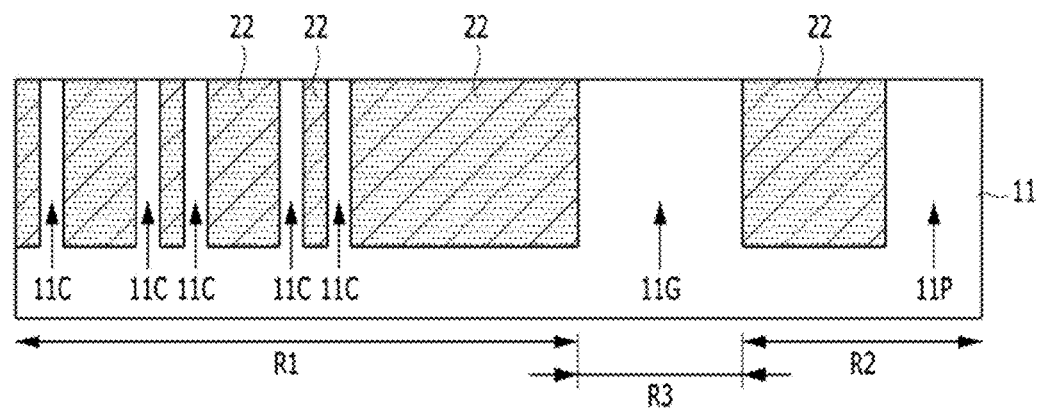

As shown in FIGS. 5L and 6L, the first to third buffer layer patterns 12C, 12P and 12G may be removed.

A dielectric material is formed to fill the first trenches T1 and the second trench T2. Accordingly, an isolation layer 22 may be formed. The isolation layer 22 may be formed of silicon nitride, silicon oxide or a combination thereof.

By the isolation layer 22, the plurality of first patterns 11C, the second pattern 11P and the third pattern 11G may be separated from one another.

According to the second embodiment, etch masks for forming the first patterns 11C, the second pattern 11P and the third pattern 11G in the first region R1, the second region R2 and the third region R3, respectively, may be simultaneously formed. Namely, the cut patterns 13C, the pad pattern 13P and the guard pattern 13G may be simultaneously formed.

Further, in the second embodiment, a cutting mask for cutting the line patterns 13A is not separately needed. In particular, it is not necessary to perform a hole double patterning technology to cut the line patterns 13A. Accordingly, the number of immersion masks for cutting the line patterns 13A may be decreased, and costs may be saved.

In addition, in the second embodiment, by increasing the critical dimension of the third spacer 23G, the third spacer 23G may be stably formed without collapsing. Accordingly, the size of the third pattern 11G for protecting the first patterns 11C may be increased.

FIGS. 7A to 7J are plan views explaining a method of fabricating a semiconductor device in accordance with a third embodiment. FIGS. 8A to 8J are cross-sectional views taken along the lines A-A' of FIGS. 7A to 7J. In the third embodiment, for processes until a middle layer is formed, reference may be made to the first embodiment. The third embodiment explains a method of fabricating a semiconductor device capable of omitting an open mask. Also, the third embodiment explains a method of fabricating a semiconductor device where a guard region does not exist.

Figure 7A:
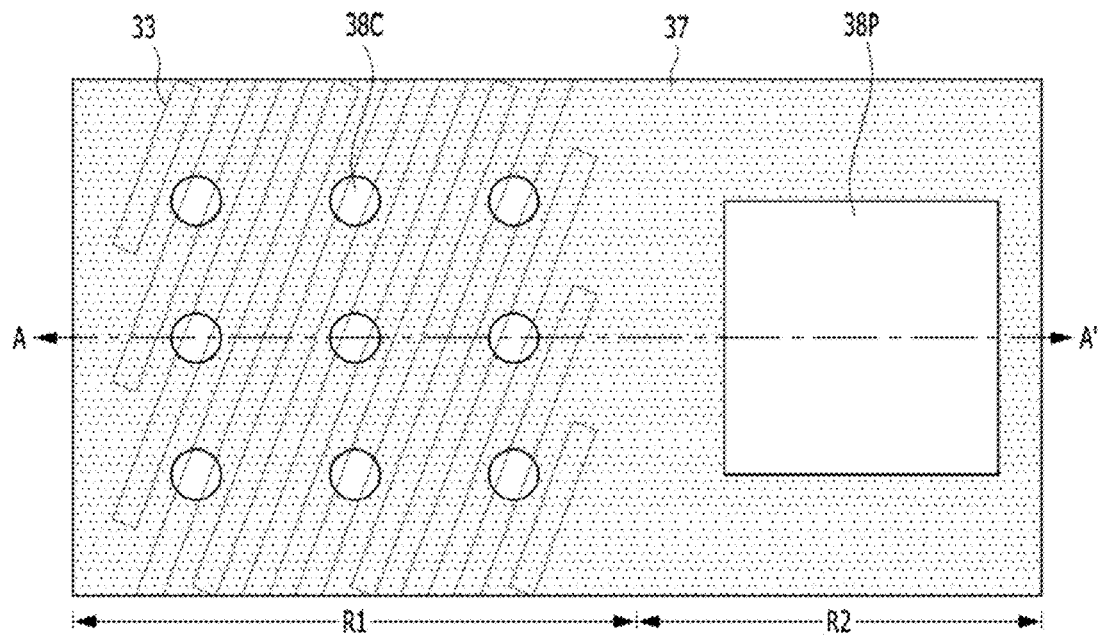
FIGS. 7A to 7J are plan views explaining a method of fabricating a semiconductor device in accordance with a third embodiment.
Figure 8A:
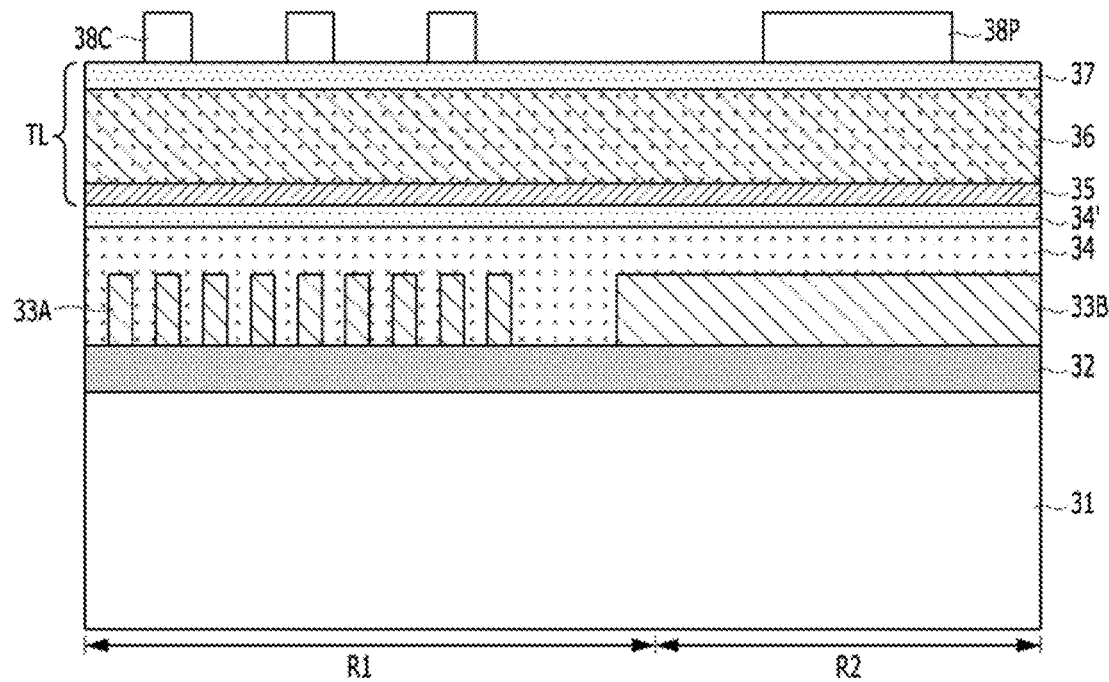
FIGS. 8A to 8J are cross-sectional views taken along the lines A-A' of FIGS. 7A to 7J.

As shown in FIGS. 7A and 8A, a buffer layer 32 may be formed on an etch target layer, that is, a substrate 31. The buffer layer 32 may include silicon oxide. Line patterns 33A and a pre-pad pattern 33B may be formed on the buffer layer 32. In the same manner as the first embodiment, the line patterns 33A may be formed by an SPT process. The buffer layer 32, the line patterns 33A and the pre-pad pattern 33B may serve as a bottom layer. A middle layer may be formed on the line patterns 33A and the pre-pad pattern 33B. The substrate 31 may be defined by a first region R1 and a second region R2. A first carbon layer 34 and first silicon oxynitride (SiON) 34' may be stacked to form the middle layer. The first carbon layer 34 may be formed of spin-on-carbon (SOC) to improve planarization.

A top layer TL may be formed on the middle layer. A part of the top layer TL may be formed of a material which has an etch selectivity to the middle layer. The top layer TL may have a stacked structure of a plurality of layers. The top layer TL may be formed by stacking an etch stop layer 35, a second carbon layer 36 and second silicon oxynitride 37. The etch stop layer 35 may include silicon nitride. The second carbon layer 36 may include an amorphous carbon layer. The second carbon layer 36, as a material which is to be formed as pillars in a subsequent process, may be referred to as a mold layer. The second silicon oxynitride 37 may be referred to as a protective layer.

A plurality of sacrificial pillars 38C may be formed on the top layer TL of the first region R1. A sacrificial mask pattern 38P may be formed on the top layer TL of the second region R2. The sacrificial pillars 38C and the sacrificial mask pattern 38P may be formed at the same level or height from the substrate 31. The sacrificial pillars 38C and the sacrificial mask pattern 38P may include a material which has an etch selectivity to the top layer TL. The sacrificial pillars 38C and the sacrificial mask pattern 38P may be formed of the same material. For example, the sacrificial pillars 38C and the sacrificial mask pattern 38P may include photoresist patterns. The top surface of the top layer TL may be exposed by the sacrificial pillars 38C and the sacrificial mask pattern 38P. The plurality of sacrificial pillars 38C may be arranged two-dimensionally along columns and rows in the first region R1 when viewed from the top. The rows may be parallel to a first direction, and the columns may be parallel to a second direction. The second direction may cross with the first direction. According to an embodiment, the rows may be parallel to an x-axis, and the columns may be parallel to a y-axis. According to an embodiment, the rows may be parallel to a major axis of the substrate 31, and the columns may be parallel to a minor axis of the substrate 31.

Figure 7B:
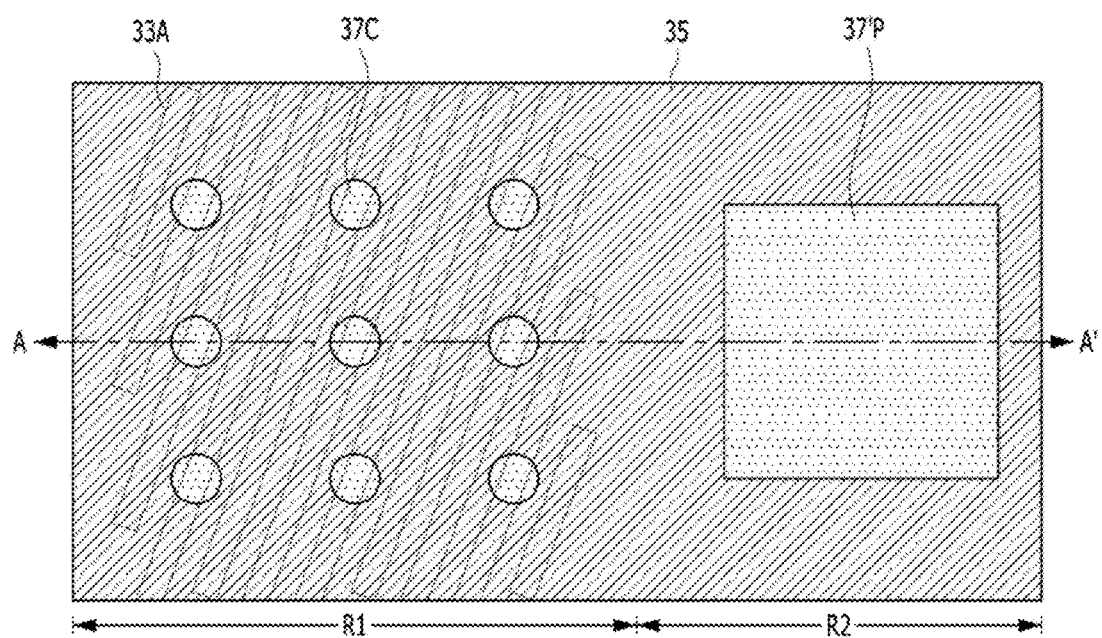
Figure 8B:
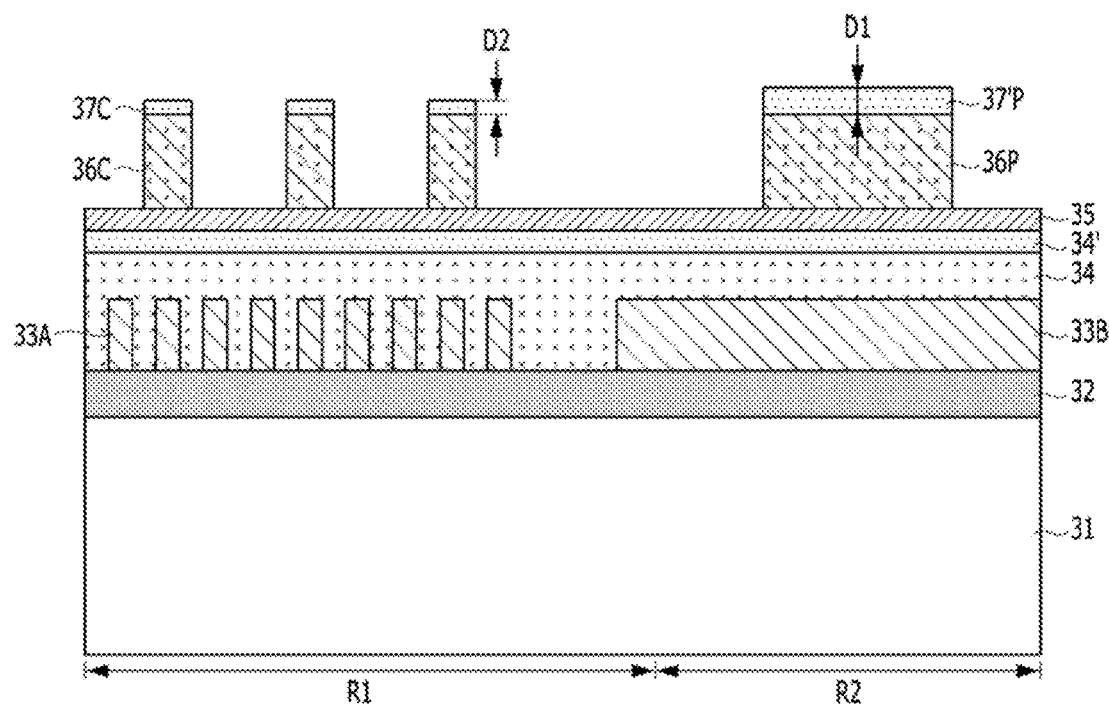

As shown in FIGS. 7B and 8B, the top layer TL may be etched partially. The second silicon oxynitride 37 is etched using the sacrificial pillars 38C and the sacrificial mask pattern 38P as an etch mask. In succession, the second carbon layer 36 is etched. While etching the second carbon layer 36, the sacrificial pillars 38C and the sacrificial mask pattern 38P may be consumed and may not remain. After the second carbon layer 36 is etched, a plurality of pillars 36C and a sacrificial pad pattern 36P may be formed. The second carbon layer 36 may be etched until the top surface of the etch stop layer 35 is exposed. The pillars 36C and the sacrificial pad pattern 36P may be formed of amorphous carbon. The plurality of pillars 36C may be arranged two-dimensionally along columns and rows in the first region R1 when viewed from the top. The rows may be parallel to the first direction, and the columns may be parallel to the second direction. The second direction may be a direction crossing with the first direction. According to an embodiment, the rows may be parallel to the x-axis, and the columns may be parallel to the y-axis.

The pillars 36C may be formed over the first region R1. The sacrificial pad pattern 36P may be formed over the second region R2. The sacrificial pad pattern 36P and the pillars 36C may be formed at the same level or height from the substrate 31.

Second silicon oxynitride patterns 37C and 37'P may remain on the pillars 36C and the sacrificial pad pattern 36P. The second silicon oxynitride patterns 37C may remain on the pillars 36C, and the second silicon oxynitride pattern 37'P may remain on the sacrificial pad pattern 36P. The thicknesses of the second silicon oxynitride patterns 37C and 37'P may be different from each other. For example, a thickness D1 of the second silicon oxynitride pattern 37'P on the sacrificial pad pattern 36P may be thicker than a thickness D2 of the silicon oxynitride patterns 37C on the pillars 36C. Such a thickness difference may be caused by an etch loading effect due to a difference in the line widths of the pillars 36C and the sacrificial pad pattern 36P. Hereinafter, the second silicon oxynitride patterns 37C will be referred to as sacrificial protective layer patterns 37C, and the second silicon oxynitride pattern 37'P will be referred to as a pre-protective layer pattern 37'P.

Figure 7C:
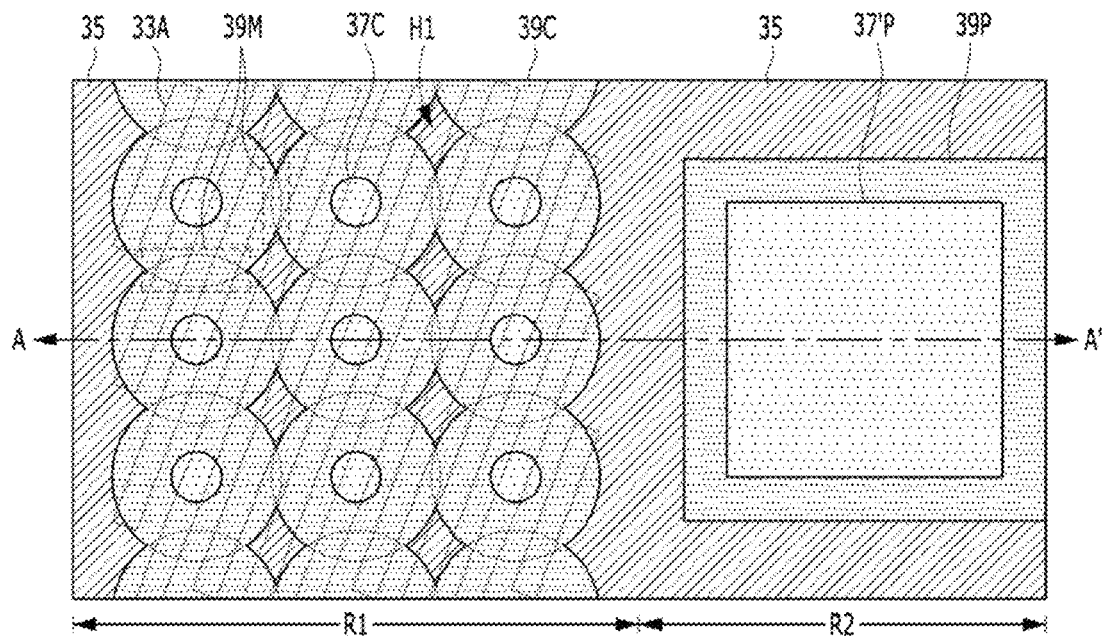
Figure 8C:
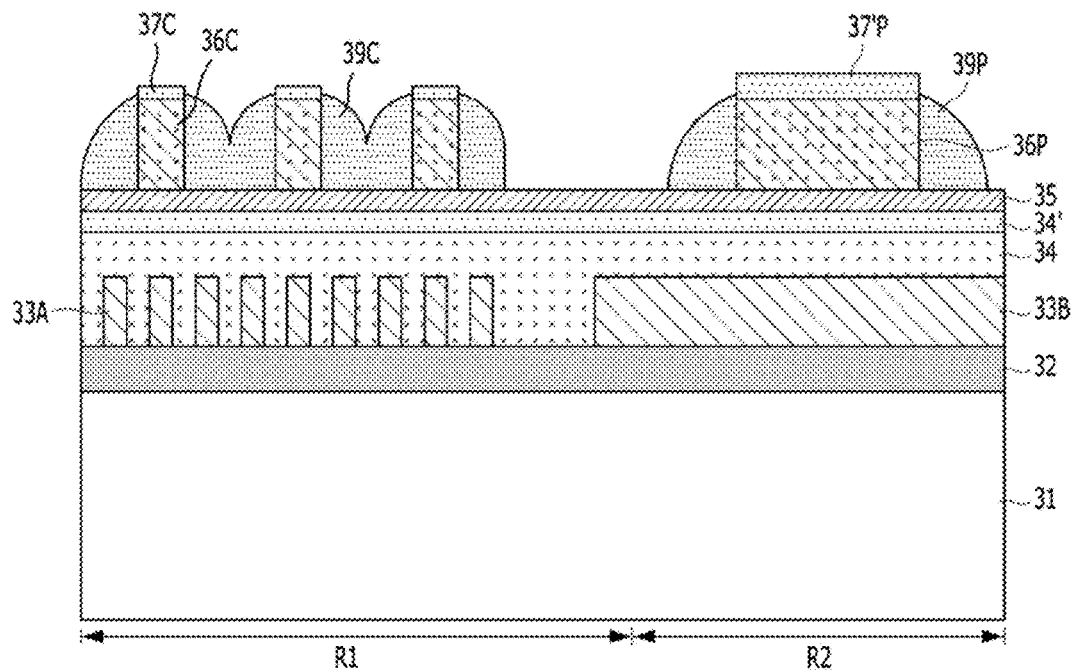

As shown in FIGS. 7C and 8C, a plurality of spacers 39C may be formed. Similarly to FIG. 4G, after forming a spacer layer (not shown), the spacer layer may be anisotropically etched to form the spacers 39C on the sidewalls of the pillars 36C. The top surface of the etch stop layer 35 may be exposed by first pre-openings H1. A barrier spacer 39P may be formed on the sidewalls of the sacrificial pad pattern 36P. The barrier spacer 39P may have a shape which surrounds the sidewalls of the sacrificial pad pattern 36P.

The spacers 39C may have a doughnut shape. The plurality of spacers 39C may contact one another and have merged portions 39M. The plurality of spacers 39C may have non-contacting portions. Interstitial spaces H1 may be defined by the non-contacting portions of the plurality of spacers 39C. Hereinafter, the interstitial spaces H1 will be referred to as the 'first pre-openings H1'.

Figure 7D:
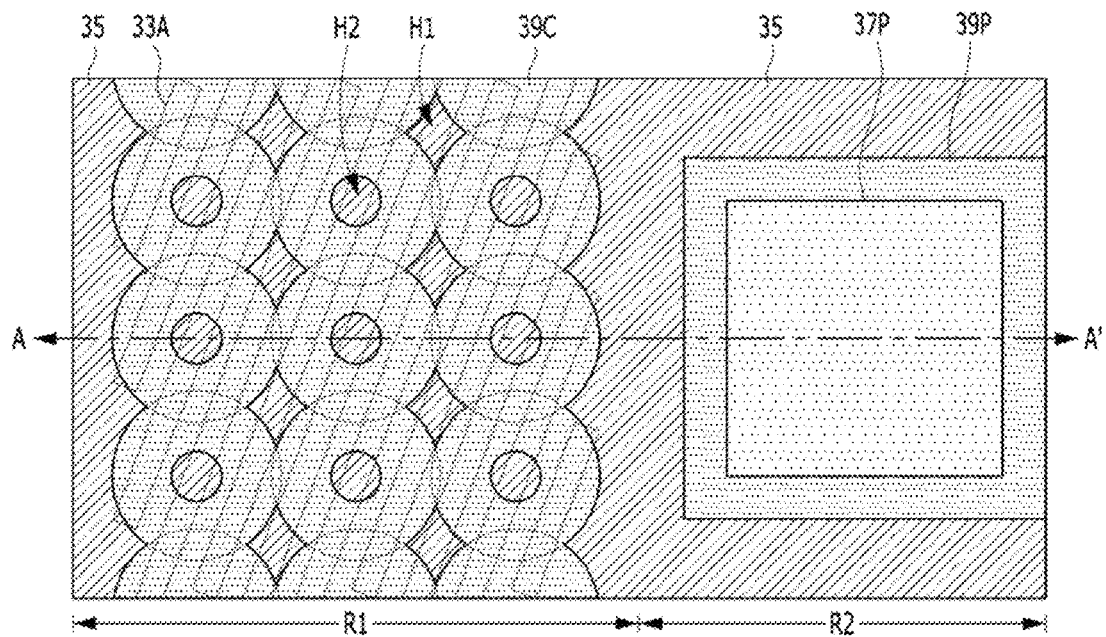
Figure 8D:
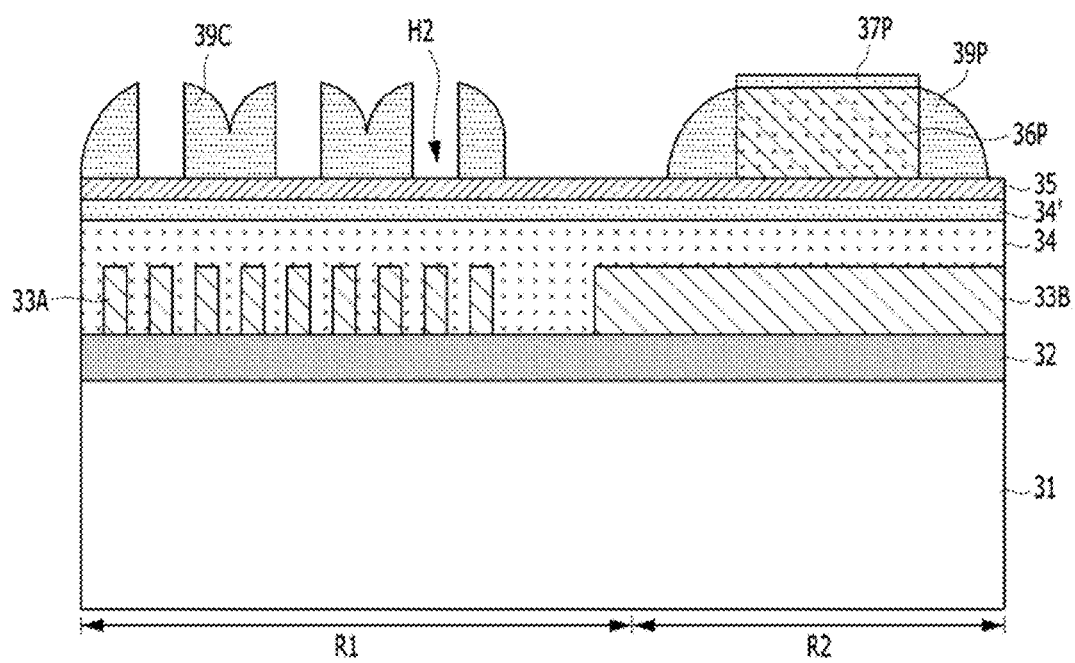

As shown in FIGS. 7D and 8D, the pillars 36C are removed. Accordingly, inner spaces H2 may be defined between the spacers 39C. Hereinafter, the inner spaces H2 will be referred to as 'second pre-openings H2'.

Before removing the pillars 36C, the sacrificial protective layer patterns 37C may be removed from the first region R1. The pre-protective layer pattern 37'P of the second region R2 may remain as a protective layer pattern 37P. This is because the thickness of the sacrificial protective layer patterns 37C is thinner than that of the protective layer pattern 37P, the protective layer pattern 37P may remain on the top surface of the sacrificial pad pattern 36P even though the sacrificial protective layer patterns 37C are completely removed.

In this way, while removing the pillars 36C, the sacrificial pad pattern 36P is protected by the protective layer pattern 37P. The barrier spacer 39P may still remain on the sidewalls of the sacrificial pad pattern 36P.

The spacers 39C are formed in the first region R1, and the first pre-openings H1 and the second pre-openings H2 may be defined by the spacers 39C. The second pre-openings H2 are spaces from which the pillars 36C are removed, and the first pre-openings H1 are spaces which are formed laterally outward of the spacers 39C.

In this way, the plurality of spacers 39C may be formed on the etch stop layer 35 of the first region R1. The spacers 39C may include the first pre-openings H1 and the second pre-openings H2. By the first pre-openings H1 and the second pre-openings H2, the top surface of the etch stop layer 35 may be partially exposed. A spacer coupling structure may be formed on the etch stop layer 35 of the second region R2. The spacer coupling structure may include the sacrificial pad pattern 36P, the protective layer pattern 37P and the barrier spacer 39P.

The sizes of the first pre-openings H1 and the second pre-openings H2 may be controlled by the thickness of the spacers 39C. The first pre-openings H1 and the second pre-openings H2 may be arranged to overlap with the line patterns 33A.

Figure 7E:
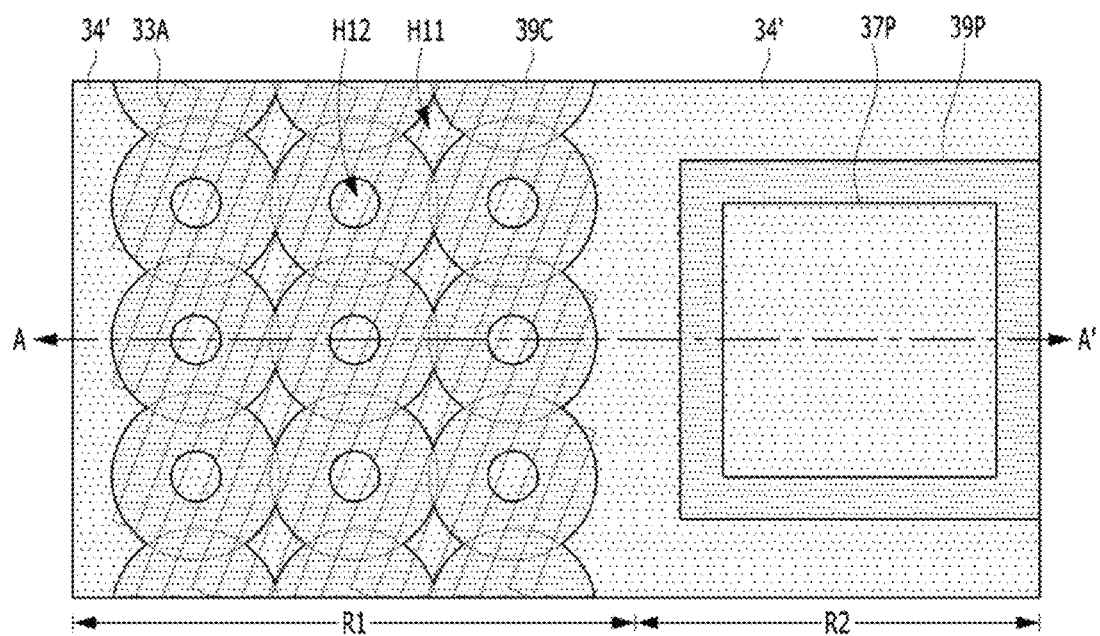
Figure 8E:
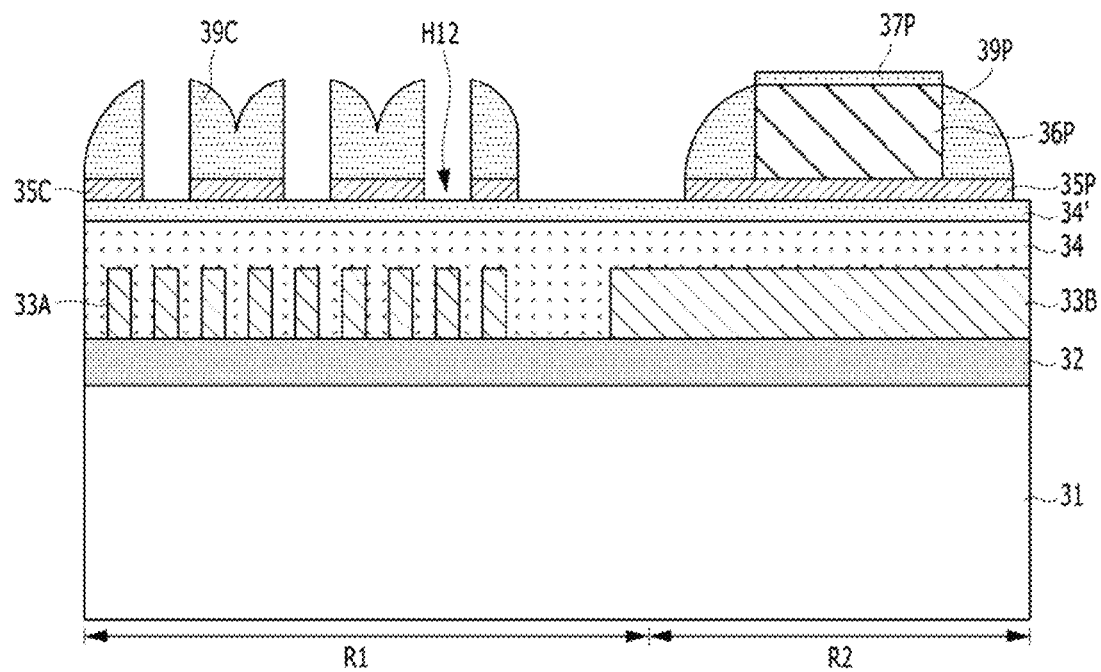

As shown in FIGS. 7E and 8E, the etch stop layer 35 may be etched. Accordingly, a plurality of etch stop layer patterns 35C and 35P may be formed. The etch stop layer 35 may be etched using the spacers 39C as an etch mask. Accordingly, a first etch stop layer pattern 35C may be formed below the spacers 39C. The etch stop layer 35 may be etched using the spacer coupling structure as an etch mask. Accordingly, a second etch stop layer pattern 35P may be formed below the spacer coupling structure.

When viewed from the top, the second etch stop layer pattern 35P may have the same shape as the shape of the spacer coupling structure, and the first etch stop layer pattern 35C may have the same shape as the shapes of the spacers 39C. Accordingly, the first etch stop layer pattern 35C may have first pre-openings H11 and second pre-openings H12. The first silicon oxynitride 34' may be exposed by the first etch stop layer pattern 35C and the second etch stop layer pattern 35P.

Figure 7F:
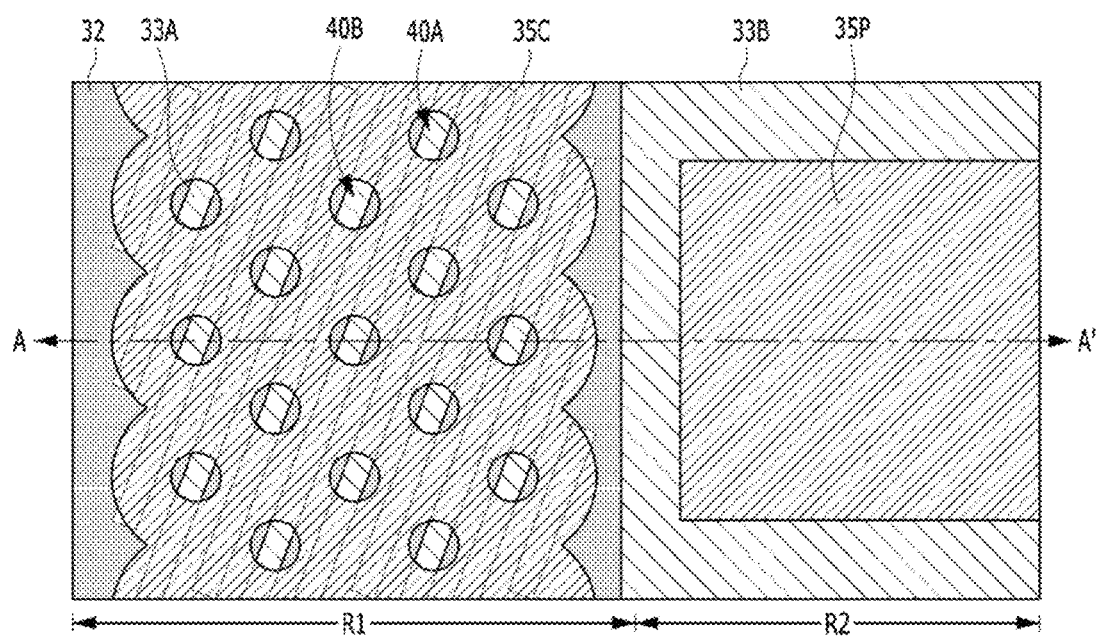
Figure 8F:
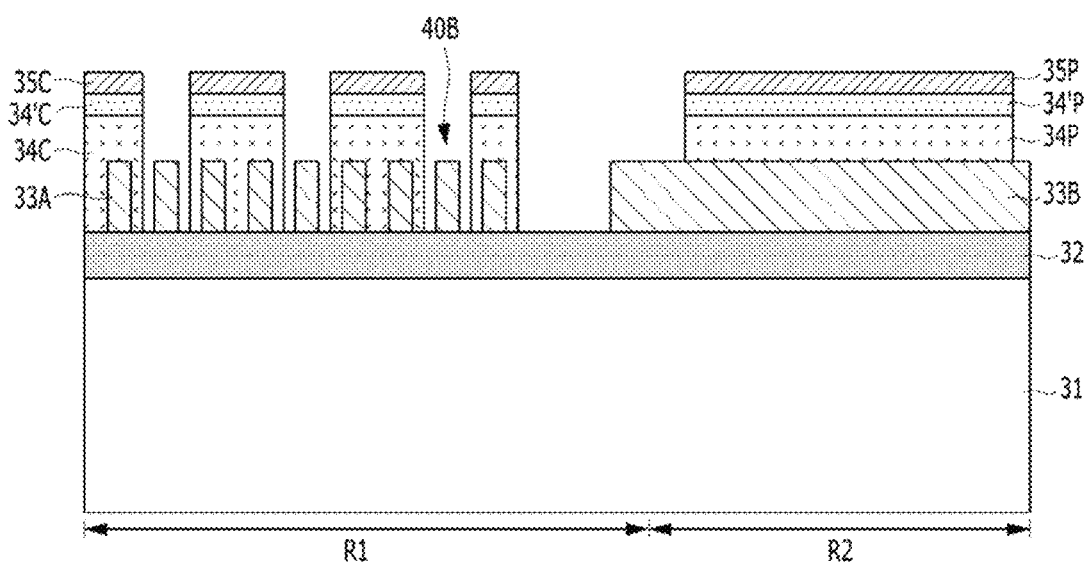

As shown in FIGS. 7F and 8F, the spacers 39C, the barrier spacer 39P, the sacrificial pad pattern 36P and the protective layer pattern 37P are removed.

Accordingly, the first etch stop layer pattern 35C and the second etch stop layer pattern 35P may remain. The first etch stop layer pattern 35C may remain in the first region R1, and the second etch stop layer pattern 35P may remain in the second region R2.

The middle layer may be etched. For example, the first silicon oxynitride 34' and the first carbon layer 34 may be etched. The middle layer may be etched by dry etching such as plasma etching. Accordingly, middle layer patterns 34C and 34P may be formed. The middle layer patterns 34C and 34P may include a first middle layer pattern 34C and a second middle layer pattern 34P. The first middle layer pattern 34C may be formed over the first region R1, and the second middle layer pattern 34P may be formed over the second region R2. In order to form the first and second middle layer patterns 34C and 34P, the first carbon layer 34 is etched using the first and second etch stop layer patterns 35C and 35P as an etch mask.

The top surfaces of some of the line patterns 33A may be exposed by the first middle layer pattern 34C. The first middle layer pattern 34C may serve as a cutting mask pattern. When viewed from the top, the first middle layer pattern 34C may have the same shape as the first etch stop layer pattern 35C, and the second middle layer pattern 34P may have the same shape as the second etch stop layer pattern 35P.

First openings 40A and second openings 40B may be formed in the first middle layer pattern 34C. The first openings 40A may be formed from the first pre-openings H11. The second openings 40B may be formed from the second pre-openings H12. The first openings 40A and the second openings 40B may have a circular shape. Since the second carbon layer 34 is plasma-etched, the first openings 40A may have a circular shape due to an etch loading effect. In other words, by plasma-etching the first carbon layer 34 using the first pre-openings H11 which have a rhombus shape, the first openings 40A may be formed to have a circular shape. Both the first openings 40A and the second openings 40B may have a circular shape.

When viewed from the top, the second middle layer pattern 34P may have the same shape as the shape of the second etch stop layer pattern 35P.

First silicon oxynitride patterns 34'C and 34'P may be formed on the first middle layer pattern 34C and the second middle layer pattern 34P, respectively.

Figure 7G:
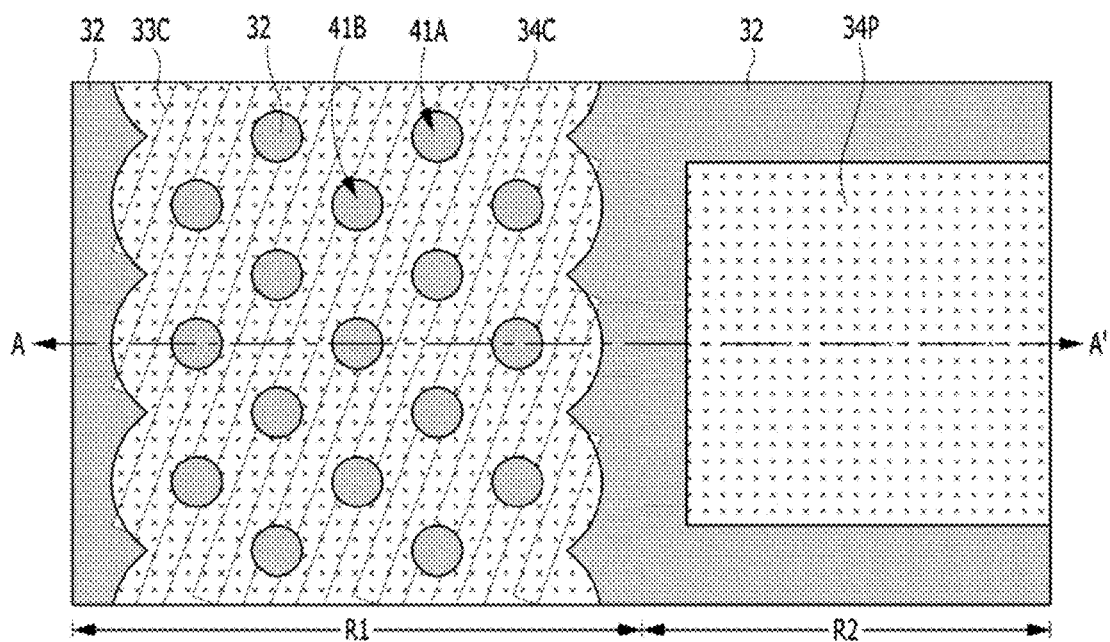
Figure 8G:
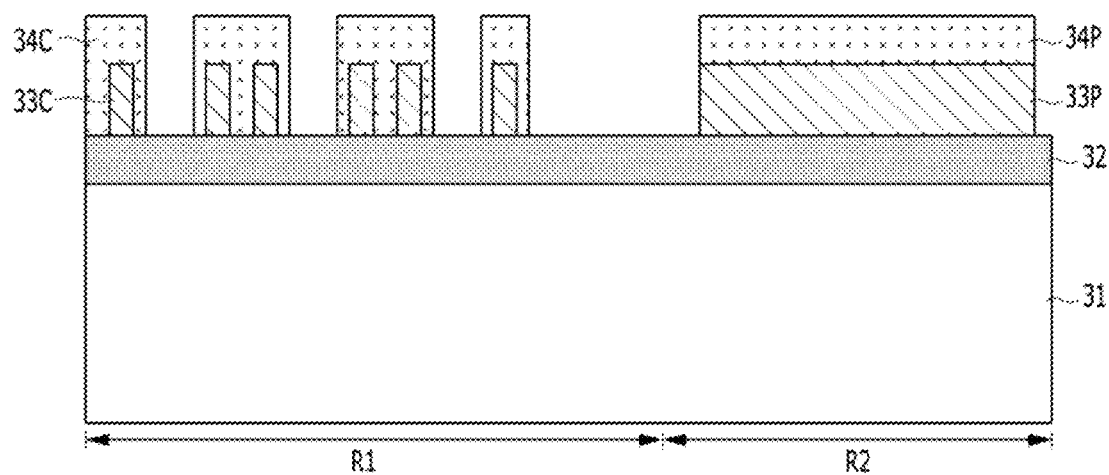

As shown in FIGS. 7G and 8G, the first and second etch stop layer patterns 35C and 35P may be removed. The first silicon oxynitride patterns 34'C and 34'P may be removed.

The line patterns 33A and the pre-pad pattern 33B may be etched. For example, the line patterns 33A and the pre-pad pattern 33B are etched using the first and second middle layer patterns 34C and 34P as an etch mask. The line patterns 33A are cut through the first openings 40A and the second openings 40B. By the cutting process, the line patterns 33A may be separated. For example, one line pattern 33A is separated into a plurality of cut patterns 33C. The cut patterns 33C may have an isolated island shape. The cut patterns 33C may have an island shape which has a minor axis and a major axis. The cut patterns 33C which are adjacent in the direction of the major axis may be separated from one another by first separation holes 41A and second separation holes 41B. The cut patterns 33C which are adjacent in the direction of the minor axis may be separated from one another by spaces between the initial line patterns 33A.

The plurality of cut patterns 33C may be formed over the first region R1. The first and second separation holes 41A and 41B are alternatively disposed along the major axis of the cut patterns 33C. A pad pattern 33P is formed over the second region R2. When viewed from the top, the pad pattern 33P may have the same shape as the shape of the second middle layer pattern 34P.

In this way, the plurality of cut patterns 33C, which are separated by the first and second separation holes 41A and 41B, may be formed over the first region R1, and at the same time, the pad pattern 33P may be formed over the second region R2. In the present embodiment, the cut patterns 33C and the pad pattern 33P may include polysilicon.

Figure 7H:
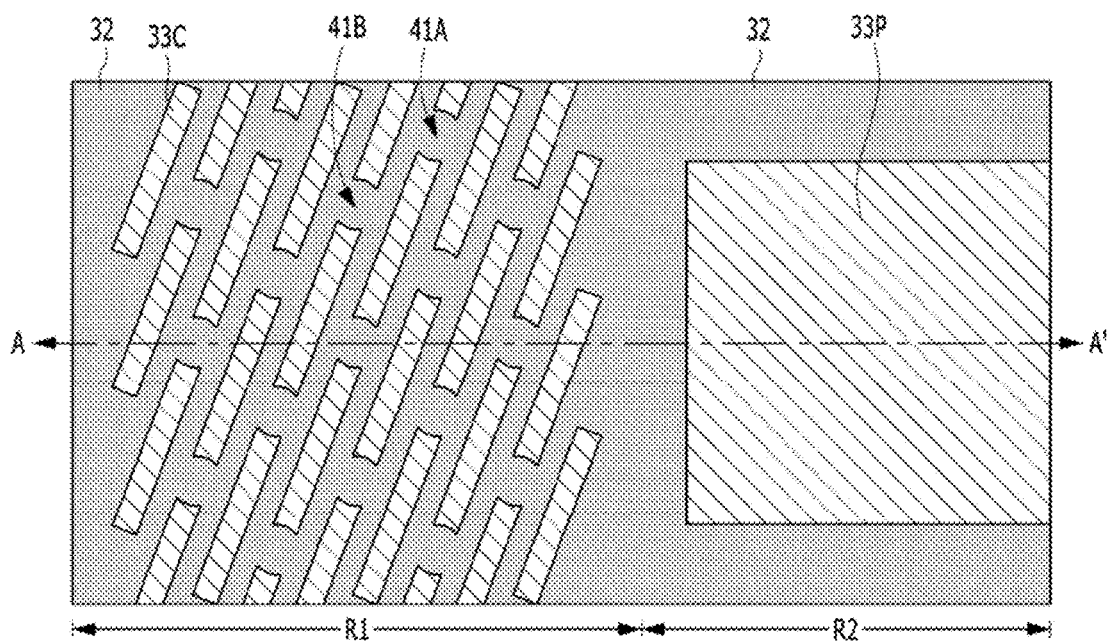
Figure 8H:
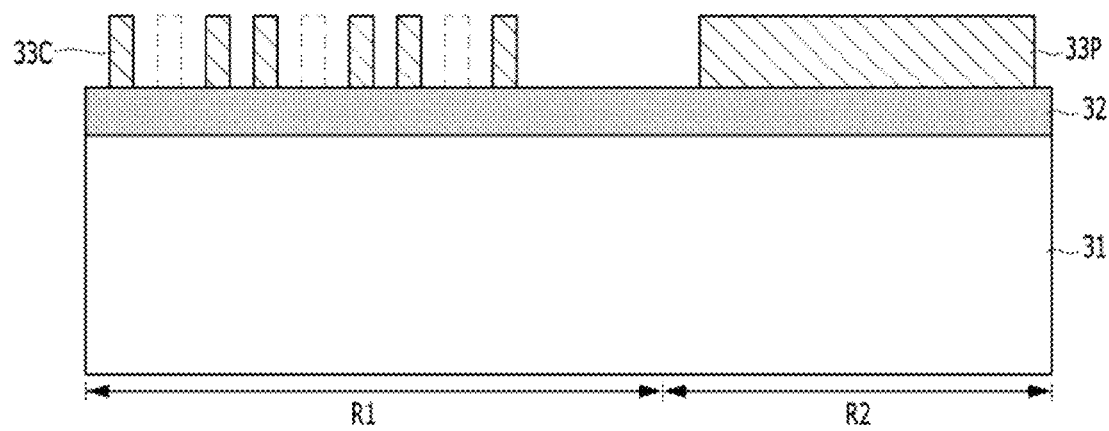

As shown in FIGS. 7H and 8H, the first and second middle layer patterns 34C and 34P may be removed.

According to the above descriptions, in the embodiment, the cut patterns 33C and the pad pattern 33P may be simultaneously formed.

Figure 7I:
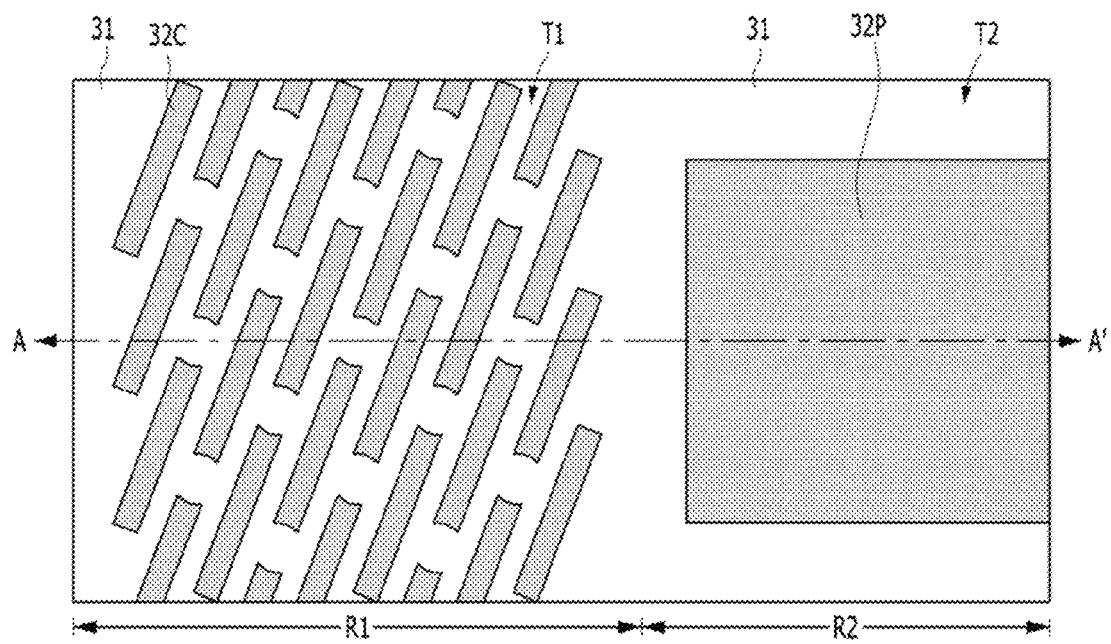
Figure 8I:
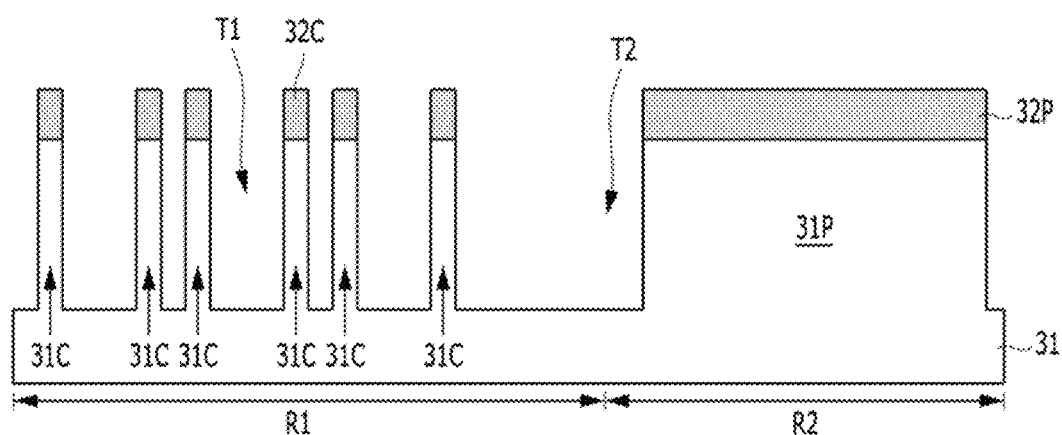

As shown in FIGS. 7I and 8I, the buffer layer 32 is etched using the cut patterns 33C and the pad pattern 33P as an etch mask. After the buffer layer 32 is etched, buffer layer patterns 32C and 32P are formed. For example, first buffer layer patterns 32C and a second buffer layer pattern 32P may be formed. When viewed from the top, the first and second buffer layer patterns 32C and 32P may have the same shapes as the cut patterns 33C and the pad pattern 33P, respectively.

The substrate 31 may be etched using the first and second buffer layer patterns 32C and 32P as an etch mask. While etching the substrate 31, the cut patterns 33C and the pad pattern 33P may be removed. Accordingly, the first and second buffer layer patterns 32C and 32P may be used as an etch mask for etching the substrate 31.

In this way, after the substrate 31 is etched, a plurality of first patterns 31C and a second pattern 31P may be formed in the substrate 31. The first patterns 31C may be high density patterns, and the second pattern 31P may be a low density pattern. The first patterns 31C may be smaller than the second pattern 31P. The first patterns 31C may be referred to as first active regions 31C, and the second pattern 31P may be referred to as a second active region 31P. For example, the plurality of first patterns 31C may be formed in the first region R1, and the second pattern 31p may be formed in the second region R2. The plurality of first patterns 31C may be defined by a plurality of first trenches T1. The second pattern 31P may be defined by a second trench T2.

Figure 7J:
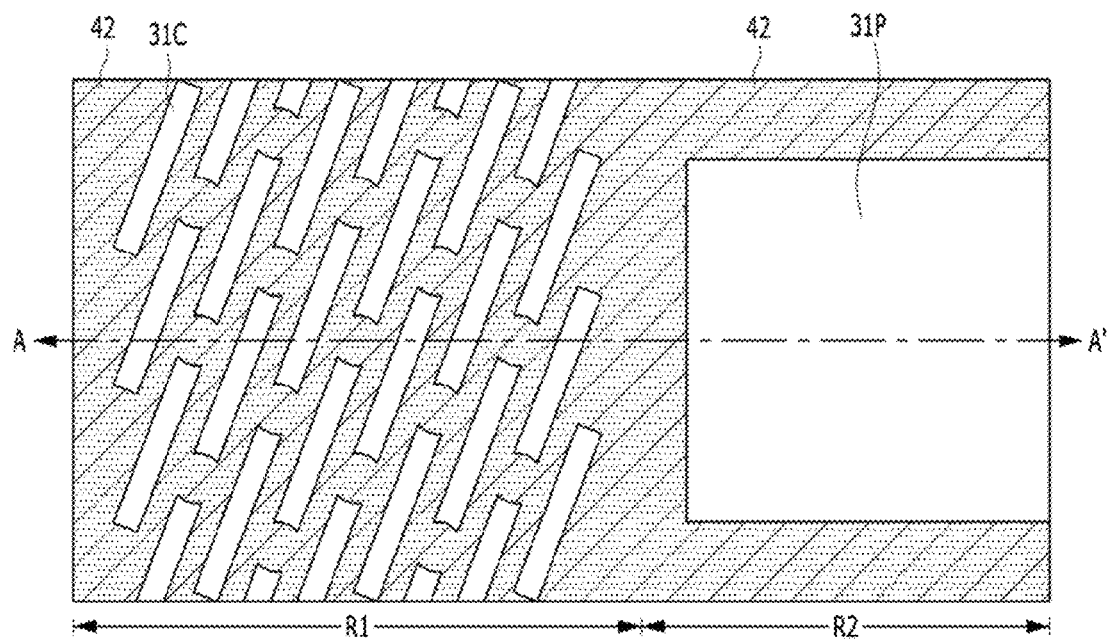
Figure 8J:
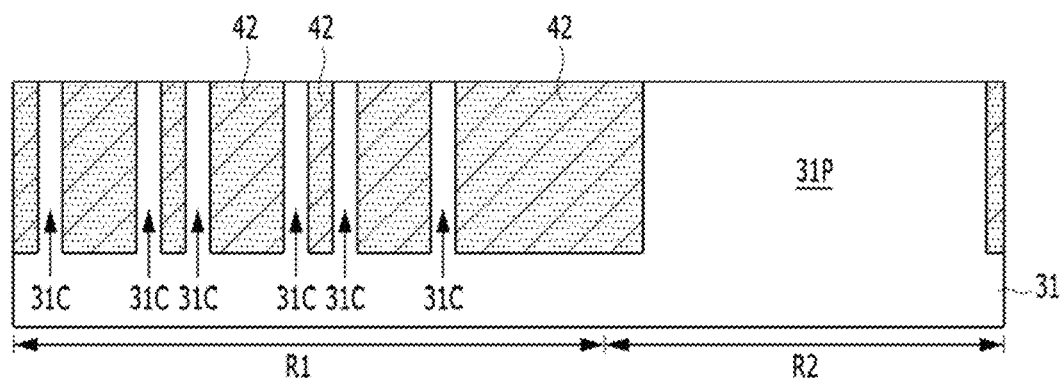

As shown in FIGS. 7J and 8J, the first and second buffer layer patterns 32C and 32P may be removed.

A dielectric material is formed to fill the first trenches T1 and the second trench T2. Accordingly, an isolation layer 42 may be formed. The isolation layer 42 may be formed of silicon nitride, silicon oxide or a combination thereof.

By the isolation layer 42, the plurality of first patterns 31C and the second pattern 31P may be separated from one another.

According to the third embodiment, etch masks for forming the first patterns 31C and the second pattern 31P in the first region R1 and the second region R2, respectively, may be simultaneously formed. Namely, the cut patterns 33C and the pad pattern 33P may be simultaneously formed.

Further, in the third embodiment, a cutting mask for cutting the line patterns 33A is not separately needed. In particular, it is not necessary to perform a hole double patterning to cut the line patterns 33A. Accordingly, the number of immersion masks for cutting the line patterns 33A may be decreased, and costs may be saved.

In addition, in the third embodiment, an open mask may be omitted. Accordingly, the number of immersion masks may be further decreased.

The methods for fabricating a semiconductor device in accordance with the above embodiments may be applied to a dynamic random access memory (DRAM). Further, without being limited thereto, the methods for fabricating a semiconductor device in accordance with the above embodiments may be applied to memories such as a static random access memory (SRAM), a flash memory, a ferroelectric random access memory (FeRAM), a magnetic random access memory (MRAM) and a phase change random access memory (PRAM).

As is apparent from the above descriptions, according to the embodiments, by using a pillar patterning process, it is possible to form high density first patterns with a fine pitch in a first region and at the same time form low density second patterns in a second region. Accordingly, the number of immersion masks may be minimized, costs may be saved, and process margins may be increased.

Also, according to the embodiments, by decreasing the size of a guard region, the net die usage may be increased.

Although various embodiments have been described for illustrative purposes, it will be apparent to those skilled in the art that various changes and modifications may be made without departing from the spirit and scope of the invention as defined in the following claims.

What is claimed is:

1. A method of fabricating a semiconductor device, comprising:
    forming a plurality of line patterns over a first region of an etch target layer and a pre-pad pattern over a second region and a third region of the etch target layer;
    forming a plurality of pillars over the line patterns and a sacrificial pad pattern over the pre-pad pattern of the second region;
    forming an open mask which caps a sidewall and a top surface of the sacrificial pad pattern;
    forming a plurality of first spacers over sidewalls of the pillars such that the first spacers contact one another and form a plurality of first pre-openings therebetween;
    forming a second spacer over a sidewall of the open mask;
    removing the pillars to form a plurality of second pre-openings;
    cutting the line patterns through the first pre-openings and the second pre-openings, and forming a plurality of cut patterns over the first region;
    etching the pre-pad pattern using the sacrificial pad pattern as an etch mask, and forming a pad pattern over the second region; and
    etching the etch target layer using the cut patterns and the pad pattern as an etch mask, to define first patterns and a second pattern over the first region and the second region, respectively.

2. The method according to claim 1, after the forming of the second spacer, further comprising:
    removing the open mask;
    etching the pre-pad pattern using the second spacer as an etch mask, and forming a guard pattern over the third region; and
    etching the etch target layer using the guard pattern as an etch mask, to form a third pattern between the first patterns and the second pattern,
    wherein the guard pattern is formed simultaneously with the cut patterns and the pad pattern.

3. The method according to claim 1, further comprising:
    forming a buffer layer including a material which has an etch selectivity to the line patterns and the pre-pad pattern, over the etch target layer, before forming the line patterns and the pre-pad pattern.

4. The method according to claim 1, further comprising:
    forming a middle layer including a material which has an etch selectivity to the line patterns and the pre-pad pattern, over the plurality of line patterns and the pre-pad pattern before forming the plurality of pillars and the sacrificial pad pattern.

5. The method according to claim 1, wherein the first spacers include polysilicon.

6. A method of fabricating a semiconductor device, comprising:
    forming a plurality of line patterns over a first region of an etch target layer and a pre-pad pattern over a second region and a third region of the etch target layer;
    forming a plurality of pillars over the line patterns;
    forming a plurality of first spacers over sidewalls of the pillars such that the first spacers contact one another and form a plurality of first pre-openings therebetween;
    forming a second reverse spacer over the second region and a third reverse spacer over the third region;
    removing the pillars to form a plurality of second pre-openings;
    cutting the line patterns through the first pre-openings and the second pre-openings, and forming a plurality of cut patterns over the first region;
    etching the pre-pad pattern using the second reverse spacer and the third reverse spacer as an etch mask, and forming a pad pattern and a guard pattern over the second region and the third region, respectively; and
    etching the etch target layer using the cut patterns, the pad pattern and the guard pattern as an etch mask, to define first patterns, a second pattern and a third pattern over the first region, the second region and the third region, respectively,
    wherein the forming of the first spacers and the forming of the second reverse spacer and the third reverse spacer comprise:
        forming a spacer layer over a resultant structure including the plurality of pillars;

forming a blocking mask pattern over the spacer layer of the second region and the third region;

etching the spacer layer using the blocking mask pattern as an etch mask to form the first spacers over the first region;

removing the blocking mask pattern;

forming a planarization layer over the first spacers of the first region and a remaining spacer layer of the second region and the third region;

planarizing the remaining spacer layer to form the second reverse spacer and the third reverse spacer; and removing the planarization layer.

7. The method according to claim 6, wherein the spacer layer is formed of oxide, and the planarization layer is formed of a carbon layer.

8. The method according to claim 6, further comprising:
forming a buffer layer including a material which has an etch selectivity to the line patterns and the pre-pad pattern, over the etch target layer before forming the line patterns and the pre-pad pattern.

9. The method according to claim 6, further comprising:
forming a middle layer including a material which has an etch selectivity to the line patterns and the pre-pad pattern, over the plurality of line patterns and the pre-pad pattern before forming the plurality of pillars.

10. The method according to claim 6, wherein the line patterns are formed of polysilicon, the pillars are formed of a carbon layer, and the first spacers, the second reverse spacer and the third reverse spacer are formed of oxide.

11. A method of fabricating a semiconductor device, comprising:

forming a plurality of line patterns over a first region of an etch target layer, forming a pre-pad pattern over a second region of the etch target layer;

forming an etch stop layer over the line patterns and the pre-pad pattern;

stacking a mold layer and a protective layer over the etch stop layer;

etching the protective layer and the mold layer, and forming a plurality of pillars over the first region and a sacrificial pad pattern over the second region;

forming spacers over sidewalls of the pillars such that the spacers contact one another and form a plurality of first pre-openings therebetween;

forming a barrier spacer over a sidewall of the sacrificial pad pattern;

removing the pillars to form a plurality of second pre-openings;

etching the etch stop layer using the spacers to form a first etch stop layer pattern;

cutting the line patterns using the first etch stop layer pattern to form a plurality of cut patterns; and etching the etch target layer using the cut patterns as an etch mask, to define a plurality of first patterns over the first region, wherein, after etching the protective layer and the mold layer, the protective layer remains over the pillars and the sacrificial pad pattern as sacrificial protective layer patterns and a pre-protective layer pattern, respectively, and the pre-protective layer pattern remains thicker than the sacrificial protective layer patterns.

12. The method according to claim 11, further comprising:

etching the etch stop layer using the barrier spacer and the sacrificial pad pattern as an etch mask, and forming a second etch stop layer pattern;

etching the pre-pad pattern using the second etch stop layer pattern as an etch mask, and forming a pad pattern; and etching the etch target layer using the pad pattern as an etch mask, to define a second pattern over the second region.

13. The method according to claim 11, further comprising:

removing the sacrificial protective layer patterns before removing the pillars, and wherein, after the sacrificial protective layer patterns are removed, the pre-protective layer pattern remains as the protective layer pattern.

14. The method according to claim 11, wherein the mold layer includes a carbon layer, and the protective layer includes silicon oxynitride.

15. The method according to claim 11, further comprising:

forming a middle layer including a material which has an etch selectivity to the line patterns and the pre-pad pattern, over the plurality of line patterns and the pre-pad pattern, before forming the etch stop layer.

* * * * *